(12) United States Patent
Kato et al.

(10) Patent No.: US 12,432,472 B2
(45) Date of Patent: Sep. 30, 2025

(54) SOLID-STATE IMAGING DEVICE AND ELECTRONIC INSTRUMENT

(71) Applicant: SONY SEMICONDUCTOR SOLUTIONS CORPORATION, Kanagawa (JP)

(72) Inventors: Eriko Kato, Kanagawa (JP); Akihiko Kato, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 139 days.

(21) Appl. No.: 18/260,091

(22) PCT Filed: Dec. 28, 2021

(86) PCT No.: PCT/JP2021/048901
§ 371 (c)(1),
(2) Date: Jun. 30, 2023

(87) PCT Pub. No.: WO2022/149555
PCT Pub. Date: Jul. 14, 2022

(65) Prior Publication Data
US 2024/0080587 A1 Mar. 7, 2024

(30) Foreign Application Priority Data
Jan. 8, 2021 (JP) .................. 2021-002059

(51) Int. Cl.
*H04N 25/77* (2023.01)
*H04N 25/76* (2023.01)
(Continued)

(52) U.S. Cl.
CPC .......... *H04N 25/77* (2023.01); *H04N 25/779* (2023.01); *H04N 25/7795* (2023.01); *H10F 39/182* (2025.01); *H10F 39/8037* (2025.01)

(58) Field of Classification Search
CPC .. H04N 25/77; H04N 25/7795; H04N 25/779; H04N 25/79; H10F 39/182;
(Continued)

(56) References Cited

U.S. PATENT DOCUMENTS 11,800,253 B2 * 10/2023 Saito ................ H04N 25/67
2002/0024068 A1 * 2/2002 Shinohara ......... H04N 25/533
348/E3.018
(Continued)

FOREIGN PATENT DOCUMENTS

JP 2011-151375 A 8/2011
JP 2020-156070 A 9/2020
(Continued)

OTHER PUBLICATIONS

International Search Report and Written Opinion of PCT Application No. PCT/JP2021/048901, issued on Feb. 22, 2022, 09 pages of ISRWO.

*Primary Examiner* — Albert H Cutler
(74) *Attorney, Agent, or Firm* — CHIP LAW GROUP

(57) ABSTRACT

To reduce the number of wirings through which transmission and reception are made between chips.

The solid-state imaging device includes a first substrate including a pixel array unit in which a plurality of pixels is arranged, each of the plurality of pixels including a photoelectric conversion unit, and the first substrate includes a first wiring through which an imaging pixel signal is transmitted, the imaging pixel signal being read from two or more of the pixels arranged in a first direction in the pixel array unit, a second wiring through which a reset voltage for initializing the first wiring is supplied, and a first switching circuit configured to switch whether or not to short-circuit the first wiring and the second wiring.

19 Claims, 46 Drawing Sheets

(51) Int. Cl.
*H04N 25/779* (2023.01)
*H10F 39/00* (2025.01)
*H10F 39/18* (2025.01)

(58) Field of Classification Search
CPC ............... H10F 39/8037; H10F 10/161; H10F 39/1865; A23B 99/00; H10D 62/152; H10H 20/816
See application file for complete search history.

(56) References Cited

U.S. PATENT DOCUMENTS

| | | | |
|---|---|---|---|
| 2011/0050969 A1* | 3/2011 | Nishihara | ............... H04N 25/78 |
| | | | 348/308 |
| 2019/0252448 A1* | 8/2019 | Hanzawa | ................ H04N 25/79 |
| 2020/0221043 A1* | 7/2020 | Sato | ..................... H04N 25/709 |
| 2021/0092311 A1* | 3/2021 | Sato | ..................... H04N 25/587 |

FOREIGN PATENT DOCUMENTS

| | | | | |
|---|---|---|---|---|
| WO | WO-2020003646 A1 * | 1/2020 | ............. | H04N 5/355 |
| WO | 2020/040066 A1 | 2/2020 | | |

* cited by examiner

SF OPERATION

DIFFERENTIAL OPERATION

FIG. 27

FIG. 35

SOLID-STATE IMAGING DEVICE AND ELECTRONIC INSTRUMENT

CROSS REFERENCE TO RELATED APPLICATIONS

This application is a U.S. National Phase of International Patent Application No. PCT/JP2021/048901 filed on Dec. 28, 2021, which claims priority benefit of Japanese Patent Application No. JP 2021-002059 filed in the Japan Patent Office on Jan. 8, 2021. Each of the above-referenced applications is hereby incorporated herein by reference in its entirety.

TECHNICAL FIELD

The present disclosure relates to a solid-state imaging device and an electronic instrument.

BACKGROUND ART

A semiconductor process technique that enables size reduction and high integration by stacking a plurality of semiconductor chips has attracted attention. Also for a solid-state imaging device, a technique in which a chip including an array of a plurality of pixels that performs photoelectric conversion and a chip that performs signal processing on an imaging pixel signal obtained by the photoelectric conversion are stacked and packaged has been proposed (see Patent Document 1).

CITATION LIST

Patent Document

Patent Document 1: Japanese Patent Application Laid-Open No. 2011-151375

SUMMARY OF THE INVENTION

Problems to be Solved by the Invention

A wiring pitch, however, is usually different between the chips to be stacked, so that it is necessary to adjust the wiring pitch at a bonding part of each chip. Specifically, around the bonding part, it is necessary to adjust a small wiring pitch to a large wiring pitch. Therefore, around the bonding part of one of the chips, an increase in wiring pitch generates a dead space on the chip. The larger the number of wirings and the smaller the wiring pitch of one of the chips, the larger the dead space.

As described above, when the number of wirings through which transmission and reception are made between the stacked chips increases, the above-described dead space increases, which becomes a factor in hindering a reduction in chip size.

It is therefore an object of the present disclosure to provide a solid-state imaging device and an electronic instrument capable of reducing the number of wirings through which transmission and reception are made between chips.

Solutions to Problems

In order to solve the above-described problem, according to the present disclosure, provided is a solid-state imaging device including a first substrate including a pixel array unit in which a plurality of pixels is arranged, each of the plurality of pixels including a photoelectric conversion unit, in which
the first substrate includes:
a first wiring through which an imaging pixel signal is transmitted, the imaging pixel signal being read from two or more of the pixels arranged in a first direction in the pixel array unit;
a second wiring through which a reset voltage for initializing the first wiring is supplied; and
a first switching circuit configured to switch whether or not to short-circuit the first wiring and the second wiring.

The plurality of pixels in the pixel array unit may be arranged in the first direction and a second direction, and
the first substrate may include:
a plurality of the first wirings each extending in the first direction and arranged at intervals in the second direction;
a plurality of the second wirings corresponding to the plurality of first wirings; and
a plurality of the first switching circuits configured to switch whether or not to short-circuit the plurality of first wirings and the plurality of second wirings corresponding to the plurality of first wirings.

The first substrate may include:
a plurality of third wirings provided corresponding to the plurality of first wirings and the plurality of second wirings, the plurality of third wirings being set at a reference voltage; and
a plurality of second switching circuits configured to switch whether or not to short-circuit the plurality of second wirings and the plurality of third wirings corresponding to the plurality of second wirings.

One of the first wirings may be provided for each pixel column including the two or more pixels arranged in the first direction, and
the one of the first switching circuits and one of the second switching circuits may be provided for the one first wiring.

A plurality of the first wirings may be provided for each pixel column including the two or more pixels arranged in the first direction, and
a plurality of the first switching circuits and a plurality of the second switching circuits may be provided for the plurality of first wirings.

The plurality of first switching circuits and the plurality of second switching circuits may be arranged outside an arrangement region of the plurality of pixels on the first substrate.

The plurality of first switching circuits may include a plurality of first transistors configured to switch whether or not short-circuit the plurality of first wirings and the plurality of second wirings corresponding to the plurality of first wirings, and
the plurality of second switching circuits may include a plurality of second transistors configured to switch whether or not to short-circuit the plurality of second wirings and the plurality of third wirings corresponding to the plurality of second wirings.

Each of the plurality of first switching circuits may include:
a first photoelectric conversion unit;
a first floating diffusion;
a third transistor configured to select a corresponding one of the pixels;

a fourth transistor configured to amplify a voltage level of the first floating diffusion; and a fifth transistor configured to switch whether or not to short-circuit a corresponding one of the first wirings and a corresponding one of the second wirings, and each of the plurality of second switching circuits may include:

a second photoelectric conversion unit;

a second floating diffusion;

a sixth transistor configured to select a corresponding one of the pixels;

a seventh transistor configured to amplify a voltage level of the second floating diffusion; and an eighth transistor configured to switch whether or not to short-circuit a corresponding one of the second wirings and a corresponding one of the third wirings.

A drive unit configured to generate a drive signal to drive each corresponding pixel row may be further provided, the pixel row including two or more of the pixels arranged in the second direction, and the drive unit may output a first switching control signal for switching control of the plurality of first switching circuits and a second switching control signal for switching control of the plurality of second switching circuits.

The pixel array unit may include a reference pixel configured to output a reference pixel signal, the plurality of pixels may include a plurality of source follower circuits each configured to generate the imaging pixel signal according to a pixel signal obtained by photoelectric conversion by a corresponding one of the photoelectric conversion units, and a first imaging mode of supplying the imaging pixel signal generated by the corresponding plurality of source follower circuits to the plurality of first wirings and a second imaging mode of supplying the imaging pixel signal generated by comparison between the pixel signal and the reference pixel signal by a differential amplifier to the plurality of first wirings may be alternatively selected.

The plurality of first switching circuits, the plurality of second switching circuits, and the plurality of third switching circuits may perform different switching operations between the first imaging mode and the second imaging mode.

In a case where the first imaging mode is selected, the plurality of first switching circuits may interrupt connection between the plurality of first wirings and the plurality of second wirings corresponding to the plurality of first wirings, and the plurality of second switching circuits may short-circuit the plurality of first wirings and the plurality of third wirings corresponding to the plurality of first wirings, and in a case where the second imaging mode is selected, the plurality of first switching circuits may short-circuit the plurality of first wirings and the plurality of second wirings corresponding to the plurality of first wirings, and the plurality of second switching circuits may interrupt connection between the plurality of first wirings and the plurality of third wirings corresponding to the plurality of first wirings.

According to another aspect of the present disclosure, provided is a solid-state imaging device including:

a first substrate including a pixel array unit in which a plurality of pixels is arranged, each of the plurality of pixels including a photoelectric conversion unit; and a second substrate stacked on the first substrate, the second substrate being configured to perform signal processing on an imaging pixel signal output from the pixel array unit, in which the first substrate includes:

a plurality of first wirings that does not interfere with a circuit operation even when each of the plurality of first wirings is short-circuited; and a first bonding part provided so as to be smaller in number than the plurality of first wirings, the first bonding part being electrically connected to the plurality of first wirings, and the second substrate includes:

a plurality of second wirings that does not interfere with a circuit operation even when each of the plurality of second wirings is short-circuited; and a second bonding part provided as many as the first bonding part and bonded to a corresponding first bonding part, the second bonding part being electrically connected to the plurality of second wirings.

The plurality of pixels may be arranged in a first direction and a second direction on the first substrate, the solid-state imaging device may further including a drive unit configured to generate a drive signal to drive each corresponding pixel row, the pixel row including two or more of the pixels arranged in the second direction, the drive unit including an output wiring electrically connected to the first bonding part and the second bonding part.

The drive unit may be disposed in the second substrate, and the first substrate may include:

a first connection region disposed in the first direction and including the first bonding part and a third bonding part, the third bonding part being connected to the drive unit; and a second connection region disposed in the second direction and including a fourth bonding part to which a signal transmitted and received between the first substrate and the second substrate is connected.

The drive unit may include a first drive unit and a second drive unit arranged at both sides in the second direction, and the first drive unit and the second drive unit may each include an output wiring electrically connected to the first bonding part and the third bonding part.

The second connection region may include two connection regions arranged at both end sides on the first substrate in the second direction, and the two connection regions may include the first bonding part and the third bonding part.

The pixel array unit may include a reference pixel configured to output a reference pixel signal, the plurality of pixels may include a plurality of source follower circuits each configured to generate the imaging pixel signal according to a pixel signal obtained by photoelectric conversion by a corresponding one of the photoelectric conversion units, a first imaging mode of supplying the imaging pixel signal generated by the corresponding plurality of source follower circuits to the plurality of first wirings and a second imaging mode of supplying the imaging pixel signal based on a result of comparison between the pixel signal and the reference pixel signal by a differential amplifier to the plurality of first wirings may be alternatively selected, and the plurality of first wirings may be a plurality of wirings set at a reference voltage, a plurality of wirings connected to the differential amplifier when the second imaging mode is selected and disconnected from the differential amplifier when the first imaging mode is selected, or a plurality of wirings that makes the first substrate and the second substrate equal in reference voltage level to each other at a predetermined timing when the second imaging mode is selected.

According to another aspect of the present disclosure, provided is an electrical instrument including:

a solid-state imaging device configured to output an imaging pixel signal obtained by photoelectric conversion by a plurality of pixels; and a signal processing device configured to perform signal processing on the basis of the imaging pixel signal, in which the solid-state imaging device includes a first substrate including a pixel array unit in which a plurality of pixels is arranged, each of the plurality of pixels including a photoelectric conversion unit, and the first substrate includes:

a first wiring through which the imaging pixel signal read from two or more of the pixels arranged in a first direction in the pixel array unit is transmitted;

a second wiring through which a reset voltage for initializing the first wiring is supplied; and a first switching circuit configured to switch whether or not to short-circuit the first wiring and the second wiring.

According to another aspect of the present disclosure, provided is an electronic instrument including:

a solid-state imaging device configured to output an imaging pixel signal obtained by photoelectric conversion by a plurality of pixels; and a signal processing device configured to perform signal processing on the basis of the imaging pixel signal, in which the solid-state imaging device includes:

a first substrate including a pixel array unit in which a plurality of pixels is arranged, each of the plurality of pixels including a photoelectric conversion unit; and a second substrate stacked on the first substrate, the second substrate being configured to perform signal processing on the imaging pixel signal output from the pixel array unit, the first substrate includes:

a plurality of first wirings that does not interfere with a circuit operation even when each of the plurality of first wirings is short-circuited; and a first bonding part provided so as to be smaller in number than the plurality of first wirings, the first bonding part being electrically connected to the plurality of first wirings, and the second substrate includes:

a plurality of second wirings that does not interfere with a circuit operation even when each of the plurality of second wirings is short-circuited; and a second bonding part provided as many as the first bonding part and bonded to a corresponding first bonding part, the second bonding part being electrically connected to the plurality of second wirings.

BRIEF DESCRIPTION OF DRAWINGS

FIG. 27 is a circuit diagram illustrating an eleventh circuit configuration example of the pixel array unit and the column read circuit unit.

FIG. 35 is a circuit diagram illustrating a fourteenth circuit configuration example of the pixel array unit and the column read circuit unit.

MODE FOR CARRYING OUT THE INVENTION

Hereinafter, embodiments of a solid-state imaging device and an electronic instrument will be described with reference to the drawings. Although principal components of the solid-state imaging device and the electronic instrument will be mainly described below, the solid-state imaging device and the electronic instrument may include components and functions that are not illustrated or described. The following description is not intended to exclude components or functions that are not illustrated or described.

Figure 1:
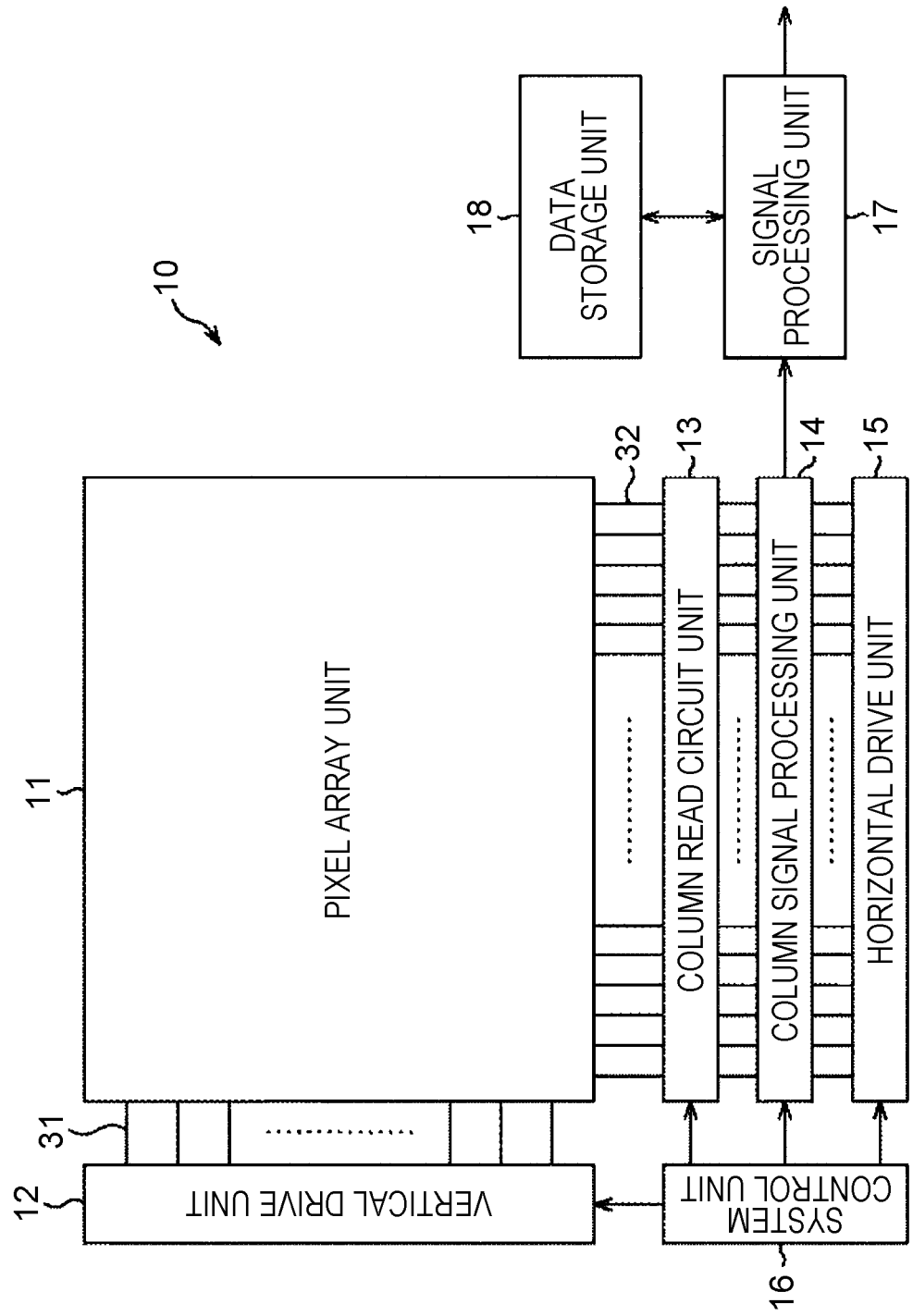
FIG. 1 is a block diagram illustrating a schematic configuration of a solid-state imaging device according to an embodiment of the present disclosure.

FIG. 1 is a block diagram illustrating a schematic configuration of a solid-state imaging device 1 according to an embodiment of the present disclosure. The solid-state imaging device 1 in FIG. 1 is of a type of image sensor called a complementary metal-oxide-semiconductor (CMOS) image sensor. The solid-state imaging device 1 in FIG. 1 captures incident light from an object through a lens (not illustrated) and converts a light amount of the incident light an image of which is formed on an imaging surface to an electric signal in a pixel unit to output as an imaging pixel signal.

The solid-state imaging device 1 illustrated in FIG. 1 includes a pixel array unit 11, a vertical drive unit 12, a column read circuit unit 13, a column signal processing unit 14, a horizontal drive unit 15, a system control unit 16, a signal processing unit 17, and a data storage unit 18.

The pixel array unit 11, the vertical drive unit 12, the column read circuit unit 13, the column signal processing unit 14, the horizontal drive unit 15, the system control unit 16, the signal processing unit 17, and the data storage unit 18 are formed on the same or a plurality of electrically connected stacked semiconductor substrates (chips).

In the pixel array unit 11, unit pixels (pixels) each including a photoelectric conversion unit (for example, a photodiode) capable of photoelectrically converting a charge amount corresponding to an incident light amount, accumulating the same therein, and outputting the same as a signal is two-dimensionally arranged in a matrix.

Note that there is a case where the pixel array unit 11 includes a region in which, in addition to effective pixels (effective pixels), dummy pixels each having a structure without a photodiode that performs photoelectric conversion, and light-shielding pixels equivalent to the effective pixels except that a light-receiving surface is light-shielded and external light incidence is blocked are two-dimensionally arranged in a matrix.

Furthermore, in the following description, there is a case where an optical charge of the charge amount corresponding to the incident light amount is simply referred to as a "charge", and the unit pixel is simply referred to as a "pixel".

In the pixel array unit 11, moreover, for a pixel array in a matrix, a pixel drive line 31 is formed in a right-to-left direction in the drawing (in a pixel row direction) for each row, and a vertical pixel wiring 32 is formed in a top-to-bottom direction in the drawing (in a pixel column direction) for each column. One end of the pixel drive line 31 is connected to an output end corresponding to each row of the vertical drive unit 12.

The column read circuit unit 13 at least includes a circuit that supplies a constant current to pixels of a selected row in the pixel array unit 11 for each column, a current mirror circuit that forms a high gain amplifier, and a read mode changeover switch, forms an amplifier together with a transistor in the selected pixel in the pixel array unit 11, converts an optical charge signal into a voltage signal, and outputs the same to the vertical pixel wiring 32.

The vertical drive unit 12 is a pixel drive unit including a shift register, an address decoder, and the like that drives the pixels of the pixel array unit 11 all at once, row by row, or the like. Although a specific configuration of the vertical drive unit 12 is not illustrated, the vertical drive unit 12 includes a read scan system and a sweep scan system, or performs batch sweep and batch transfer.

The read scan system sequentially selectively scans the pixels of the pixel array unit 11 row by row in order to read signals from the pixels. In a case of row drive (rolling shutter operation), as for sweep, sweep scan is performed on a read row on which read scan is performed by the read scan system prior to the read scan by a time corresponding to a shutter speed.

Furthermore, in a case of global exposure (global shutter operation), the batch sweep is performed prior to the batch transfer by a time corresponding to a shutter speed. By this sweep, unnecessary charges are swept (reset) from photoelectric conversion elements of the pixels of the read row. Then, a so-called electronic shutter operation is performed by sweeping (resetting) the unnecessary charges.

Here, the electronic shutter operation is intended to mean an operation of sweeping unnecessary optical charged accumulated in the photoelectric conversion elements until immediately before and newly starting exposing (starting accumulating optical charges). The signal read by the read operation by the read scan system corresponds to the amount of light incident after the immediately preceding read operation or electronic shutter operation.

In a case of row drive, a period from a read timing by the read operation immediately before or a sweep timing by the electronic shutter operation to a read timing by the current read operation is an optical charge accumulation time (exposure time) in the pixel. In a case of the global exposure, a time from the batch sweep to the batch transfer is the accumulation time (exposure time).

The pixel signals output from the pixels of the pixel row selectively scanned by the vertical drive unit 12 are each supplied to the column signal processing unit 14 through a corresponding one of the vertical pixel wirings 32. The column signal processing unit 14 performs predetermined signal processing on the pixel signal output from each pixel of the selected row through the vertical pixel wiring 32 for each pixel column of the pixel array unit 11, and temporarily holds the pixel signal after the signal processing.

Specifically, the column signal processing unit 14 performs, as the signal processing, at least noise removal processing, for example, correlated double sampling (CDS) processing. By the correlated double sampling by the column signal processing unit 14, fixed pattern noise unique to the pixel such as reset noise and threshold variation of an amplification transistor is removed. Note that it is also possible to provide an analog-digital (AD) conversion function, for example, in addition to the noise removal processing to the column signal processing unit 14 and output a signal level as a digital signal.

The horizontal drive unit 15 includes a shift register, an address decoder, and the like, and sequentially selects a unit circuit corresponding to the pixel column of the column signal processing unit 14. According to selective scan by the horizontal drive unit 15, the pixel signals subjected to the signal processing by the column signal processing unit 14 are sequentially output to the signal processing unit 17.

The system control unit 16 includes a timing generator that generates various timing signals and the like, and performs drive control of the vertical drive unit 12, the column signal processing unit 14, the horizontal drive unit 15, and the like on the basis of the various timing signals generated by the timing generator.

A CMOS image sensor 10 further includes the signal processing unit 17 and the data storage unit 18. The signal processing unit 17 at least has an addition processing function and performs various types of signal processing such as addition processing on the pixel signal output from the column signal processing unit 14. The data storage unit 18 temporarily stores data required for the signal processing in the signal processing unit 17.

The signal processing unit 17 and the data storage unit 18 may be implemented by a signal processing unit provided on a substrate different from that of the CMOS image sensor 10, or for example, by processing of a digital signal processor (DSP) or software, or may be mounted on the same substrate as that of the CMOS image sensor 10.

Figure 2:
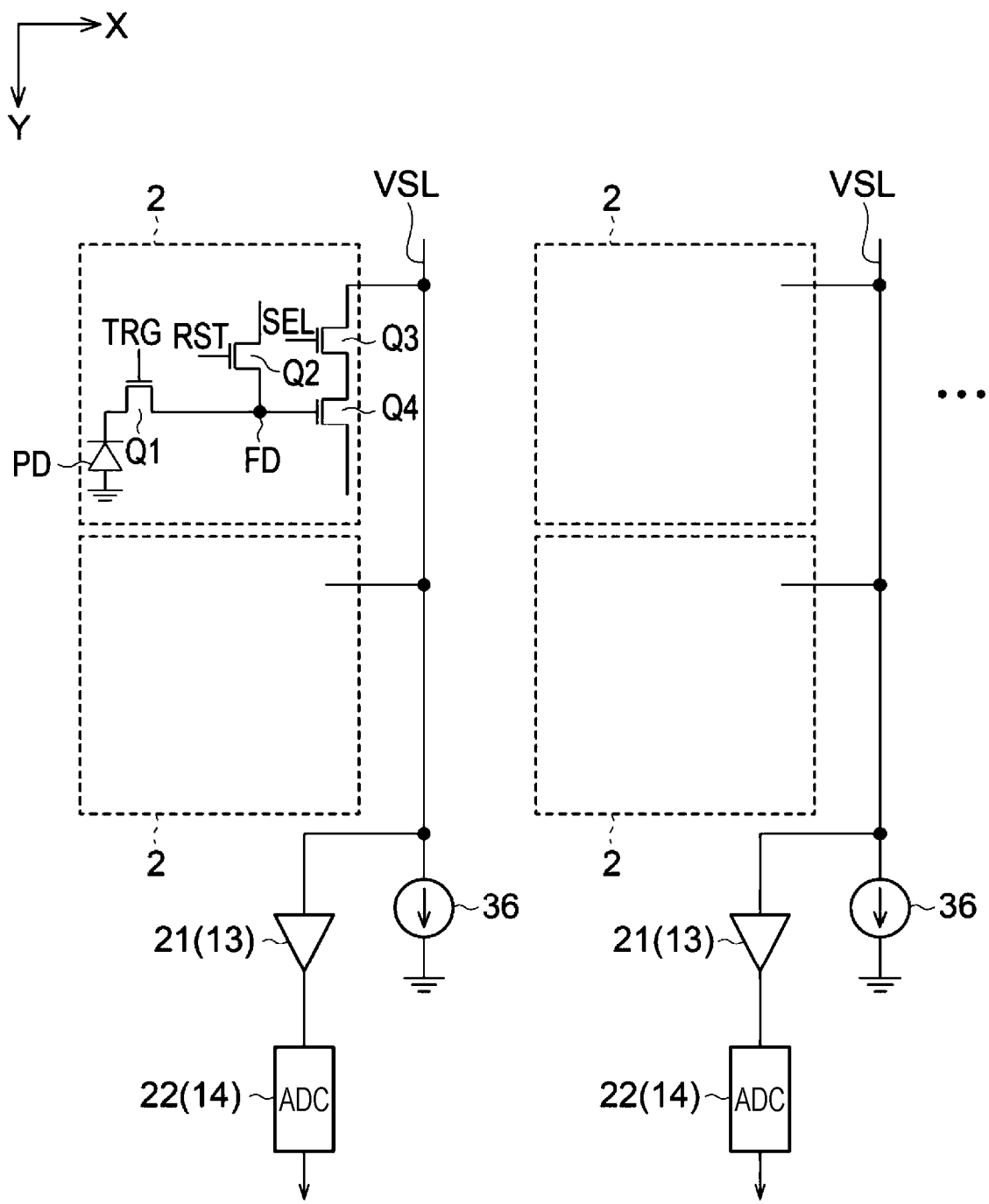
FIG. 2 is a block diagram illustrating processing operation of a column read circuit unit and a column signal processing unit in a simplified manner.

FIG. 2 is a block diagram illustrating processing operation of the column read circuit unit 13 and the column signal processing unit 14 in a simplified manner. In the pixel array unit 11, a plurality of pixels 2 is arranged in a column direction X and a row direction Y. In the present embodiment, the row direction Y may be referred to as a first direction, and the column direction X may be referred to as a second direction.

A signal line VSL is provided for each pixel column arranged in the row direction Y, and the imaging pixel signal output from each pixel 2 is input to an analog front end circuit 21 in the column read circuit unit 13 through a corresponding signal line VSL and then amplified. The imaging pixel signal output from the analog front end circuit 21 is converted into a digital signal by an AD converter 22 in the column signal processing unit 14. The digital signal is input to the signal processing unit 17 illustrated in FIG. 1. As illustrated in FIG. 2, the imaging pixel signal of each pixel 2 is AD-converted for each column. As described later, each pixel includes a photodiode (hereinafter, PD), a transfer transistor Q1, a floating diffusion (hereinafter, FD), a reset transistor Q2, a selection transistor Q3, and an amplification transistor Q4.

Figure 3:
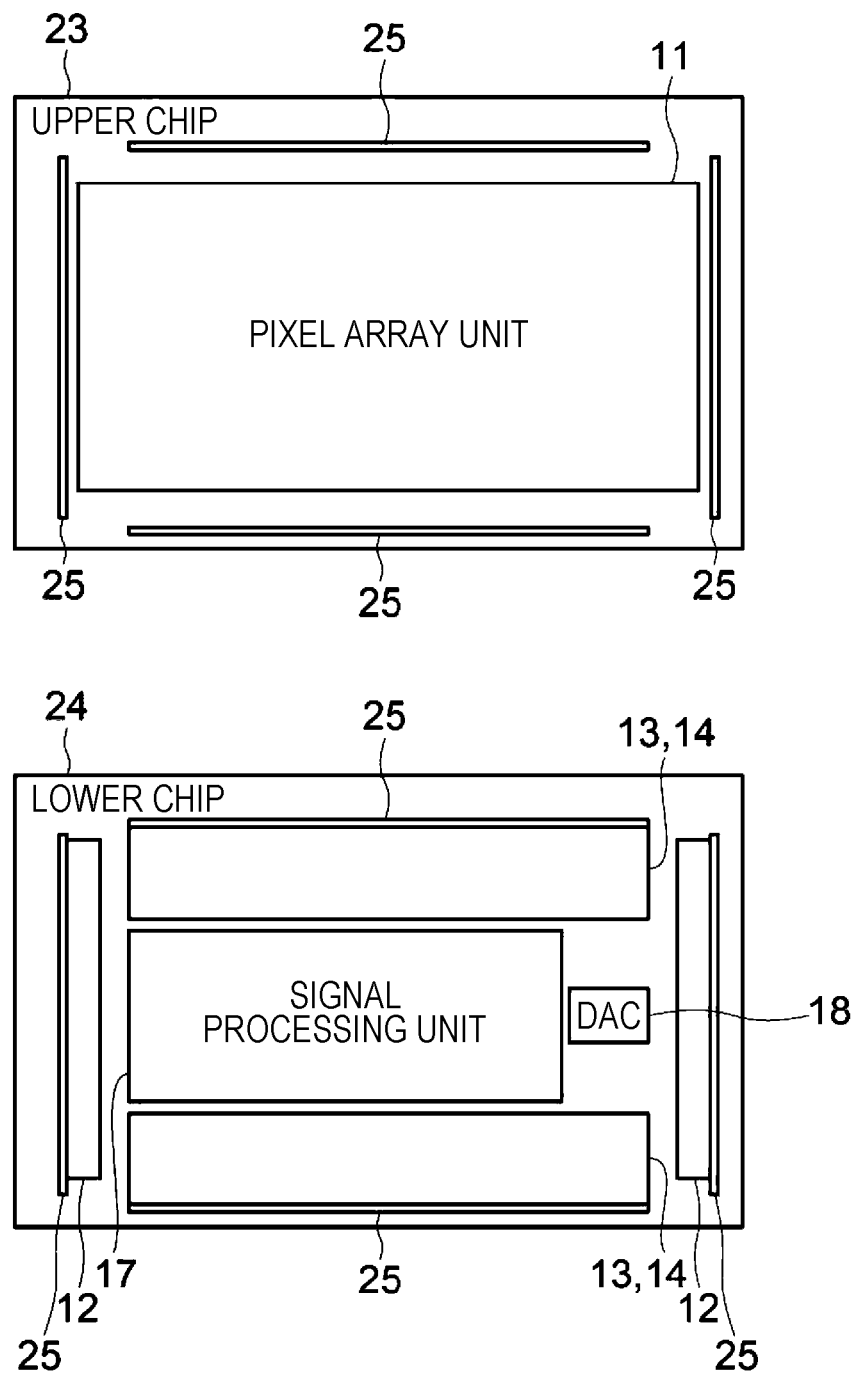
FIG. 3 is a diagram illustrating an example where the solid-state imaging device in FIG. 1 includes a stack of two chips.

The solid-state imaging device 1 according to the present embodiment can include a stack of a plurality of chips. FIG. 3 is a diagram illustrating an example where the solid-state imaging device 1 in FIG. 1 includes a stack of two chips (hereinafter, referred to as an upper chip 23 and a lower chip 24). Herein, the upper chip 23 may be referred to as a first substrate, and the lower chip 24 may be referred to as a second substrate. As illustrated in FIG. 2, the pixel array unit 11 and the like are arranged in the upper chip 23, and the vertical drive unit 12, the column read circuit unit 13, the column signal processing unit 14, the signal processing unit 17, the DAC 18, and the like are arranged in the lower chip 24. Note that a circuit unit other than the pixel array unit 11 may be arranged in the upper chip 23.

Furthermore, in the upper chip 23 and the lower chip 24, a connection region 25 including a bonding part for transmission and reception of various signals between the chips is disposed. In FIG. 3, four connection regions 25 are provided along four sides of each chip, but the number and layout of the connection regions 25 and the number of bonding parts in the connection regions 25 may be determined as desired. The bonding part of the upper chip 23 and the bonding part of the lower chip 24 are arranged in alignment with each other in the top-to-bottom direction, and are bonded in various bonding forms to be described later.

The solid-state imaging device 1 according to the present embodiment can alternatively select either a source follower mode (also referred to as a first imaging mode) or a differential amplification mode (also referred to as a second imaging mode) as a mode of generating the imaging pixel signal. While the source follower mode has a wider dynamic range, noise tends to increase in a dark scene. The differential amplification mode has a narrow dynamic range, but can generate the imaging pixel signal without being buried in noise even in a considerably dark scene. Normally, the source follower mode is selected for a bright scene, the differential amplification mode is selected for a dark scene, one of the modes is selected for an intermediate bright scene, and a gain adjustment is performed by the AD converter 22 in the column signal processing unit 14. The solid-state imaging device 1 may automatically select either the source follower mode or the differential amplification mode, or the user may select which mode is to be enabled for imaging.

The solid-state imaging device 1 according to the present disclosure is characterized by reducing the number of signal wirings through which transmission and reception are made between the upper chip 23 and the lower chip 24. There are a plurality types of circuit configurations of the pixel array unit 11 in the upper chip 23 and the column read circuit unit 13 in the lower chip 24. Hereinafter, specific circuit configurations will be described one by one.

(First Circuit Configuration Example)

Figure 4:
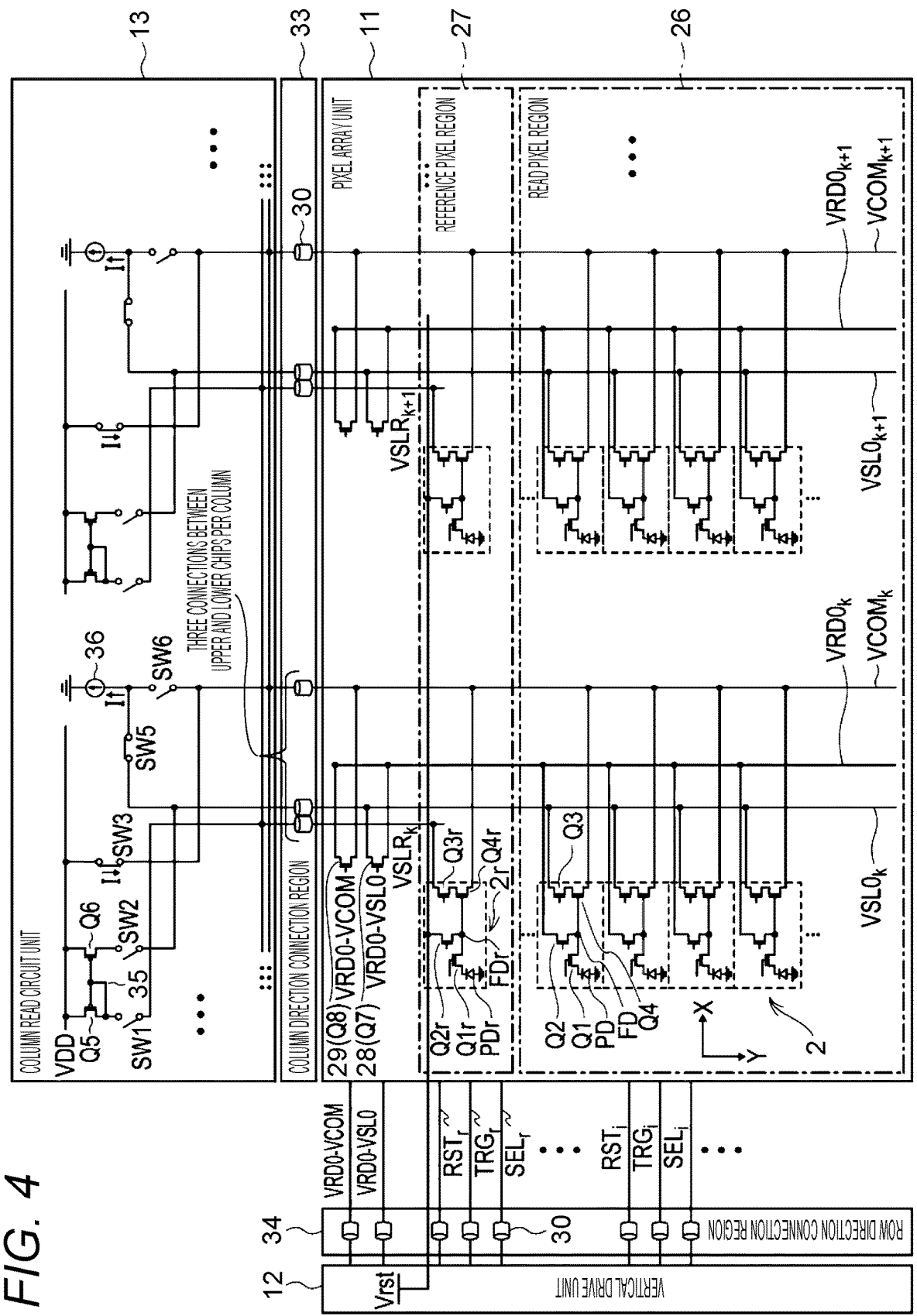
FIG. 4 is a circuit diagram illustrating a first circuit configuration example of a pixel array unit and the column read circuit unit.

FIG. 4 is a circuit diagram illustrating a first circuit configuration example of the pixel array unit 11 in the upper chip 23 and the column read circuit unit 13 in the lower chip 24. In FIG. 4, components other than the vertical drive unit 12 and the column read circuit unit 13 in the lower chip 24 are not illustrated.

As illustrated in FIG. 4, the pixel array unit 11 in the upper chip 23 includes a read pixel region 26 and a reference pixel region 27. The read pixel region 26 includes a plurality of the pixels 2 arranged in the row direction Y and a plurality of the pixels 2 arranged in the column direction X. Herein, the arrangement of the plurality of pixels 2 in the row direction Y is referred to as a pixel column, and the arrangement of the plurality of pixels 2 in the column direction X is referred to as a pixel row. One VSL line, one VRD line, and one VCOM line are provided for each of the plurality of pixel columns. In FIG. 4, subscripts such as k and k+1 are added to make the VSL line, the VRD line, and the VCOM line distinguishable, but the subscripts are omitted herein.

Furthermore, a RSTi line, a TRGi line, and a SELi line are provided for each of the plurality of pixel rows. i indicates a number for identifying each row, and i may be omitted herein. The RSTi line, the TRGi line, and the SELi line are each connected to a corresponding bonding part in a row direction connection region 34 disposed at one end or both ends in the column direction X. The vertical drive unit 12 sets, for each pixel row, corresponding RSTi line, TRGi line, and SELi line at a high level at a predetermined timing.

In the reference pixel region 27, a reference pixel row in which a plurality of reference pixels 2r is arranged in the column direction X is disposed. Only one reference pixel row is provided. The reference pixels 2r in the reference pixel region 27 are identical in circuit configuration to the pixels 2 in the read pixel region 26. A reference signal VSLR line extending in the row direction Y and a RSTr line, a TRGr line, and a SELr line extending in the column direction X are arranged in association with the reference pixel row.

Each pixel 2 in the read pixel region 26 includes the photodiode (hereinafter, PD), the transfer transistor Q1, the reset transistor Q2, the selection transistor Q3, and the amplification transistor Q4. The transfer transistor Q1 switches whether or not to establish electrical continuity between the PD and the FD in accordance with the potential of the TRGi line. The reset transistor Q2 switches whether or not to establish electrical continuity between the VRD line and the FD in accordance with the potential of RSTi. The amplification transistor Q4 amplifies the potential of the FD. The source of the amplification transistor Q4 is connected to the VCOM line. The selection transistor Q3 switches whether or not to supply a drain voltage of the amplification transistor Q4 to the VSL line in accordance with the potential of the SELi line.

Each reference pixel 2r in the reference pixel region 27 includes a PDr, a transfer transistor Q1r, a reset transistor Q2r, a selection transistor Q3r, and an amplification transistor Q4r. The transfer transistor Q1r switches whether or not to establish electrical continuity between the PDr and the FDr in accordance with the potential of the TRGr line. The reset transistor Q2r switches whether or not to establish electrical continuity between a reset voltage line Vrst and the FDr in accordance with the potential of the RSTr line. The selection transistor Q3r switches whether or not establish electrical continuity between the VSLR line and the VCOM line in accordance with the potential of the SELr line.

The pixel array unit 11 in FIG. 4 includes a first switching circuit 28 and a second switching circuit 29 for each pixel column extending in the row direction Y. The first switching circuit 28 switches whether or not to short-circuit the VSL line and the VRD line. The second switching circuit 29 switches whether or not to short-circuit the VRD line and the VCOM line. Herein, the VSL line may be referred to as a first wiring, the VRD line may be referred to as a second wiring, and the VCOM line may be referred to as a third wiring. The pixel array unit 11 according to the present embodiment includes at least the first switching circuit 28.

The first switching circuit 28 and the second switching circuit 29 are arranged outside the arrangement region of the plurality of pixels 2 in the upper chip 23. The first switching circuit 28 and the second switching circuit 29 perform different switching operations in a manner that depends on which of the source follower mode and the differential amplification mode is adopted.

In a case where the solid-state imaging device 1 according to the present embodiment selects the source follower mode, the connection between the VSL line and the VRD line is interrupted by the first switching circuit 28, and the VRD line and the VCOM line are connected by the second switching circuit 29. On the other hand, in a case where the solid-state imaging device 1 according to the present embodiment selects the differential amplification mode, the VSL line and the VRD line are short-circuited by the first switching circuit 28, and the connection between the VRD line and the VCOM line is interrupted by the second switching circuit 29.

In the example in FIG. 4, the first switching circuit 28 and the second switching circuit 29 are arranged between one end of the pixel array unit 11 in the row direction Y and the reference pixel region 27, but as will be described later, the layout of the first switching circuit 28 and the second switching circuit 29 is not limited to the layout illustrated in FIG. 4.

The first switching circuit 28 can include a transistor Q7 that switches whether or not to short-circuit the VSL line and the VRD line. A VRD-VSL signal input to the gate of the transistor Q7 is supplied from the vertical drive unit 12. Similarly, the second switching circuit 29 can include a transistor Q8 that switches whether or not to short-circuit the VRD line and the VCOM line. A VRD-VCOM signal input to the gate of the transistor Q8 is supplied from the vertical drive unit 12.

The transmission and reception of various signals between the upper chip 23 and the lower chip 24 are made at a bonding part 30. A plurality of the bonding parts 30 is arranged in a column direction connection region 33, and a plurality of the bonding parts 30 is arranged in a connection region arranged in the row direction Y (hereinafter, the row direction connection region 34).

In the column direction connection region 33, three bonding parts (hereinafter, also referred to as first to third bonding parts) 30 are provided for each pixel column. The first bonding part 30 is for transmission and reception of a VSLR signal and is connected to the VSLR line in the pixel array unit 11. The second bonding part 30 is for transmission and reception of a VSL signal and is connected to the VSL line in the pixel array unit 11. The third bonding part 30 is for transmission and reception of a VCOM signal and is connected to the VCOM line in the pixel array unit 11.

A plurality of the bonding parts 30 is provided in the row direction connection region 34. For example, a bonding part 30 to which the RSTi line is connected, a bonding part 30 to which the TRGi line is connected, and a bonding part 30 to which the SELi line is connected are provided for each pixel row in the read pixel region 26. Furthermore, a bonding part 30 to which the RSTr line in the reference pixel region 27 is connected, a bonding part 30 to which the TRGr line is connected, and a bonding part 30 to which the SELr line is connected are provided in the row direction connection region 34. Moreover, a bonding part 30 to which the VRD-VSL signal line in the first switching circuit 28 is connected and a bonding part 30 to which the VRD-VCOM signal line in the second switching circuit 29 is connected are provided in the row direction connection region 34.

The example in FIG. 4 illustrates an example where the vertical drive unit 12 is disposed in the lower chip 24. A RST signal, a TRG signal, a SEL signal, a RSTr signal, a TRGr signal, a SELr signal, the VRD-VCOM signal, the VRD-VSL signal, and the like output from the vertical drive unit 12 are each transmitted to the upper chip 23 via a corresponding bonding part 30.

As illustrated in FIG. 4, the column read circuit unit 13 in the lower chip 24 includes a differential transistor pair 35, switches SW1 to SW6, and a current source 36. The switch SW1 switches whether or not to short-circuit the source of one transistor Q5 of the differential transistor pair 35 and the first bonding part 30 to which the VSLR line is connected. The switch SW2 switches whether or not to short-circuit the source of the other transistor Q6 of the differential transistor and the second bonding part 30 to which the VSL line is connected. The switch SW3 switches whether or not to supply a power supply voltage VDD to the third bonding part 30 to which the VCOM line is connected. The switch SW5 switches whether or not to connect the current source 36 to the second bonding part 30 to which the VSL line is connected. The switch SW6 switches whether or not connect the current source 36 to the third bonding part 30 to which the VCOM line is connected.

As described above, in the circuit in FIG. 4, the upper chip 23 and the lower chip 24 transmit and receive the VSL signal, the VRD signal, and the VCOM signal at the three bonding parts (first to third bonding parts) 30 for each pixel column extending in the row direction Y.

FIG. 4 illustrates switching states of the switches SW1 to SW6 in a case where the source follower mode is selected. In a case where the source follower mode is selected, the first switching circuit 28 interrupts the connection between the VSL line and the VRD line, and the second switching circuit 29 short-circuits the VRD line and the VCOM line. Furthermore, the switches SW1 and SW2 are turned off, the switch SW3 is turned on, the switch SW5 is turned on, and the switch SW6 is turned off. Since both the switches SW1 and SW2 are turned off, the differential transistor pair 35 in the column read circuit unit 13 is interrupted and thus not used. When the switch SW1 is turned off, potentials of the first bonding part 30 and the VSLR line become unstable, and the reference pixel 2r is not used either. The amplification transistor Q4 included in each pixel 2 in the read pixel region 26 constitutes a source follower circuit, when the selection transistor Q3 of each pixel 2 in a read target pixel row is turned on, a voltage level of the VSL line changes in a manner that depends on charges obtained by photoelectric conversion by the PD in each pixel and transferred to the FD. That is, in the source follower mode, the imaging pixel signal output from the read target pixel 2 in the read pixel region 26 is transmitted to the lower chip 24 through the VSL line.

Figure 5A:
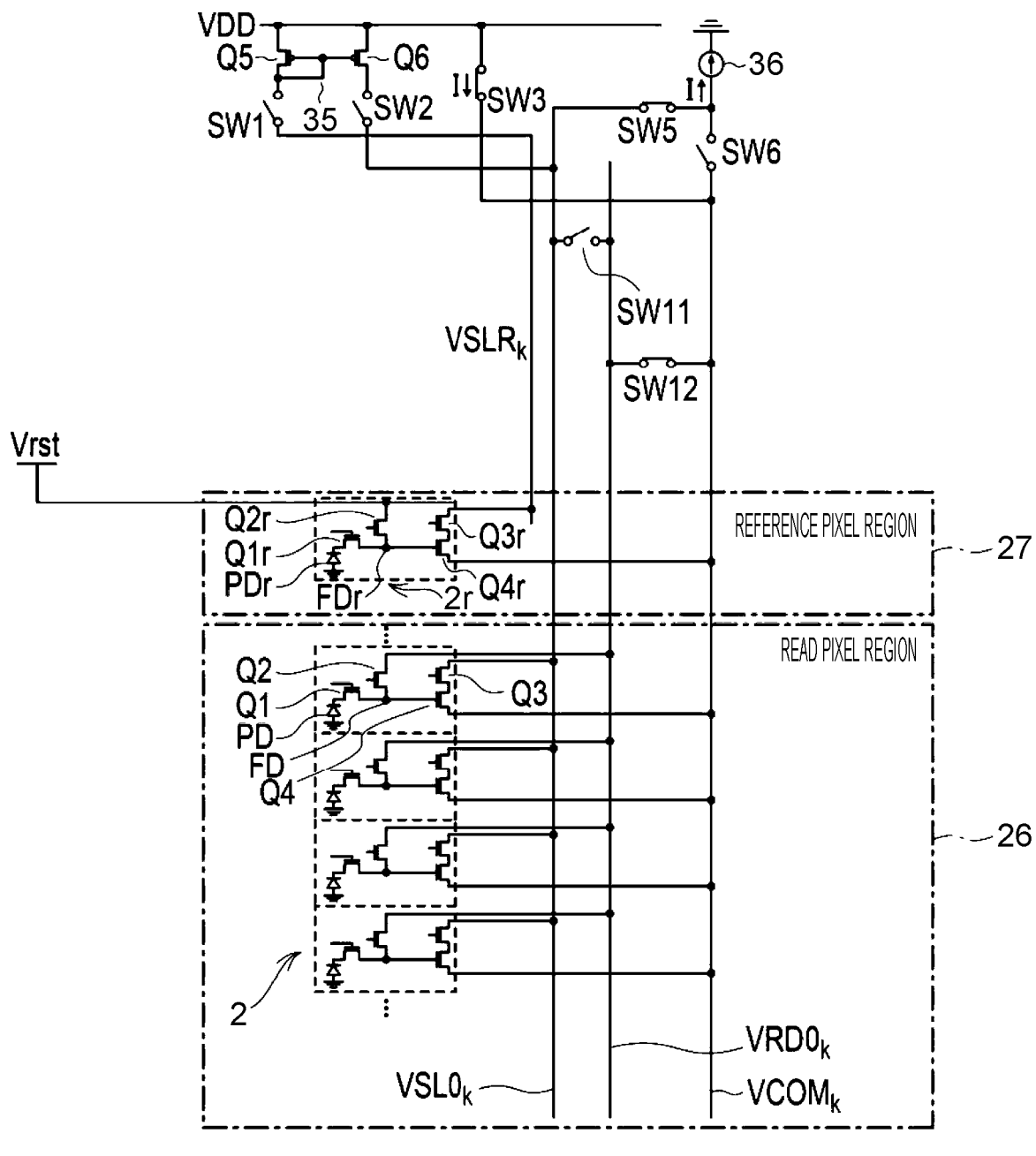
FIG. 5A is a diagram for describing circuit operation in a source follower mode.
Figure 5B:
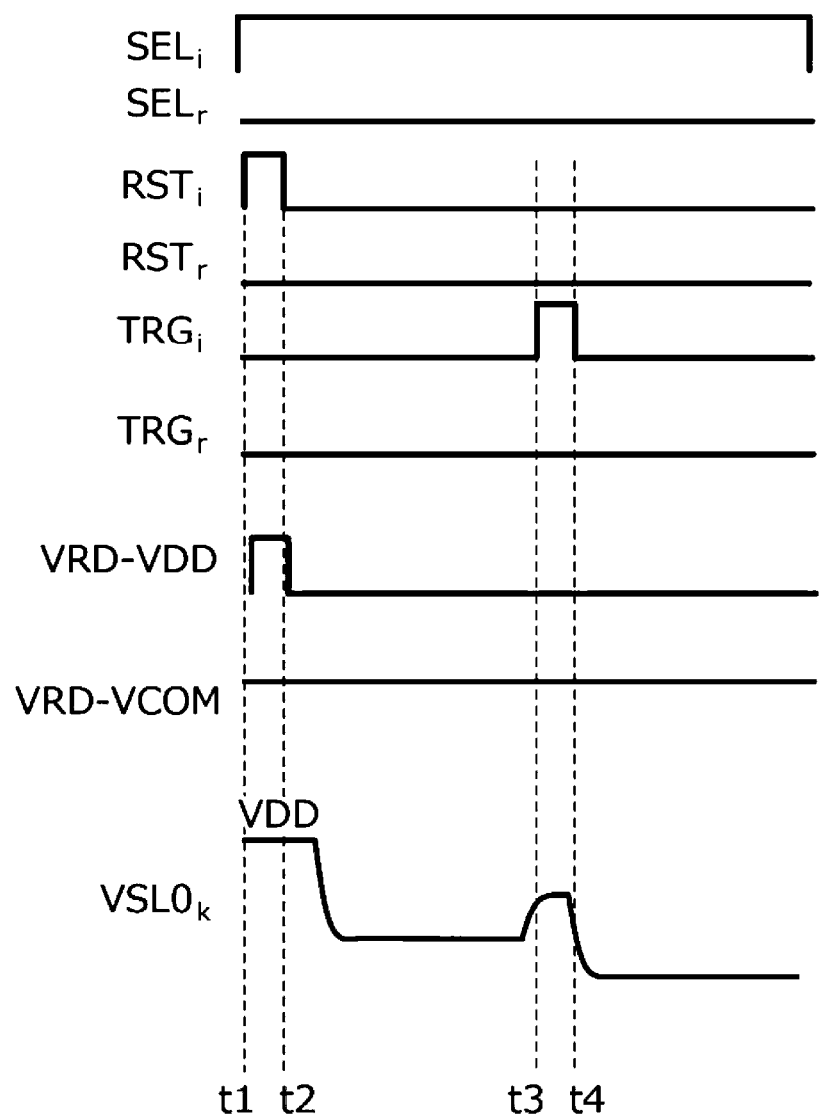
FIG. 5B is a timing chart of each part in the circuit in FIG. 5A.

FIG. 5A is a diagram for describing circuit operation in the source follower mode, illustrating a part of the circuit configuration in the pixel array unit 11 and the column read circuit unit 13. FIG. 5B is a timing chart of each part in the circuit in FIG. 5A. In FIG. 5A, the first switching circuit 28 and the second switching circuit 29 in FIG. 4 are equivalently represented by switches SW11 and SW12, and an example where the first switching circuit 28 and the second switching circuit 29 are arranged in the lower chip 24 is illustrated, for example. In this case, a switch SW7 is provided between the VRD line and the power supply voltage. As illustrated in FIG. 5A, in the source follower mode, the switch SW11 is turned off to interrupt the connection between the VSL line and the VRD line, and the switch SW12 is turned on to short-circuit the VRD line and the VCOM line.

As illustrated in FIG. 5B, in the source follower mode, the SELr of the reference pixel 2r is fixed at a low level, and the selection transistor Q3r in the reference pixel 2r is turned off. The SELi signal of the read target pixel (i-th pixel) 2 in the read pixel region 26 is fixed at a high level while the pixel 2 is selected. In a case where the read target pixel 2 is read, first, the RSTi signal is set at a high level (time t1 to time t2). As a result, the reset transistor Q2 is turned on, bringing the potential of the VRD line into a high level and bringing the FD into a reset potential. When the RST signal becomes a low level at time t2, the potential of the FD gradually decreases, and accordingly, the potential of the VSL line rapidly decreases and eventually settles at a predetermined potential (also referred to as a reset potential or a P-phase potential). Thereafter, at time t3, when the TRG signal becomes high, the transfer transistor Q1 is turned on, and the potential of the FD becomes equal to a value corresponding to the photoelectric conversion among of the PD. When the TRGi signal becomes low at time t4, the transfer transistor Q1 is turned off, and the potential of the VSL line eventually settles at a potential (D-phase potential) corresponding to the photoelectric conversion amount of the PD.

Figure 6:
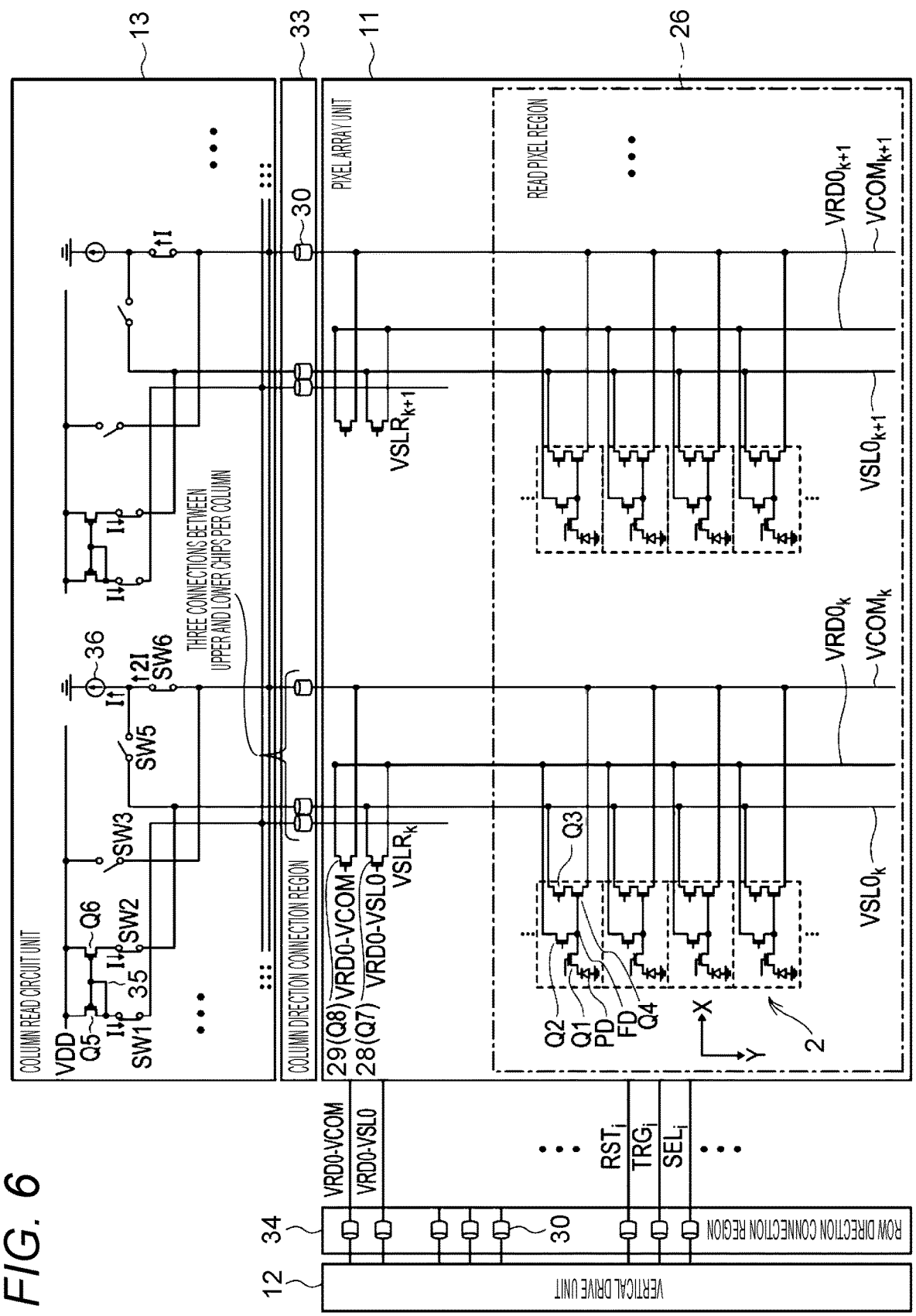
FIG. 6 is a diagram illustrating switching states of a first switching circuit, a second switching circuit, and switches in a case where a differential amplification mode is selected.

FIG. 6 is a diagram illustrating switching states of the first switching circuit 28, the second switching circuit 29, and the switches SW1 to SW6 in a case where the differential amplification mode is selected. In a case where the differential amplification mode is selected, the first switching circuit 28 short-circuits the VSL line and the VRD line, and the second switching circuit 29 interrupts the connection between the VRD line and the VCOM line. Furthermore, the switches SW1 and SW2 are turned on, the switches SW3 to SW5 are turned off, and the switch SW6 is turned on. Since both the switches SW1 and SW2 are turned on, the VSLR line is connected to the source of one transistor Q5 of the differential transistor pair 35, and the VSL line is connected to the source of the other transistor Q6. Furthermore, the source of the amplification transistor Q4r in the reference pixel 2r and the source of the amplification transistor Q4 in the read pixel region 26 are connected to the current source 36 via the switch SW6. As a result, the imaging pixel signal output from the reference pixel and the imaging pixel signal output from the pixel 2 in the read pixel region 26 are compared by the differential transistor pair 35 in the upper chip 23. Then, a signal corresponding to a voltage difference between the signals is transmitted to the column signal processing unit 14.

Figure 7A:
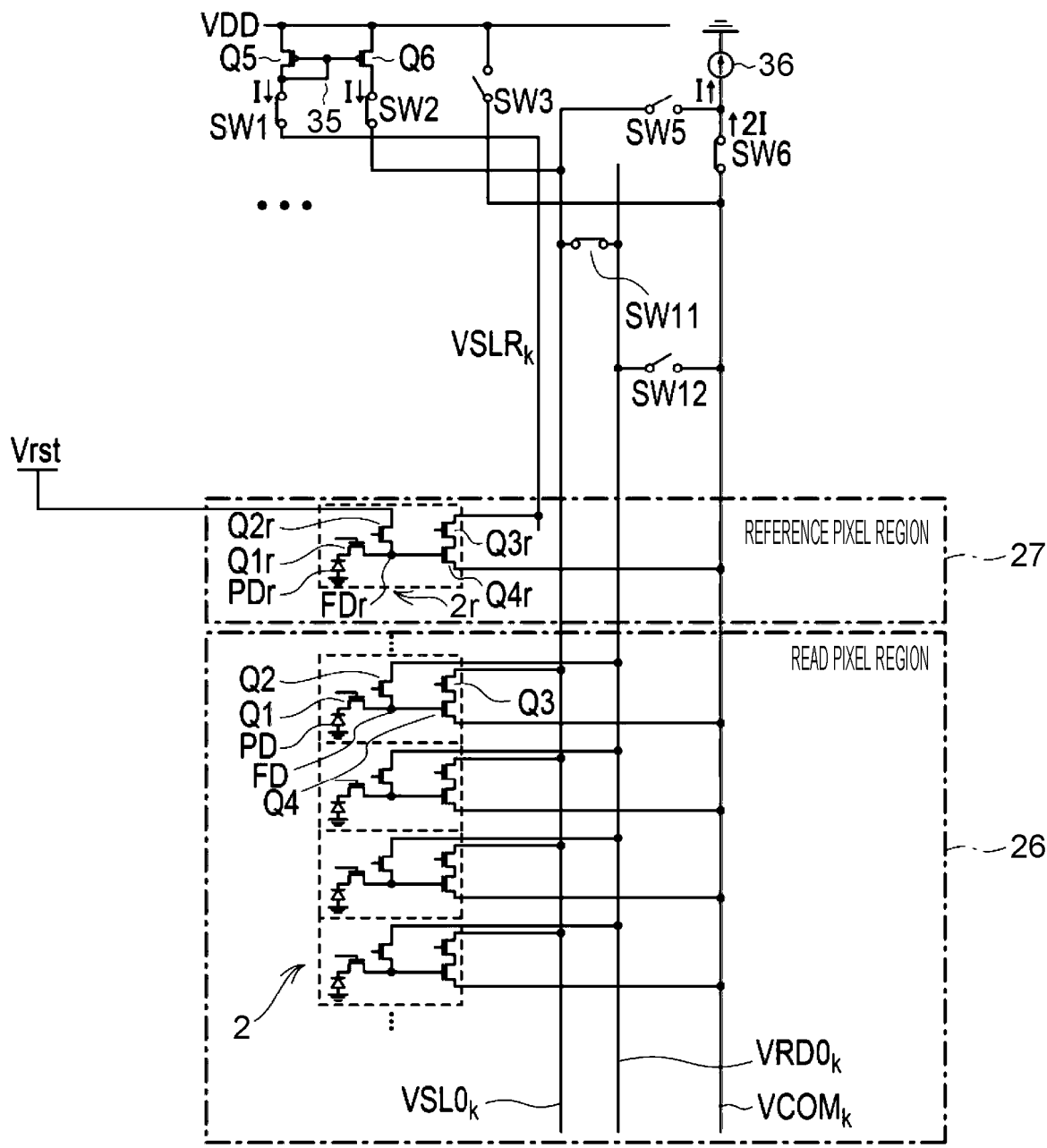
FIG. 7A is a diagram for describing circuit operation in the differential amplification mode.
Figure 7B:
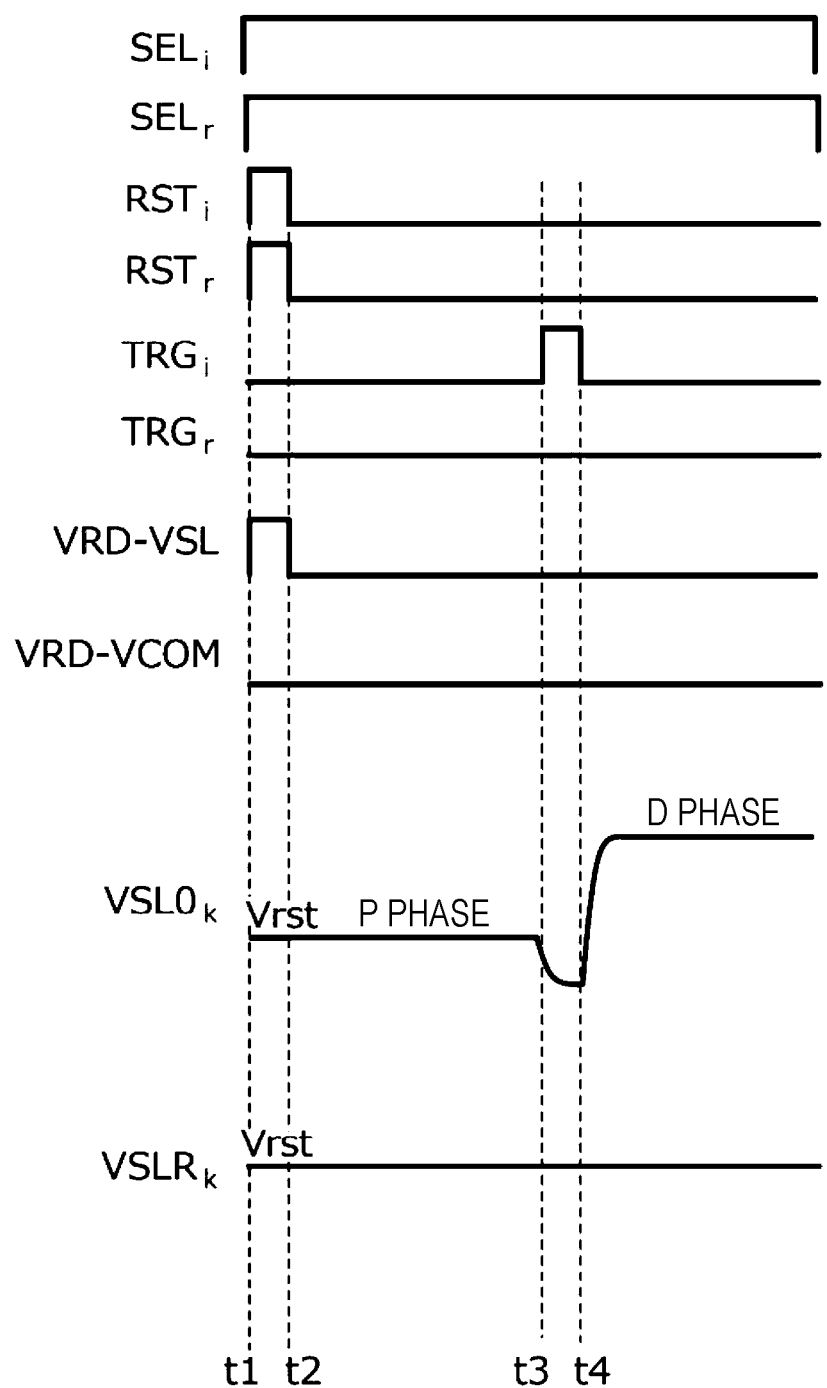
FIG. 7B is a timing chart of each part in the circuit in FIG. 7A.

FIG. 7A is a diagram for describing circuit operation in the differential amplification mode, illustrating a part of the circuit configuration in the pixel array unit 11 and the column read circuit unit 13. FIG. 7B is a timing chart of each part in the circuit in FIG. 7A. As illustrated in FIG. 7A, in the differential amplification mode, the switch SW11 corresponding to the first switching circuit 28 is turned off to interrupt the connection between the VSL line and the VRD line, and the switch SW12 corresponding to the second switching circuit 29 is turned on to short-circuit the VRD line and the VCOM line.

As illustrated in FIG. 7B, in the differential amplification mode, the selection transistor Q3r in the reference pixel 2r and the selection transistor Q3 in the read target pixel 2 are turned on. Between time t1 and time t2, both the RSTr for the reference pixel 2r and the RSTi for the read target pixel 2 become a high level, both the reset transistor Q2 in the reference pixel 2r and the reset transistor Q2 in the read target pixel 2 are turned on, and the VCOM line and the VSL line become the reset potential (P-phase potential). Thereafter, when the TRG signal becomes a high level between time t3 and time t4, the transfer transistor Q1 is turned on, and the differential transistor pair 35 sets the VSL line at a potential corresponding to a potential difference between the potential of the VSL line and the potential of the reference pixel.

As described above, in the circuit of the first circuit configuration example, the first switching circuit 28 and the second switching circuit 29 are provided in the upper chip 23, and whether or not to short-circuit the VSL line and the VRD line and whether or not to short-circuit the VRD line and the VCOM line are switched in a manner that depends on which of the source follower mode and the differential amplification mode is selected. The first switching circuit 28 that switches whether or not to short-circuit the VSL line and the VRD line and the second switching circuit 29 that switches whether or not to short-circuit the VRD line and the VCOM line are provided in the upper chip 23, which eliminates the need of the transmission and reception of the VRD signal between the upper chip 23 and the lower chip 24 and thus allows a reduction in the number of bonding parts 30 via which signals are transmitted and received between the upper chip 23 and the lower chip 24.

Figure 8:
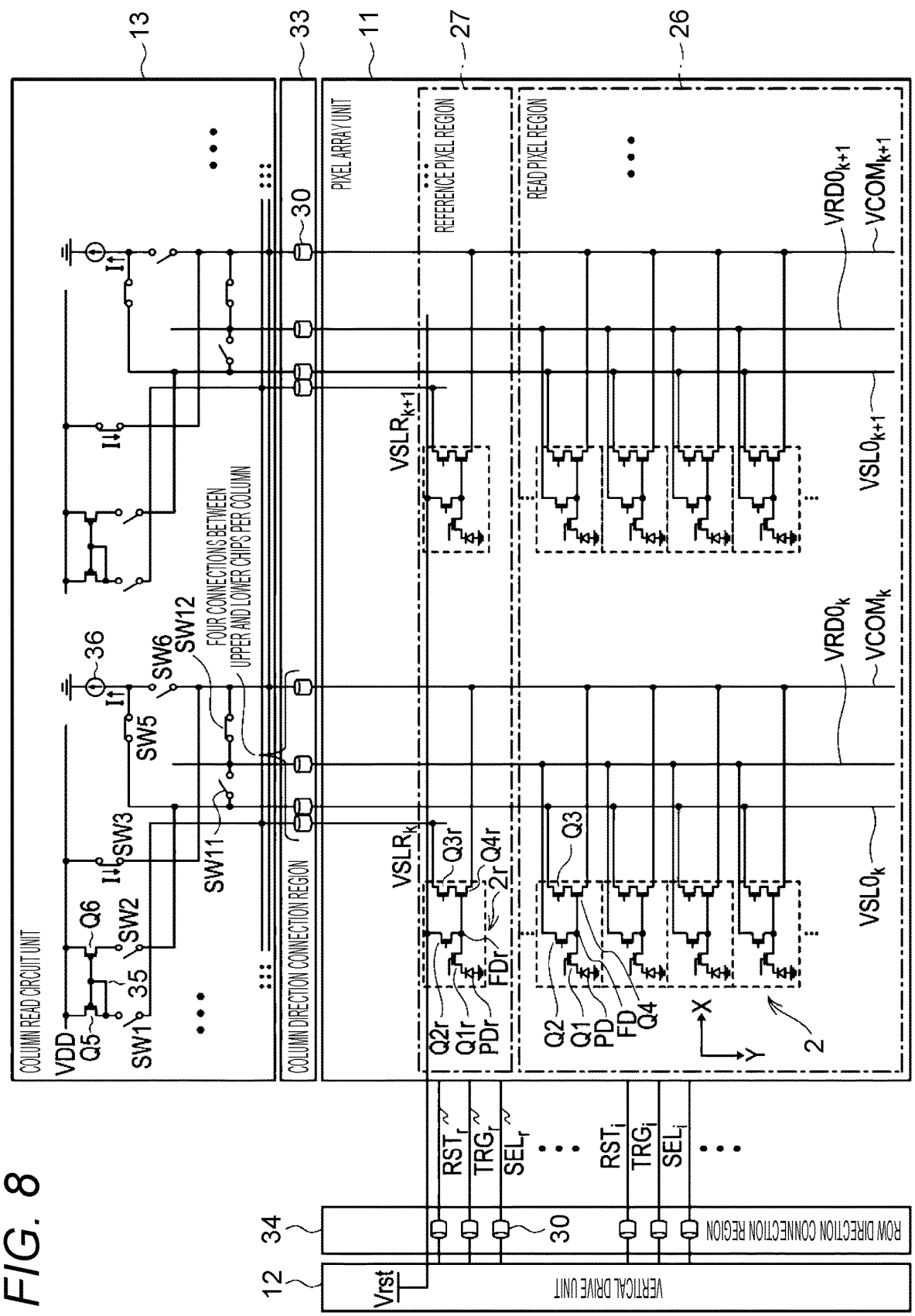
FIG. 8 is a circuit diagram of a first comparative example of the pixel array unit and the column read circuit unit in a case where the source follower mode is selected.
Figure 9:
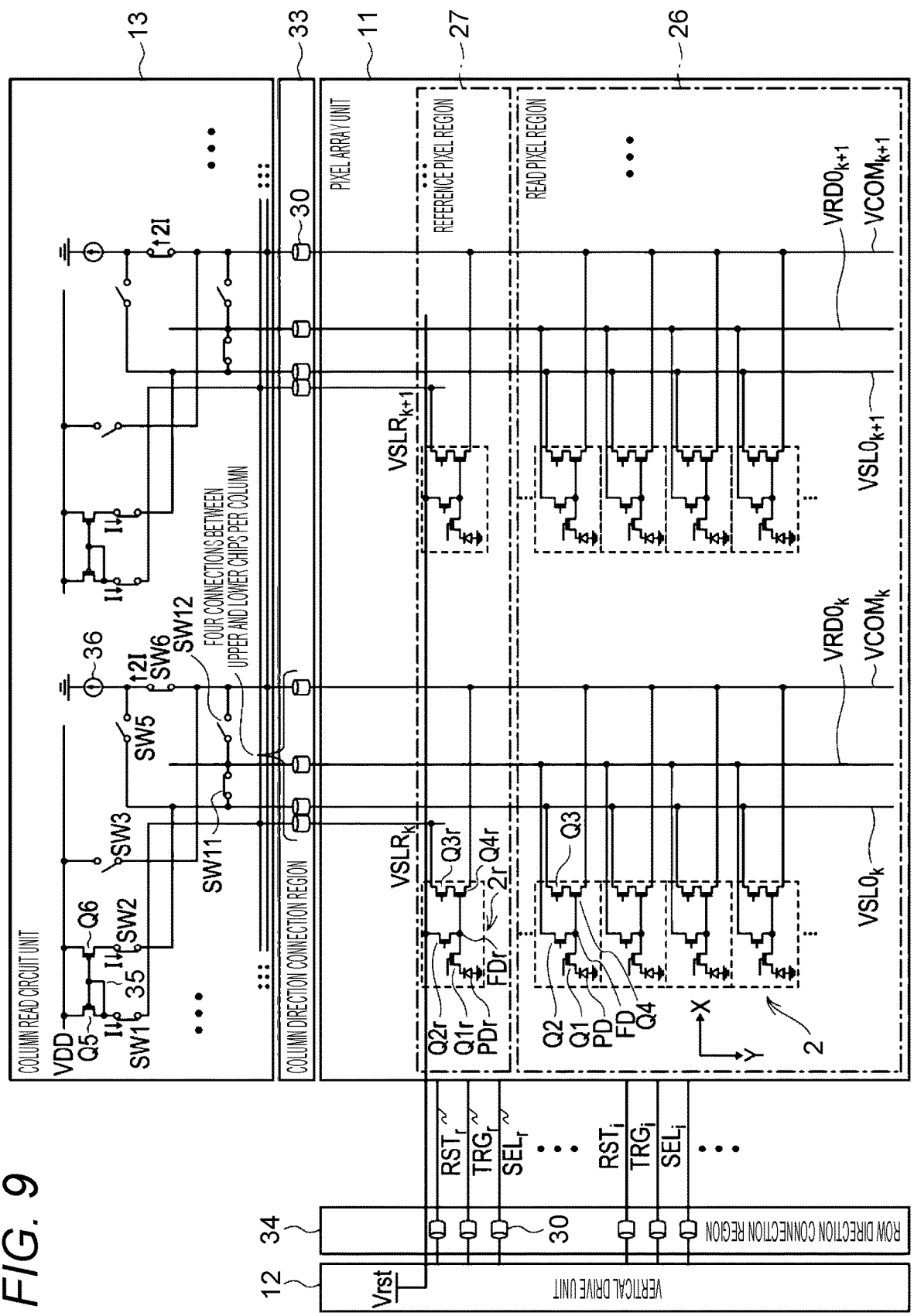
FIG. 9 is a circuit diagram of the first comparative example of the pixel array unit and the column read circuit unit in a case where the differential amplification mode is selected.

FIG. 8 is a circuit diagram of a first comparative example of the pixel array unit 11 and the column read circuit unit 13 in a case where the source follower mode is selected, and FIG. 9 is a circuit diagram of the first comparative example of the pixel array unit 11 and the column read circuit unit 13 in a case where the differential amplification mode is selected. The circuit in FIGS. 8 and 9 is different from the circuit in FIGS. 4 and 6 in that the switch SW11 corresponding to the first switching circuit 28 and the switch SW12 corresponding to the second switching circuit 29 are provided on the lower chip 24 side. In a case where the switches SW11 and SW12 are provided in the lower chip 24, it is necessary to provide, for each pixel column, a bonding part 30 via which the VSLR signal is transmitted and received, a bonding part 30 via which the VSL signal is transmitted and received, a bonding part 30 via which the VRD signal is transmitted and received, and a bonding part 30 via which the VCOM signal is transmitted and received in the upper chip 23 and the lower chip 24, so that the number of bonding parts 30 is increased by one for each pixel column as compared with the circuit in FIGS. 4 and 6. Since a large number of pixel columns are provided in the column direction X, the total number of the bonding parts 30 in the circuit in FIGS. 8 and 9 becomes considerably large as compared with the circuit in FIGS. 4, 5A, and 5B, and a dead space for providing the bonding parts 30 in the upper chip 23 and the lower chip 24 increases accordingly.

As described above, in the circuit in FIGS. 4 and 6, the first switching circuit 28 and the second switching circuit 29 are provided in the upper chip 23, which eliminates the need of the transmission and reception of the VRD signal between the upper chip 23 and the lower chip 24 and thus allows the bonding part 30 for the VRD signal to be omitted.

(Second Circuit Configuration Example)

The first switching circuit 28 and the second switching circuit 29 illustrated in FIGS. 4 and 6 may be arranged at a position different from the position illustrated in FIGS. 4 and 6 in the upper chip 23.

Figure 10:
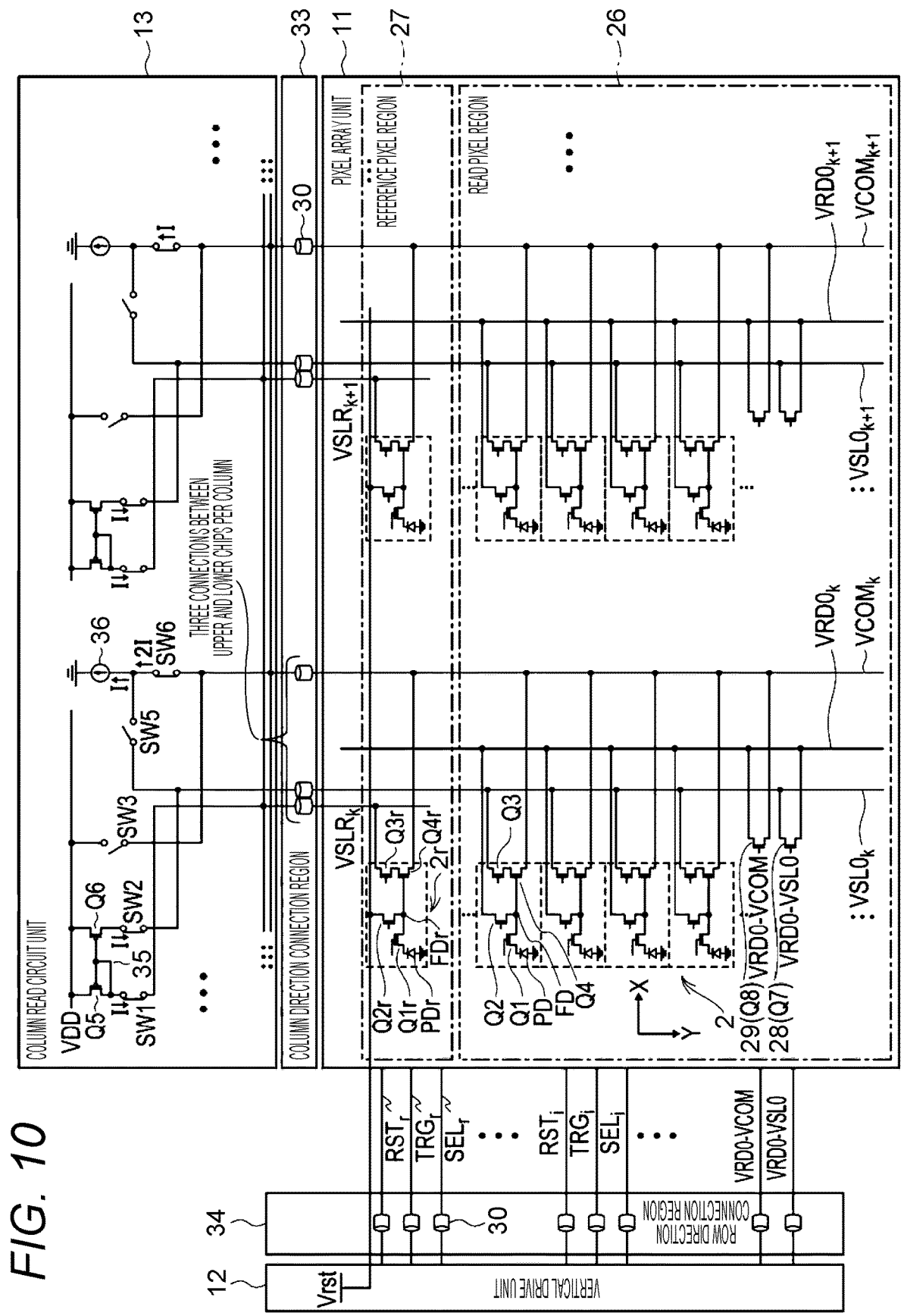
FIG. 10 is a circuit diagram illustrating a second circuit configuration example of the pixel array unit and the column read circuit unit.

FIG. 10 is a circuit diagram illustrating a second circuit configuration example of the pixel array unit 11 and the column read circuit unit 13. FIG. 10 illustrates an example where the first switching circuit 28 and the second switching circuit 29 are arranged at a position different from the position in FIG. 4. The circuit in FIG. 10 is the same as the circuit in FIG. 4 except that the layout of the first switching circuit 28 and the second switching circuit 29 is different from the layout in the circuit in FIG. 4.

The first switching circuit 28 and the second switching circuit 29 in the circuit in FIG. 10 are arranged at one end side, in the row direction Y, of the read pixel region 26 in the pixel array unit 11 remote from the reference pixel 2r. Similarly to the circuit in FIG. 4, the circuit in FIG. 10 allows a reduction in the number of bonding parts 30 provided in the upper chip 23 and the lower chip 24.

(Third Circuit Configuration Example)

Figure 11:
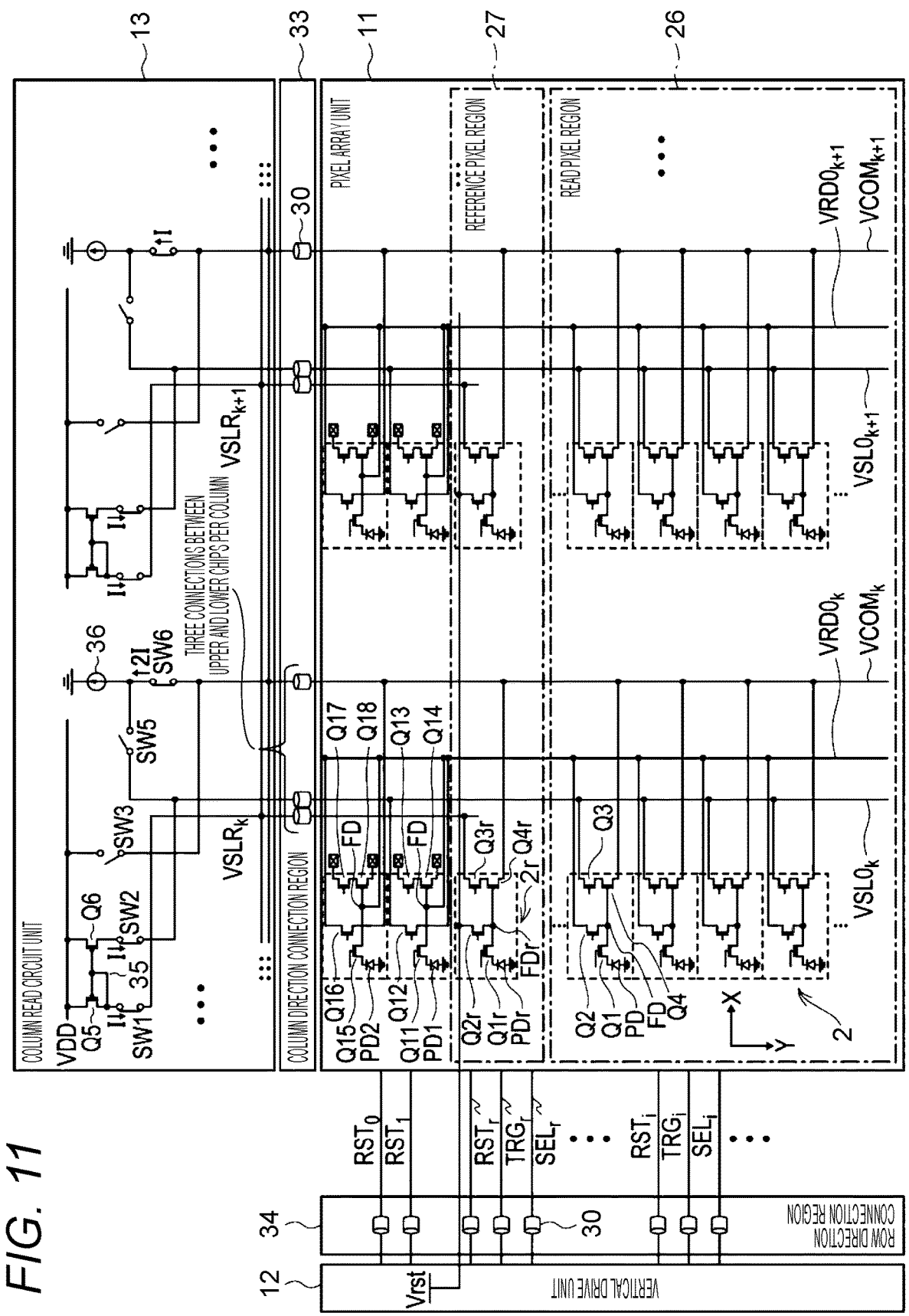
FIG. 11 is a circuit diagram illustrating a third circuit configuration example of the pixel array unit and the column read circuit unit.

The specific circuit configuration of the first switching circuit 28 and the second switching circuit 29 is not limited to the circuit configurations illustrated in FIGS. 4 and 10. FIG. 11 is a circuit diagram illustrating a third circuit configuration example of the pixel array unit 11 and the column read circuit unit 13. The circuit in FIG. 11 includes a first switching circuit 28 and a second switching circuit 29 different in circuit configuration from the circuit in FIG. 4.

The first switching circuit 28 and the second switching circuit 29 have a circuit configuration similar to the circuit configuration of the reference pixel 2r or each pixel 2 in the read pixel region 26. More specifically, the first switching circuit 28 includes a PD 1, a transfer transistor Q11, a FD 1, a reset transistor Q12, a selection transistor Q13, and an amplification transistor Q14. Similarly, the second switching circuit 29 includes a PD 2, a transfer transistor Q15, a FD 2, a reset transistor Q16, a selection transistor Q17, and an amplification transistor Q18.

The reset transistor Q12 in the first switching circuit 28 switches whether or not to short-circuit the VSL line and the VRD line in accordance with a $RST_1$ signal. The reset transistor Q16 in the second switching circuit 29 switches whether or not to short-circuit the VRD line and the VCOM line in accordance with a $RST_0$ signal.

As described above, in the circuit in FIG. 11, the first switching circuit 28 and the second switching circuit 29 are identical in circuit configuration to the pixel 2 or the reference pixel 2r, and the reset transistors Q2 in the first switching circuit 28 and the second switching circuit 29 are made different in connection destination from the pixel 2 or the reference pixel 2r, so as to switch whether or not to short-circuit the VSL line and the VRD line and whether or not to short-circuit the VRD line and the VCOM line.

In the third circuit configuration example, the first switching circuit 28 and the second switching circuit 29 are identical in circuit configuration to the pixel 2 or the reference pixel 2r, which facilitates a layout design.

(Fourth Circuit Configuration)

In the circuit in FIG. 11, the first switching circuit 28 and the second switching circuit 29 identical in circuit configuration to the pixel 2 or the reference pixel 2r are arranged in the vicinity of the reference pixel 2r, but the first switching circuit 28 and the second switching circuit 29 may be provided at a different position in the upper chip 23.

Figure 12:
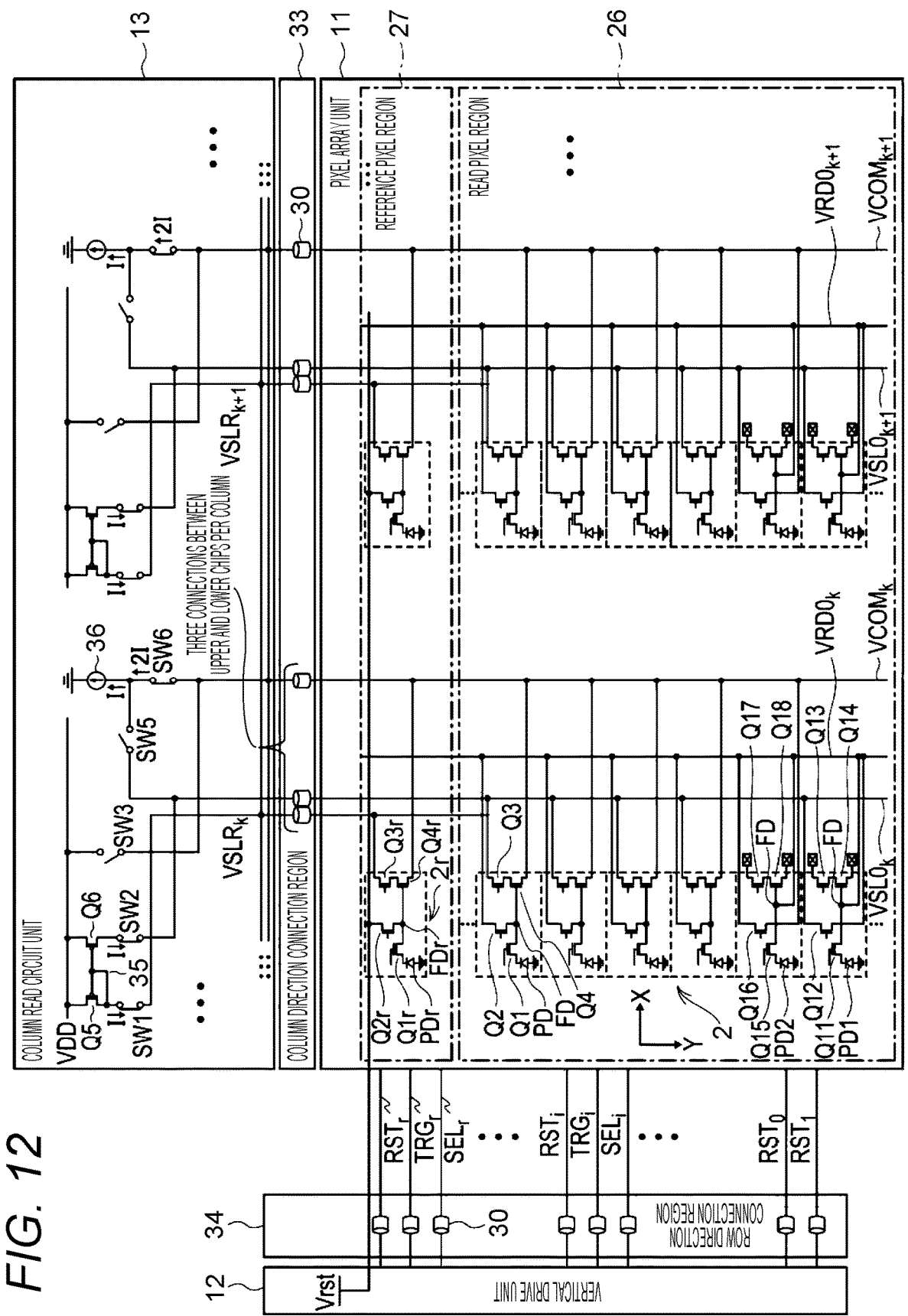
FIG. 12 is a circuit diagram illustrating a fourth circuit configuration example of the pixel array unit and the column read circuit unit.

FIG. 12 is a circuit diagram illustrating a fourth circuit configuration example of the pixel array unit 11 and the column read circuit unit 13. The circuit in FIG. 12 illustrates an example where the first switching circuit 28 and the second switching circuit 29 are arranged at a position different from the position in FIG. 11. The circuit in FIG. 12 is the same as the circuit in FIG. 11 except that the layout of the first switching circuit 28 and the second switching circuit 29 is different from the layout in the circuit in FIG. 11.

The first switching circuit 28 and the second switching circuit 29 in the circuit in FIG. 12 are arranged at one end side, in the row direction Y, of the read pixel region 26 in the pixel array unit 11 remote from the reference pixel 2r. Similarly to the circuit in FIG. 11, the circuit in FIG. 12 allows a reduction in the number of bonding parts 30 between the upper chip 23 and the lower chip 24.

(Fifth Circuit Configuration)

For the first to fourth circuit configurations described above, an example where one VSL line and one VRD line are provided for each pixel column extending in the row direction Y in the pixel array unit 11 has been described. On the other hand, a plurality of the VSL lines and a plurality of the VRD lines may be provided for each pixel column. An increase in the number of VSL lines and a reduction in the number of pixels 2 connected to one VSL line allows the imaging pixel signal to be read at high speed.

Figure 13:
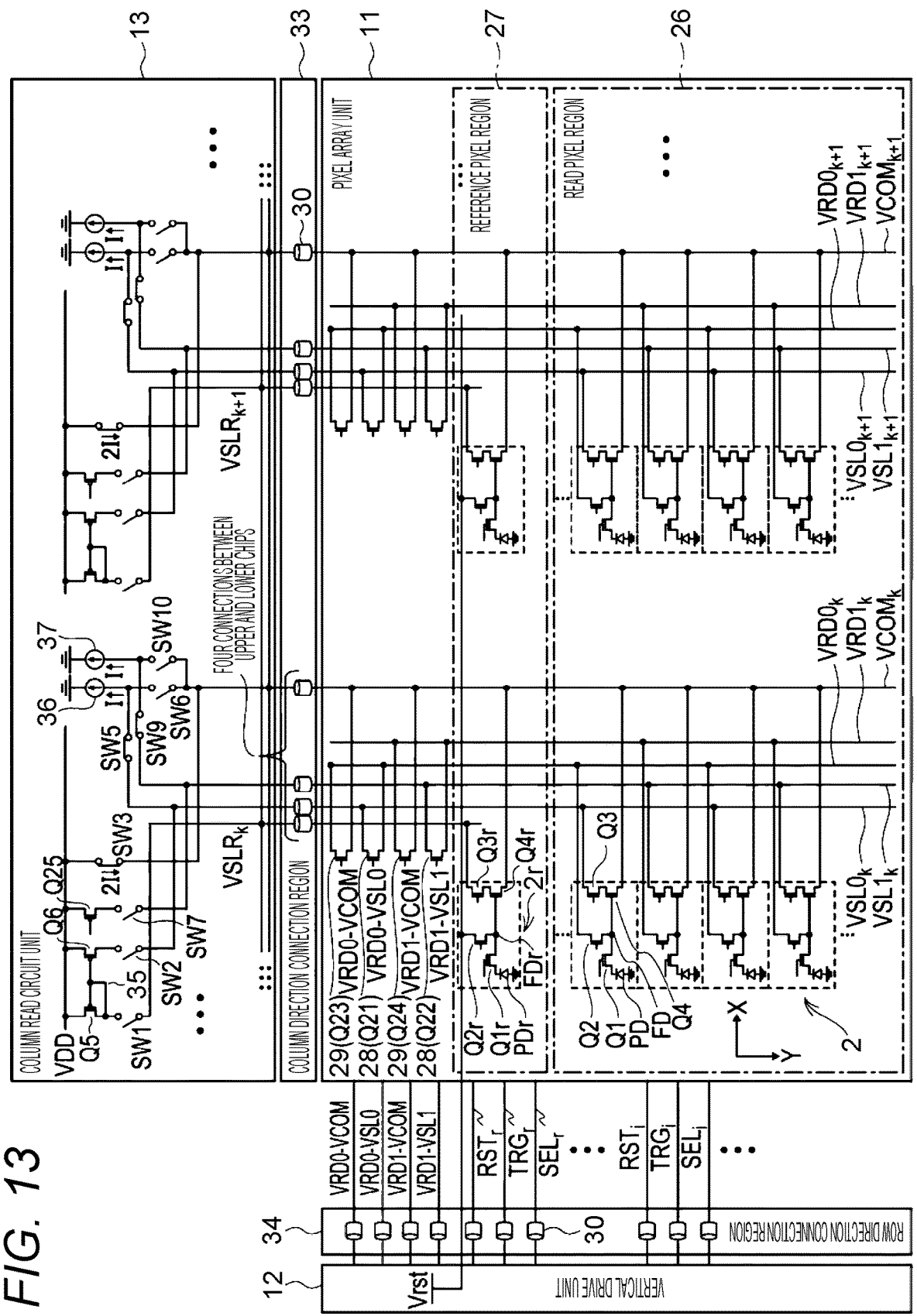
FIG. 13 is a circuit diagram illustrating a fifth circuit configuration example of the pixel array unit and the column read circuit unit.

FIG. 13 is a circuit diagram illustrating a fifth circuit configuration example of the pixel array unit 11 and the column read circuit unit 13. The circuit in FIG. 13 illustrates an example where two VSL lines and two VRD lines are provided for each pixel column. Herein and in FIG. 13, the two VSL lines are referred to as a VSL0 line and a VSL1 line, and the two VRD lines are referred to as a VRD0 line and a VRD1 line. In the pixel columns arranged in the row direction Y in the read pixel region 26, pixels 2 in the odd-numbered columns are connected to the VSL0 line and the VRD0 line, and pixels 2 in the even-numbered columns are connected to the VSL0 line and the VRD1.

The first switching circuit 28 includes a transistor Q21 that switches whether or not to short-circuit the VSL0 line and the VRD0 line, and a transistor Q22 that switches whether or not to short-circuit the VSL1 line and the VRD1 line. The second switching circuit 29 includes a transistor Q23 that switches whether or not to short-circuit the VRD0 line and the VCOM line, and a transistor Q24 that switches whether or not to short-circuit the VRD1 line and the VCOM line. VRD0-VSL0, VRD1-VSL1, VRD0-VCOM, and VRD1-VCOM, which are gate signals for turning on or off the transistors Q21 to Q24, are supplied from the vertical drive unit 12.

The column read circuit unit 13 in the lower chip 24 in FIG. 13 includes a transistor Q25, a current source 37, and switches SW7 to SW10 in addition to the configuration of the column read circuit unit 13 in the first to fourth circuit configuration examples described above.

The transistor Q25 has a drain to which the power supply voltage VDD is applied and a source connected to one end of the switch SW7. The switch SW7 switches whether or not to short-circuit the drain of the transistor Q25 and the VSL1 line. The switch SW9 switches whether or not to connect the VSL1 line to the current source 37. The switch SW10 switches whether or not to connect the VCOM line to the current source 37.

In a case of the circuit in FIG. 13, it is necessary to transmit and receive a VSL0 signal and a VSL1 signal between the upper chip 23 and the lower chip 24, so that the number of bonding parts 30 between the upper chip 23 and the lower chip 24 is increased by one for each pixel column as compared with the first to fourth circuit configurations. It is, however, not necessary to transmit the VRD0 signal and the VRD1 signal to the lower chip 24 side, which eliminates the need of the bonding parts 30 for transmission and reception of such signals.

In the circuit in FIG. 13, an example where two VSL lines and two VRD lines are provided for each pixel column has been described, but three or more VSL lines and three or more VRD lines may be provided for each pixel column. The larger the number of VSL lines for each pixel column, the larger the number of signal wirings and the number of bonding parts 30, but it is possible to read the imaging pixel signal at high speed.

Figure 14:
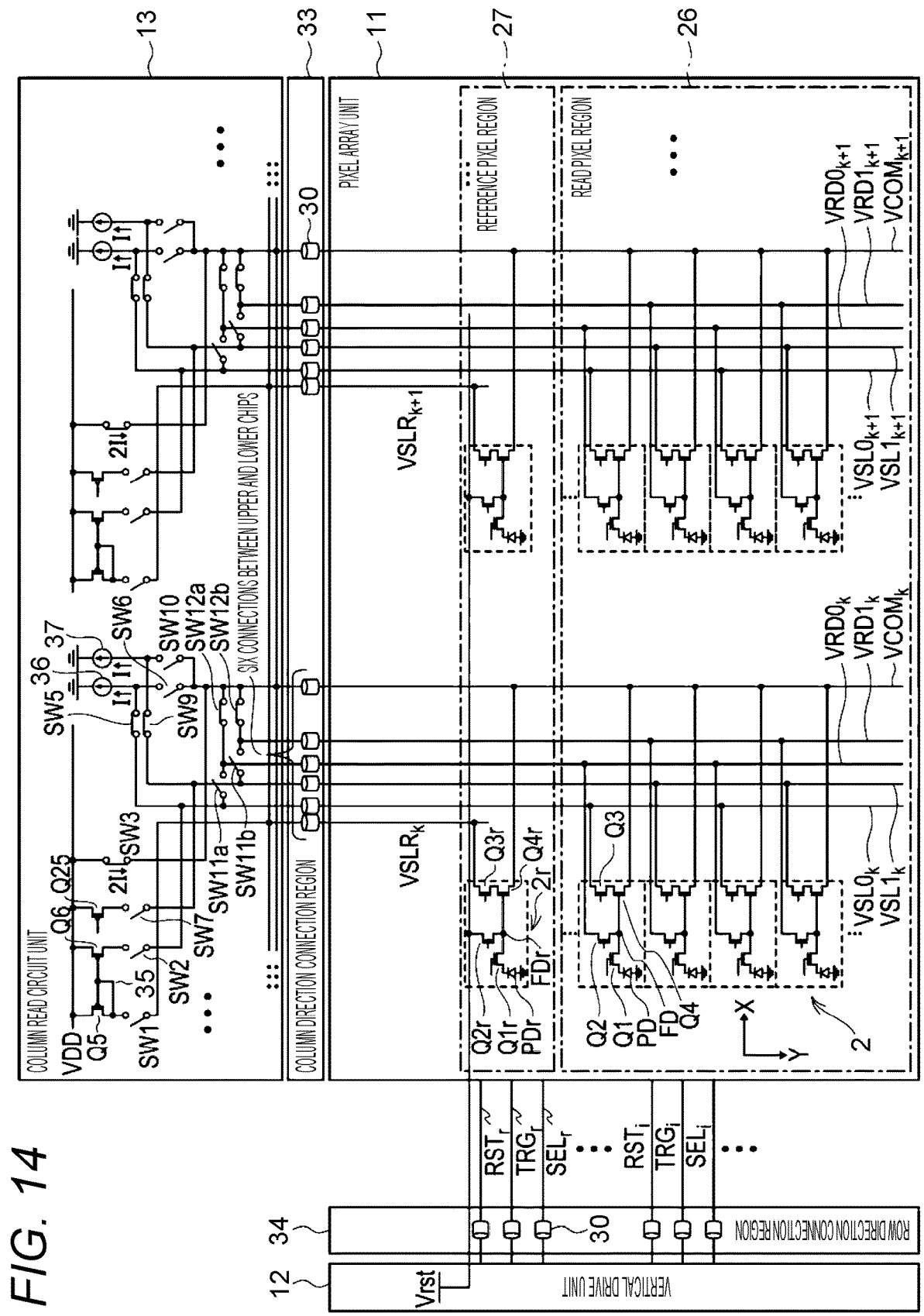
FIG. 14 is a circuit diagram of a second comparative example of the pixel array unit and the column read circuit unit in a case where the source follower mode is selected.
Figure 15:
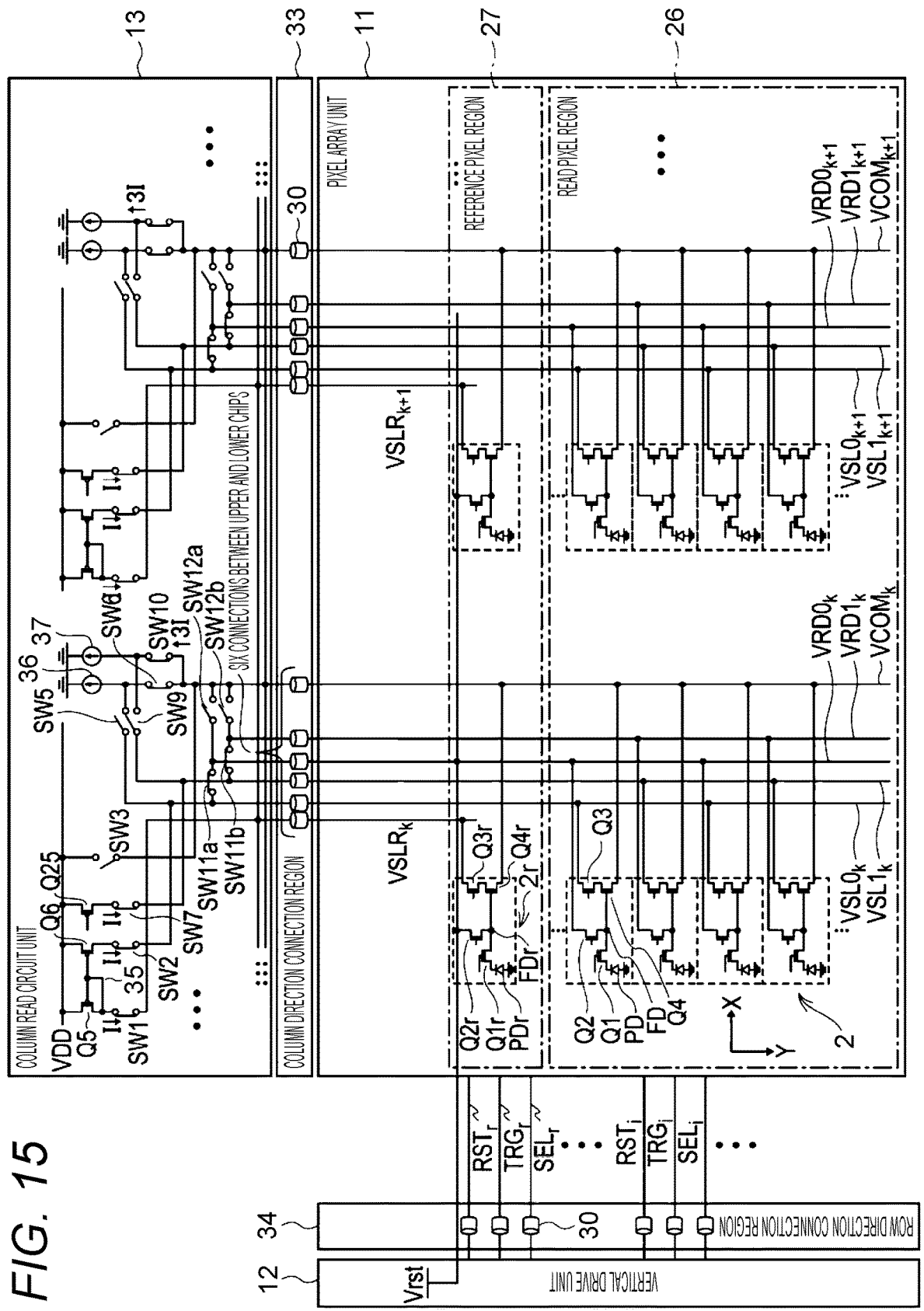
FIG. 15 is a circuit diagram of the second comparative example of the pixel array unit and the column read circuit unit in a case where the differential amplification mode is selected.

FIG. 14 is a circuit diagram of a second comparative example of the pixel array unit 11 and the column read circuit unit 13 in a case where the source follower mode is selected, and FIG. 15 is a circuit diagram of the second comparative example of the pixel array unit 11 and the column read circuit unit 13 in a case where the differential amplification mode is selected. FIGS. 14 and 15 illustrate an example where two VSL lines and two VRD lines are provided for each pixel column. FIG. 14 is a circuit diagram of the source follower mode, and FIG. 15 is a circuit diagram of the differential amplification mode. FIGS. 14 and 15 are different from each other in the switching states of the first switching circuit 28, the second switching circuit 29, and the switches SW1 to SW10.

In the circuit of the second comparative example illustrated in FIG. 14, switches SW11a and SW11b corresponding to the first switching circuit 28 and switches SW12a and SW12b corresponding to the second switching circuit 29 are provided on the lower chip 24 side, and not only the VSL0 signal, the VSL1 signal, and the VCOM signal but also the VRD0 signal and the VRD1 signal are transmitted between the upper chip 23 and the lower chip 24. This makes the number of bonding parts 30 between the upper chip 23 and the lower chip 24 larger than in FIG. 13. Specifically, the bonding part 30 for the VRD0 signal and the bonding part 30 for the VRD1 signal are newly required for each pixel column extending in the row direction Y.

As can be seen by comparing the circuit of the second comparative example in FIGS. 14 and 15 with the circuit of the fifth circuit configuration example in FIG. 13, providing the first switching circuit 28 and the second switching circuit 29 on the upper chip 23 side eliminates the need of transmission of the VRD0 signal and the VRD1 signal to the lower chip 24 and thus allows a reduction in the number of bonding parts 30 between the upper chip 23 and the lower chip 24. The larger the number of VSL lines and VRD lines for each pixel column, the larger the number of bonding parts 30 that can be reduced.

(Sixth Circuit Configuration Example)

The upper chip 23 and the lower chip 24 have some signal wirings that do not interfere with the circuit operation even when the signal wiring are electrically short-circuited. Short-circuiting such signal wirings to thin out signal wirings allows a reduction in the number of signals transmitted and received between the upper chip 23 and the lower chip 24 and allows a reduction in the number of bonding parts 30 between the upper chip 23 and the lower chip 24.

Figure 16:
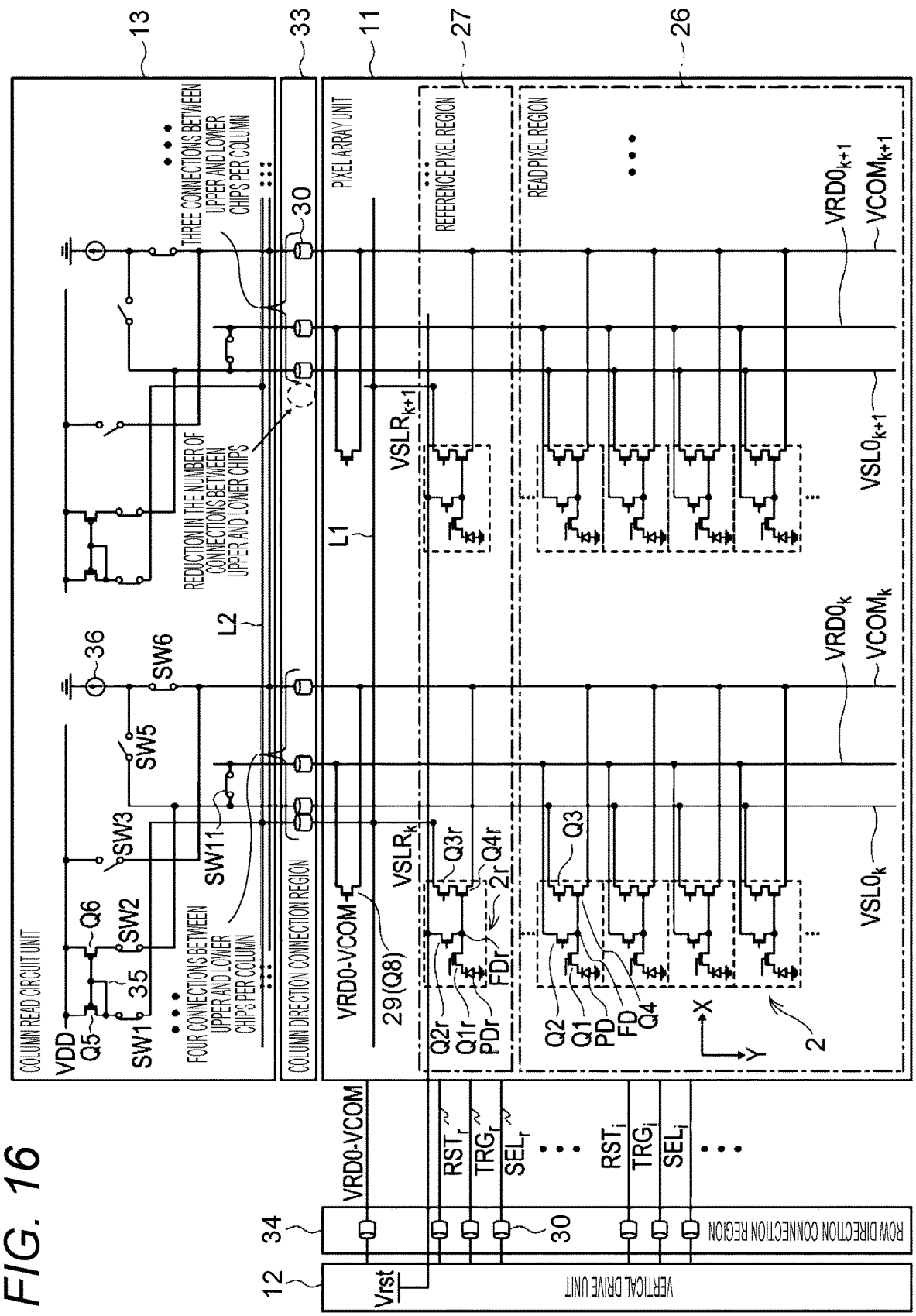
FIG. 16 is a circuit diagram illustrating a sixth circuit configuration example of the pixel array unit and the column read circuit unit.

FIG. 16 is a circuit diagram illustrating a sixth circuit configuration example of the pixel array unit 11 and the column read circuit unit 13. FIG. 16 illustrates an example of imaging pixel read in the differential amplification mode. In the differential amplification mode, each VSLR line in the upper chip 23 is connected to the source of one transistor Q5 of the differential transistor pair 35 in the lower chip 24.

In FIG. 16, the VSLR line connected to the drain of the selection transistor Q3 in the reference pixel 2r in the upper chip 23 is short-circuited among all the reference pixels 2r by a signal wiring L1 extending in the column direction X. The VSLR line is connected to the bonding part 30 in the row direction connection region 34 in the upper chip 23. This bonding part 30 is bonded to a corresponding bonding part 30 in the lower chip 24. The number of bonding parts 30 provided to connect to the VSLR line is smaller than the number of pixel columns. That is, it is possible to thin out the bonding parts 30 provided to connect to the VSLR line by short-circuiting the VSLR line of each pixel column with the signal wiring L1.

Also on the lower chip 24 side, the switch SW1 on a path extending to the source of one transistor Q5 of each differential transistor pair 35 corresponding to each pixel column has one end short-circuited by a signal wiring line L2 extending in the column direction X and connected to the above-described bonding part 30. Bonding the bonding part 30 in the upper chip 23 and the bonding part 30 in the lower chip 24 allows the short-circuited VSLR signal in the upper chip 23 to be supplied to the source of one transistor Q5 of the differential transistor pair 35.

Figure 17A:
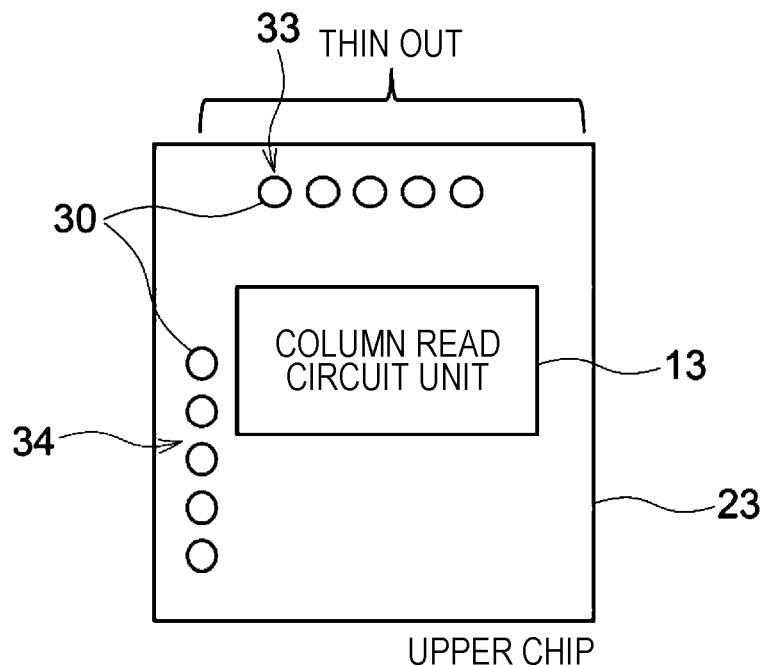
FIG. 17A is a diagram schematically illustrating a layout of bonding parts in an upper chip.
Figure 17B:
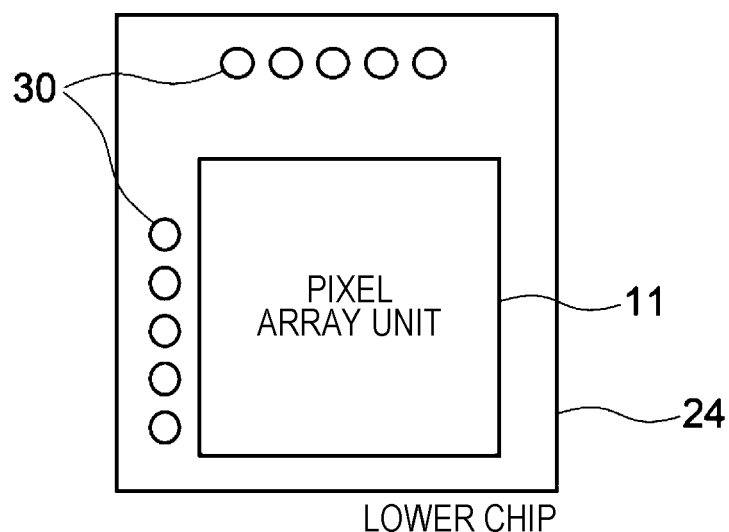
FIG. 17B is a diagram schematically illustrating a layout of bonding parts in a lower chip.

FIG. 17A is a diagram schematically illustrating a layout of the bonding parts 30 in the upper chip 23, and FIG. 17B is a diagram schematically illustrating a layout of the bonding parts 30 in the lower chip 24. The bonding parts 30 are provided at positions so as to align with each other in the top-to-bottom direction when the upper chip 23 and the lower chip 24 are stacked on top of each other. As illustrated in FIGS. 17A and 17B, the bonding part 30 for the VSLR line need not be provided for each pixel column in the column direction connection region 33, so that it is possible to reduce the number of bonding parts 30 by the number of the pixel columns.

Figure 18:
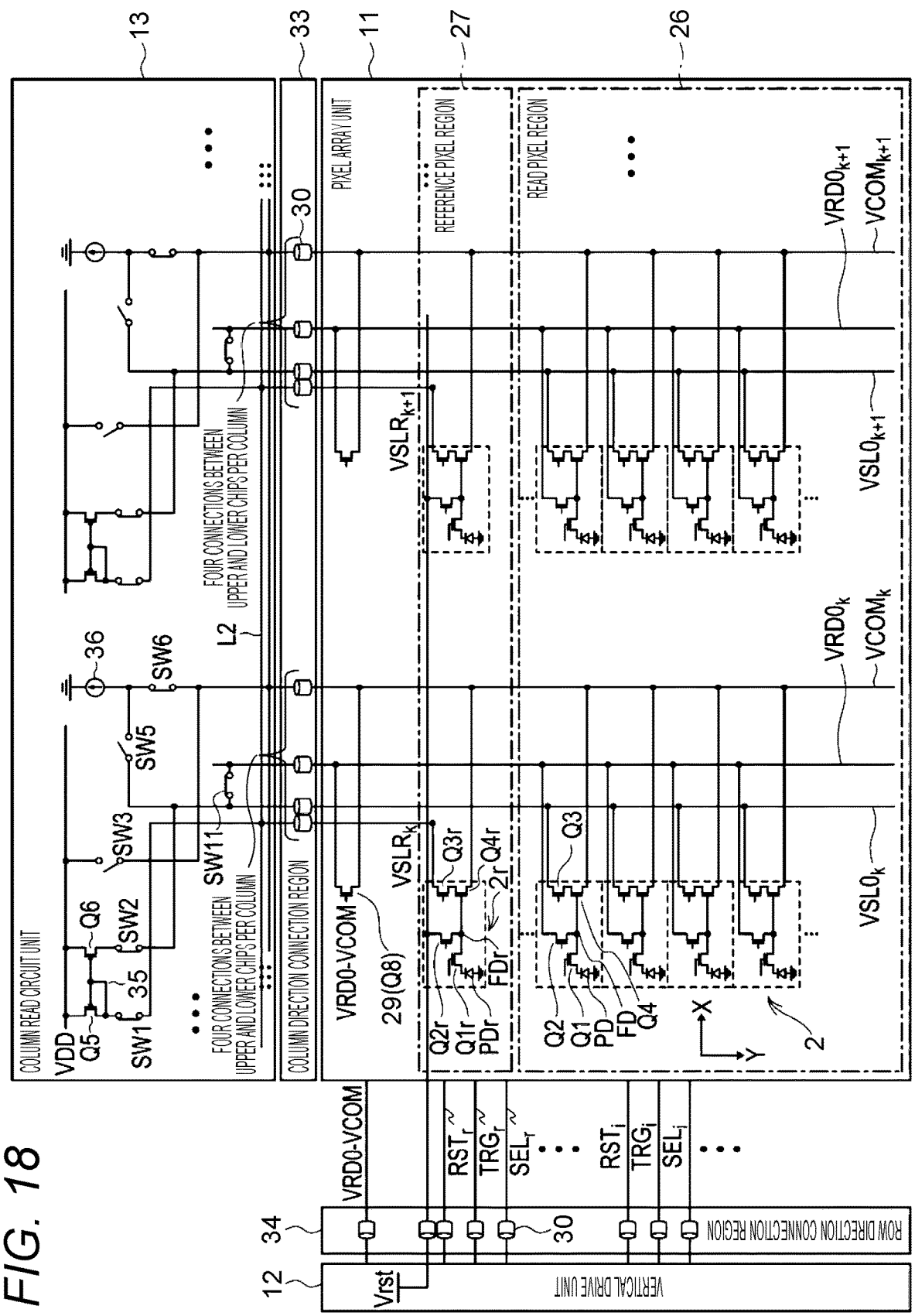
FIG. 18 is a circuit diagram illustrating a third comparative example of the pixel array unit in the upper chip and the column read circuit unit in the lower chip.

FIG. 18 is a circuit diagram illustrating a third comparative example of the pixel array unit 11 in the upper chip 23 and the column read circuit unit 13 in the lower chip 24. The circuit in FIG. 18 does not include the signal wiring L1 extending in the column direction to short-circuit each VSLR line in the upper chip 23 as compared with the circuit in FIG. 16. It is therefore necessary to provide, in the upper chip 23 and the lower chip 24, the bonding part 30 for connecting the VSLR line for each pixel column, which increases the number of bonding parts 30 in the column direction connection region 33.

As described above, in the sixth circuit configuration example, the VSLR line for each pixel column is short-circuited by the signal wiring L1 extending in the column direction to thin out the bonding parts 30 for the VSLR line in the column direction connection region 33, so that it is possible to reduce the total number of bonding parts 30 in the column direction connection region 33.

(Seventh Circuit Configuration Example)

In the circuit in FIG. 16, the bonding parts 30 for the VSLR line in the column direction connection region 33 are thinned out, or alternatively, the bonding parts 30 for the VSLR line may be provided in the row direction connection region 34 rather than in the column direction connection region 33.

Figure 19:
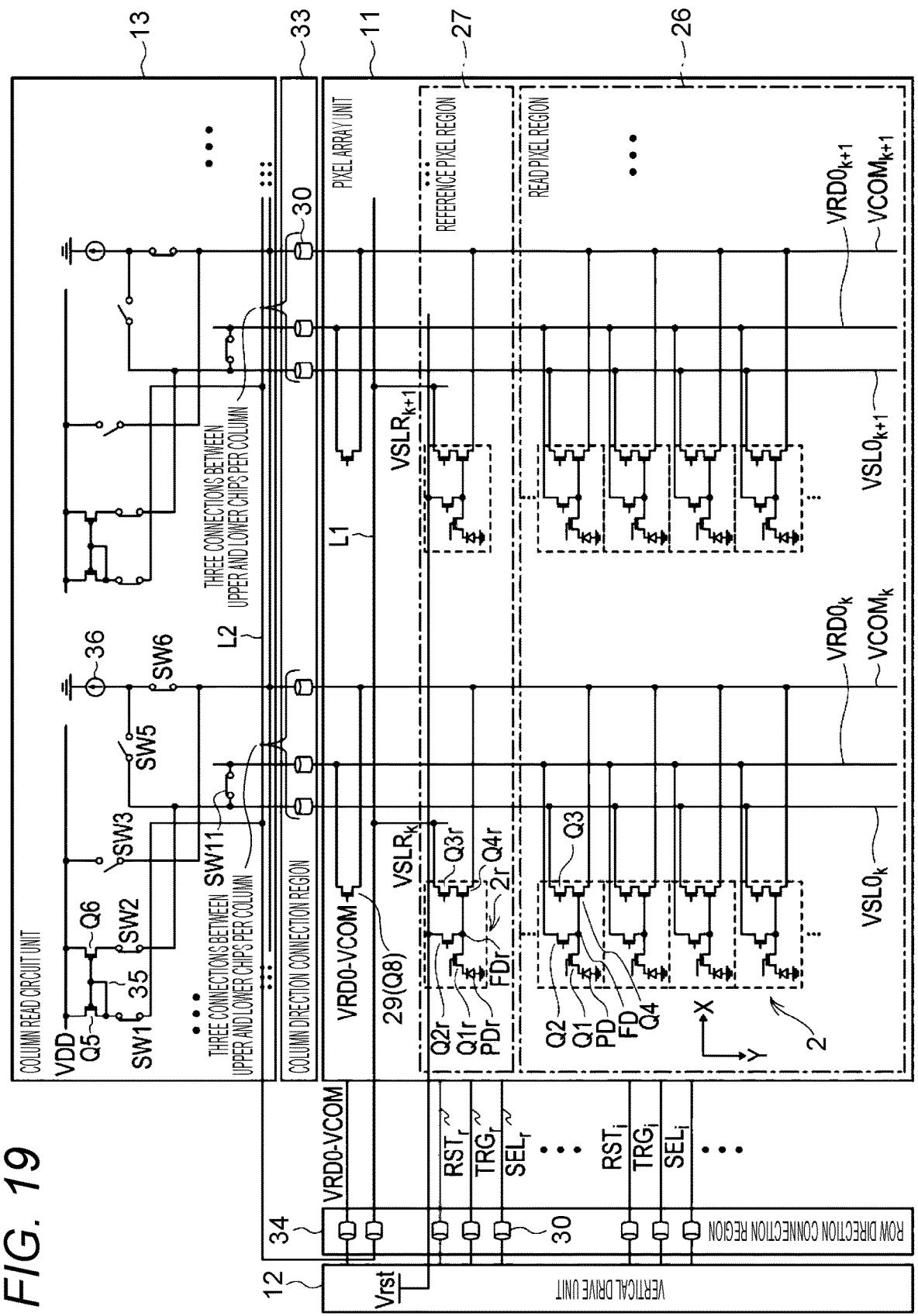
FIG. 19 is a circuit diagram illustrating a seventh circuit configuration example of the pixel array unit and the column read circuit unit.

FIG. 19 is a circuit diagram illustrating a seventh circuit configuration example of the pixel array unit 11 and the column read circuit unit 13. FIG. 19 illustrates an example of imaging pixel read in the differential amplification mode.

In the circuit in FIG. 19, the VSLR line for each pixel column in the upper chip 23 is short-circuited by the signal wiring L1 extending in the column direction, and the signal wiring L1 is connected to the bonding part 30 in the row direction connection region 34. Furthermore, the bonding part 30 connected to the signal wiring L1 is not provided in the column direction connection region 33. As a result, only one bonding part 30 for the VSLR line is provided in the row direction connection region 34, so that it is possible to reduce the number of bonding parts 30 for the VSLR line as compared with the circuit in FIG. 16.

Figure 20A:
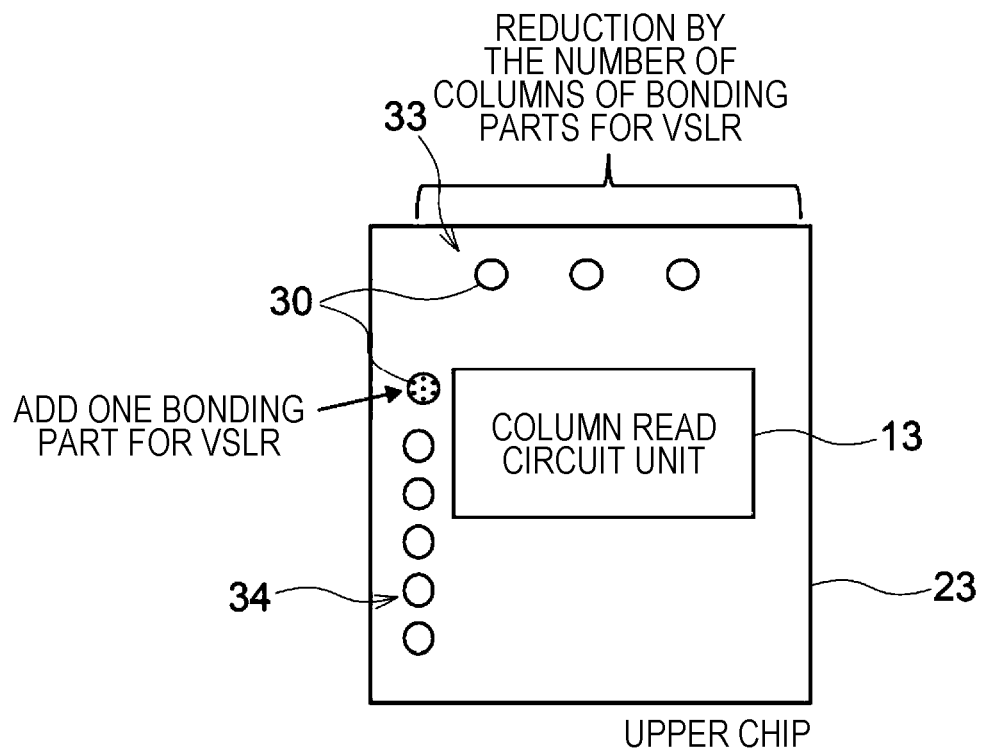
FIG. 20A is a diagram schematically illustrating a layout of bonding parts in the upper chip.
Figure 20B:
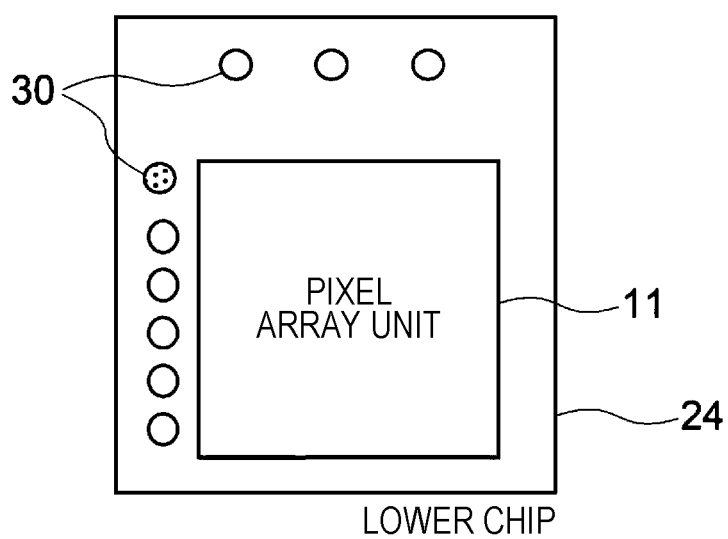
FIG. 20B is a diagram schematically illustrating a layout of bonding parts in the lower chip.

FIG. 20A is a diagram schematically illustrating a layout of the bonding parts 30 in the upper chip 23, and FIG. 20B is a diagram schematically illustrating a layout of the bonding parts 30 in the lower chip 24. As can be seen by comparing FIGS. 20A and 20B with FIGS. 17A and 17B, while the number of bonding parts 30 for each pixel column in the column direction connection region 33 can be reduced, the number of bonding parts 30 in the row direction connection region 34 is increased by one.

As described above, in the seventh circuit configuration example, instead of the bonding part 30 for the VSLR line provided for each pixel column, each VSLR line is short-circuited by the signal wiring L1 extending in the column direction, and the signal wiring L1 is connected to the bonding part 30 in the row direction connection region 34, so that it is possible to reduce the total number of bonding parts 30 for the VSLR line as compared with the sixth circuit configuration example.

(Eighth Circuit Configuration Example)

In a case where the number of pixel columns in the column direction X is large, the vertical drive unit 12 may be provided at both end sides in the column direction X. In this case, the bonding part 30 for the VSLR line may be provided at both end sides in the column direction X.

Figure 21:
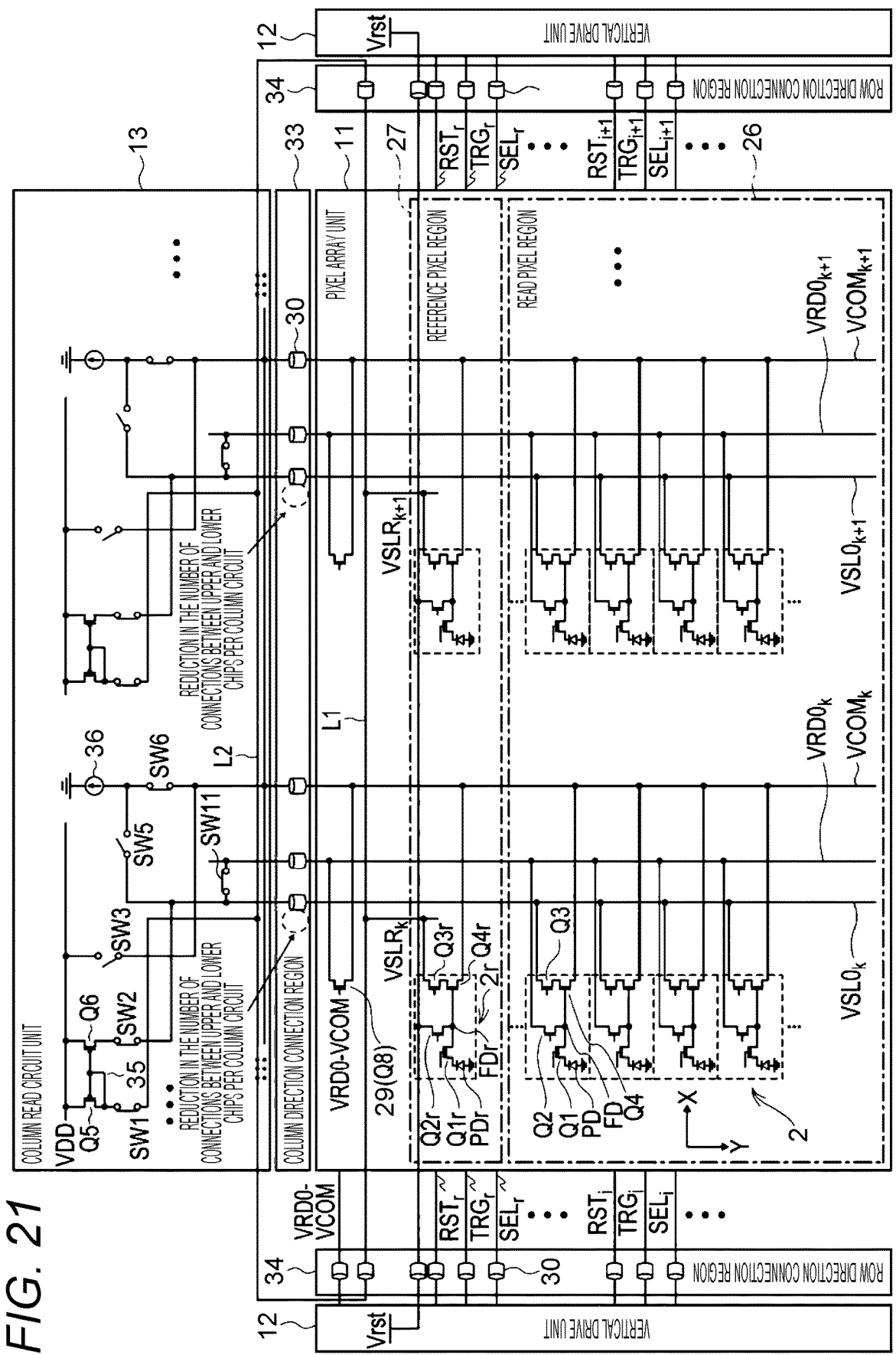
FIG. 21 is a circuit diagram illustrating an eighth circuit configuration example of the pixel array unit and the column read circuit unit.

FIG. 21 is a circuit diagram illustrating an eighth circuit configuration example of the pixel array unit 11 and the column read circuit unit 13. FIG. 21 illustrates an example of captured image read in the differential amplification mode. The solid-state imaging device 1 in FIG. 21 includes a total of two vertical drive units 12 arranged at both end sides in the column direction X. A total of two row direction connection regions 34 are provided at both end sides in the column direction X with each row direction connection region 34 associated with one of the vertical drive units 12. These two vertical drive units 12 each transmits signals to the upper chip 23 via the bonding part 30 in a corresponding row direction connection region 34. The bonding parts 30 to which the VSLR lines arranged in the column direction X in the pixel array unit 11 are connected are provided in the two row direction connection regions 34 corresponding to the two vertical drive units 12. These bonding parts 30 are bonded to corresponding bonding parts 30 in the lower chip 24. As a result, the upper chip 23 and the lower chip 24 transmit the VSLR signal via the two bonding parts 30 provided at both end sides in the column direction X.

As compared with a case where the VSLR signal is transmitted between the upper chip 23 and the lower chip 24 only at one side in the column direction X as illustrated in FIG. 19, noise immunity becomes high, and a voltage fluctuation of the signal wiring can also be reduced in a case where the VSLR signal is transmitted via the bonding parts 30 provided at both end sides in the column direction X as illustrated in FIG. 21.

Figure 22A:
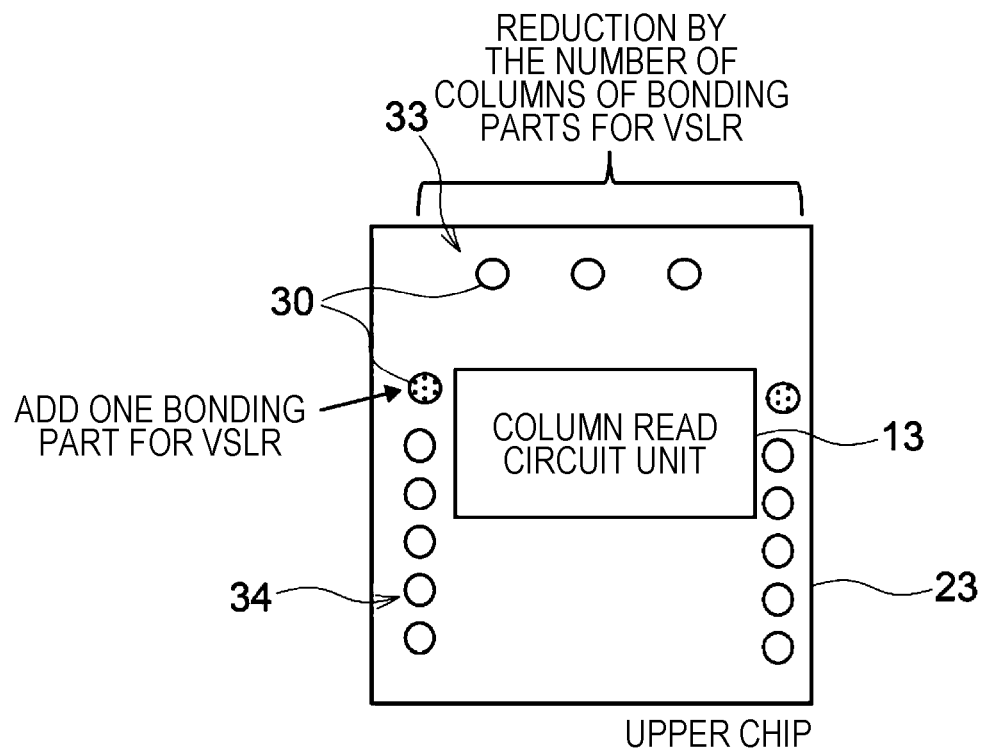
FIG. 22A is a diagram schematically illustrating a layout of bonding parts in the upper chip.
Figure 22B:
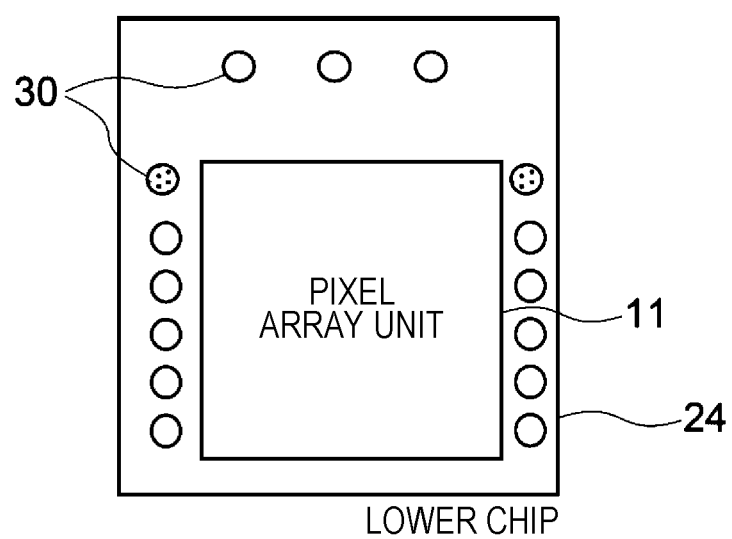
FIG. 22B is a diagram schematically illustrating a layout of bonding parts in the lower chip.

FIG. 22A is a diagram schematically illustrating a layout of the bonding parts 30 in the upper chip 23, and FIG. 22B is a diagram schematically illustrating a layout of the bonding parts 30 in the lower chip 24. As can be seen by comparing FIGS. 22A and 22B with FIGS. 20A and 20B, in the circuit in FIG. 21, since the row direction connection region 34 is provided at both end sides in the column direction X, two bonding parts 30 for the VSLR signal are newly provided. On the other hand, the number of bonding parts 30 in the column direction X is the same as in FIGS. 20A and 20B.

In the eighth circuit configuration example, the number of bonding parts 30 in the row direction Y is increased by one as compared with the seventh circuit configuration example, but the number of bonding part 30 in the column direction X can be significantly reduced in a manner similar to the seventh circuit configuration example.

(Ninth Circuit Configuration Example)

Figure 23:
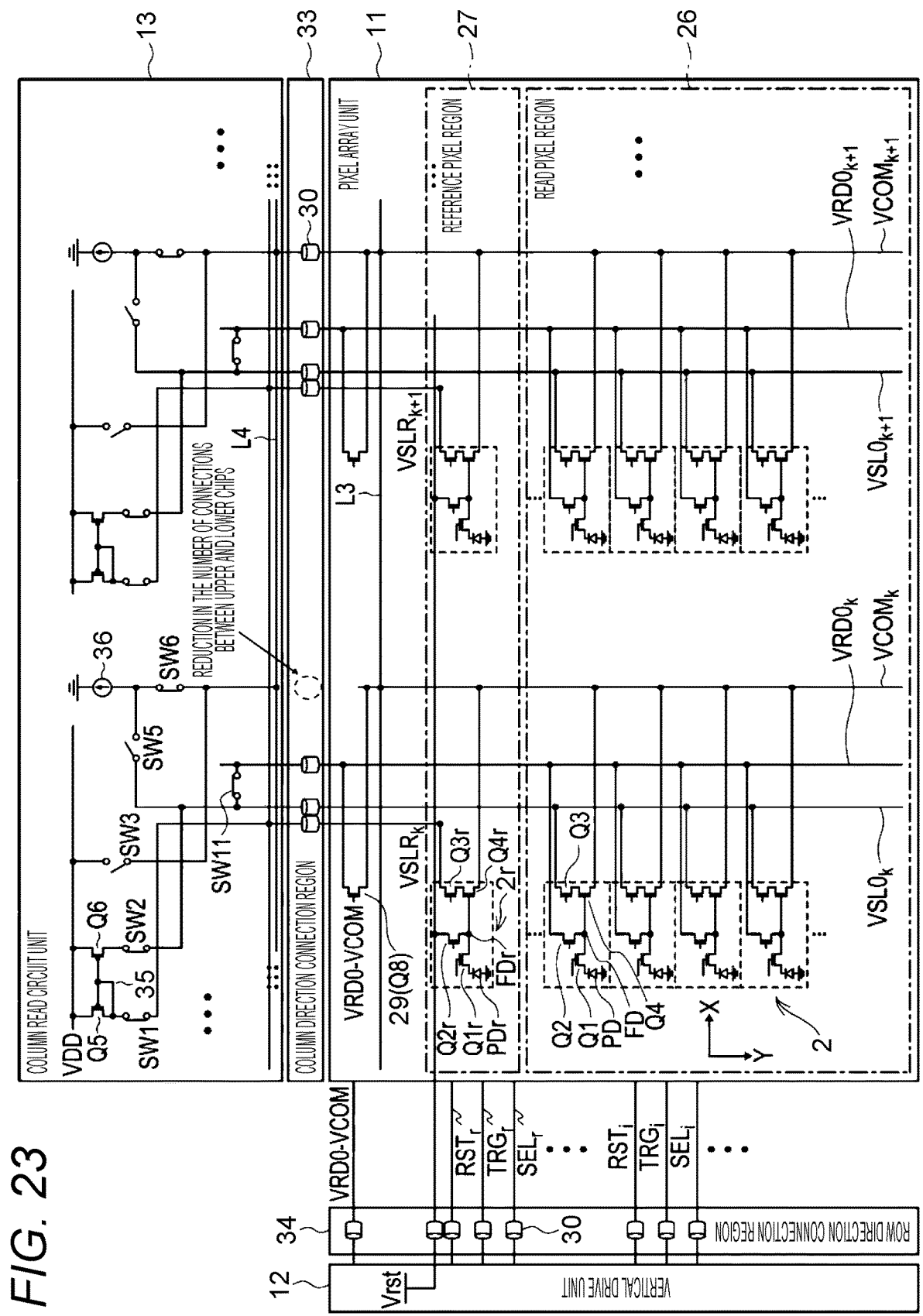
FIG. 23 is a circuit diagram illustrating a ninth circuit configuration example of the pixel array unit and the column read circuit unit.

In the upper chip 23 and the lower chip 24, a signal wiring that can be short-circuited in the column direction X is not only the VSLR line. FIG. 23 is a circuit diagram illustrating a ninth circuit configuration example of the pixel array unit 11 and the column read circuit unit 13. FIG. 23 illustrates an example of captured image read in the differential amplification mode. In the circuit in FIG. 23, the VCOM line provided for each pixel column in the upper chip 23 is short-circuited by a signal wiring L3 extending in the column direction X. On the other hand, the switches SW6 provided for each differential transistor pairs 35 in the lower chip 24 has one end short-circuited by a signal wiring L4 extending in the column direction X. In the upper chip 23, one or a plurality of bonding parts 30 for connecting the short-circuited VCOM line to the lower chip 24 is provided. The number of bonding parts 30 thus provided is smaller than the number of pixel columns, and the bonding parts 30 are thinned out by short-circuiting the VCOM line in the column direction X.

Similarly, in the lower chip 24, the bonding parts 30 connected to the short-circuited one ends of the switches SW6 are thinned out. Bonding the bonding part 30 in the upper chip 23 and a corresponding bonding part 30 in the lower chip 24 together causes the VCOM line in the upper chip 23 to connect to the one end of the switch SW6 in the lower chip 24. Although how to thin out the bonding parts 30 is determined as desired, a possible option is to provide the bonding part 30 for every predetermined number, that is two or more, of VSLR lines, for example.

Figure 24A:
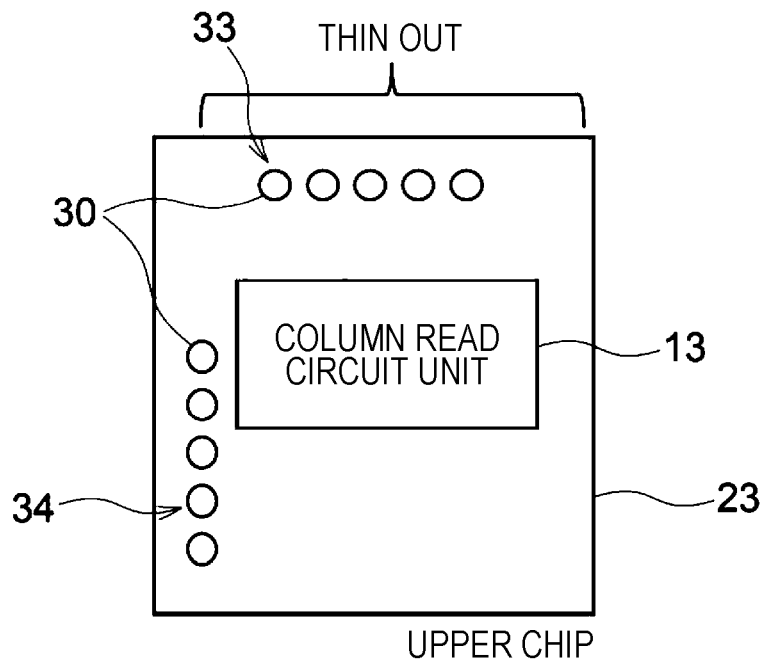
FIG. 24A is a diagram schematically illustrating a layout of bonding parts in the upper chip.
Figure 24B:
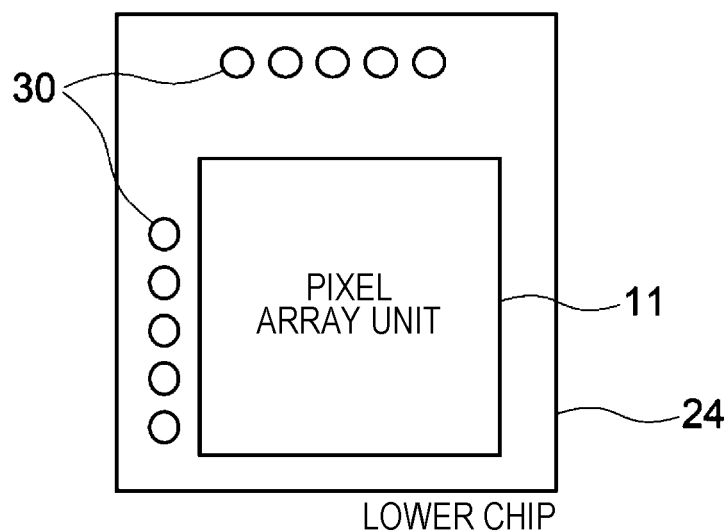
FIG. 24B is a diagram schematically illustrating a layout of bonding parts in the lower chip.

FIG. 24A is a diagram schematically illustrating a layout of the bonding parts 30 in the upper chip 23, and FIG. 24B is a diagram schematically illustrating a layout of the bonding parts 30 in the lower chip 24. In a case where the VSLR line is not short-circuited, the bonding part 30 for the VSL line is required in the column direction X for each pixel column, but in the ninth circuit configuration example, the bonding parts 30 for the VSL line in the column direction X are thinned out, so that it is possible to significantly reduce the number of bonding parts 30 in the column direction X.

(Tenth Circuit Configuration Example)

A tenth circuit configuration example is a modification of the eighth circuit configuration example, in which the VCOM signal is transmitted to the lower chip 24 via the bonding part 30 in the row direction connection region 34.

Figure 25:
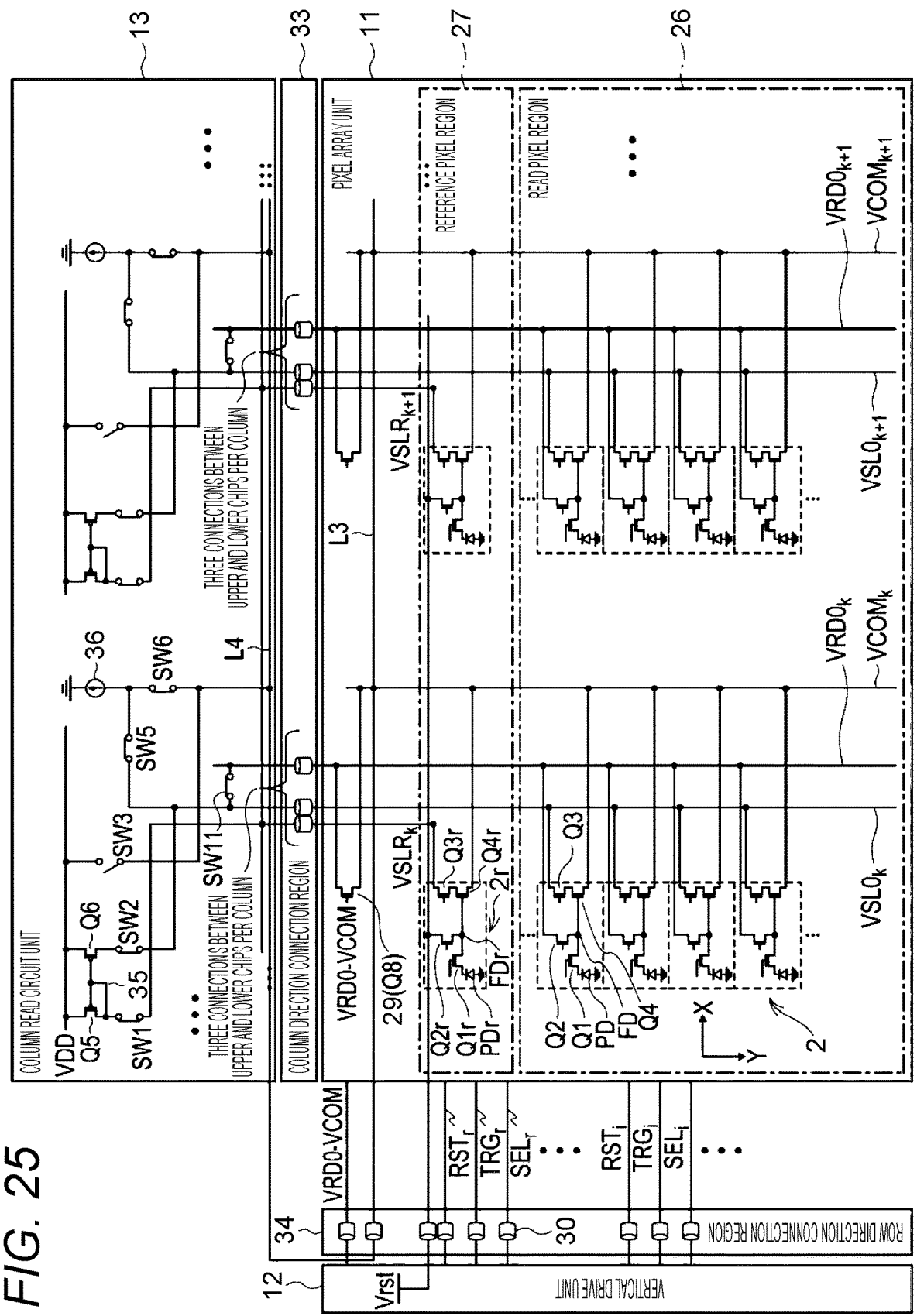
FIG. 25 is a circuit diagram illustrating a tenth circuit configuration example of the pixel array unit and the column read circuit unit.

FIG. 25 is a circuit diagram illustrating the tenth circuit configuration example of the pixel array unit 11 and the column read circuit unit 13. FIG. 25 illustrates an example of captured image read in the differential amplification mode. In the circuit in FIG. 25, the VCOM line provided for each pixel column in the upper chip 23 is short-circuited by the signal wiring L3 extending in the column direction X, and the signal wiring L3 is connected to the bonding part 30 in the row direction connection region 34.

Similarly, the switch SW6 provided for each differential transistor pair 35 in the lower chip 24 has one end short-circuited by the signal wiring L4 extending in the column direction X to connect to the bonding part 30. The bonding part 30 for the VCOM line in the upper chip 23 and the bonding part 30 connected to the one end of the switch SW6 in the lower chip 24 are bonded together in the top-to-bottom direction.

Figure 26A:
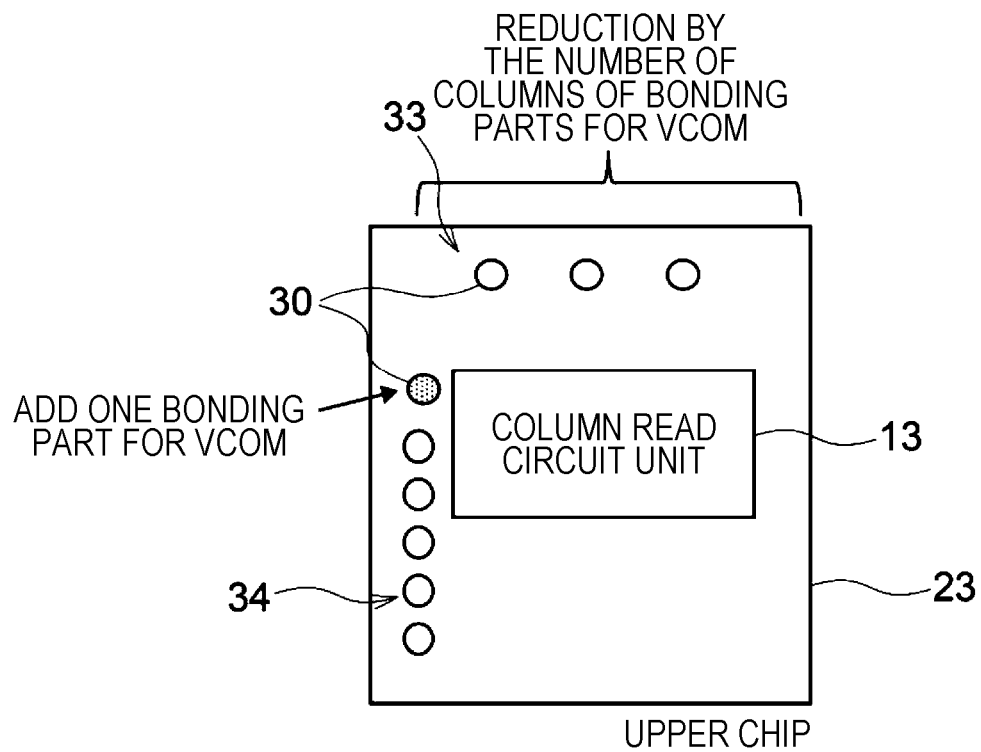
FIG. 26A is a diagram schematically illustrating a layout of bonding parts in the upper chip.
Figure 26B:
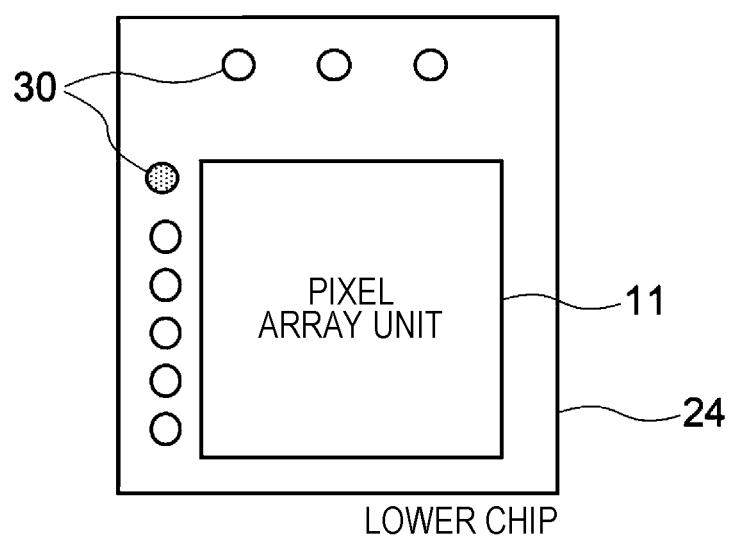
FIG. 26B is a diagram schematically illustrating a layout of bonding parts in the lower chip.

FIG. 26A is a diagram schematically illustrating a layout of the bonding parts 30 in the upper chip 23, and FIG. 26B is a diagram schematically illustrating a layout of the bonding parts 30 in the lower chip 24. As illustrated in FIGS. 26A and 26B, in the tenth circuit configuration example, the bonding part 30 for the VCOM line is not provided in the column direction X, so that it is possible to significantly reduce the number of bonding parts 30 as compared with a case where the bonding part 30 for the VCOM line is provided for each pixel column in the column direction X. Furthermore, in the tenth circuit configuration example, one bonding part 30 connected to the VCOM line is additionally provided in the row direction connection region 34. Although only one bonding part 30 is additionally provided in the row direction Y, the reduction in the number of bonding parts 30 in the column direction X is large, so that it is possible to significantly reduce the number of bonding parts 30 in total.

(Eleventh Circuit Configuration Example)

Figure 27:
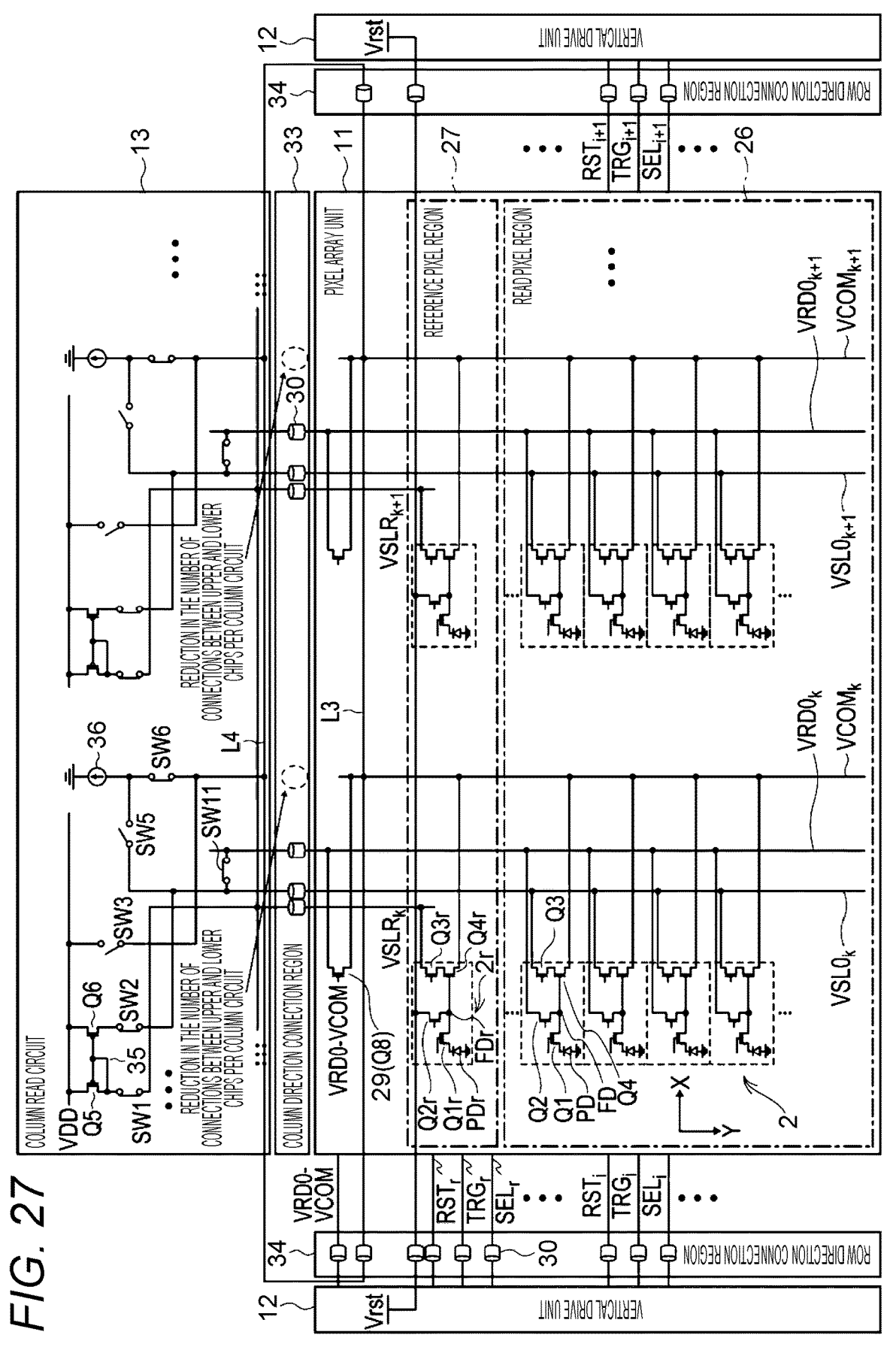

FIG. 27 is a circuit diagram illustrating an eleventh circuit configuration example of the pixel array unit 11 and the column read circuit unit 13. The circuit in FIG. 27 includes the vertical drive unit 12 and the row direction connection region 34 arranged at both end sides in the column direction X. The VCOM line provided for each pixel column in the upper chip 23 is short-circuited by the signal wiring L3 extending in the column direction X to connect to the bonding parts 30 in the row direction connection regions 34 provided at both end sides.

The switch SW6 provided for each differential transistor pair 35 in the lower chip 24 has one end short-circuited by the signal wiring L4 extending in the column direction X to connect to the bonding parts 30 provided at both end sides. The bonding part 30 in the upper chip 23 and the bonding part 30 in the lower chip 24 are bonded together in the top-to-bottom direction.

Figure 28A:
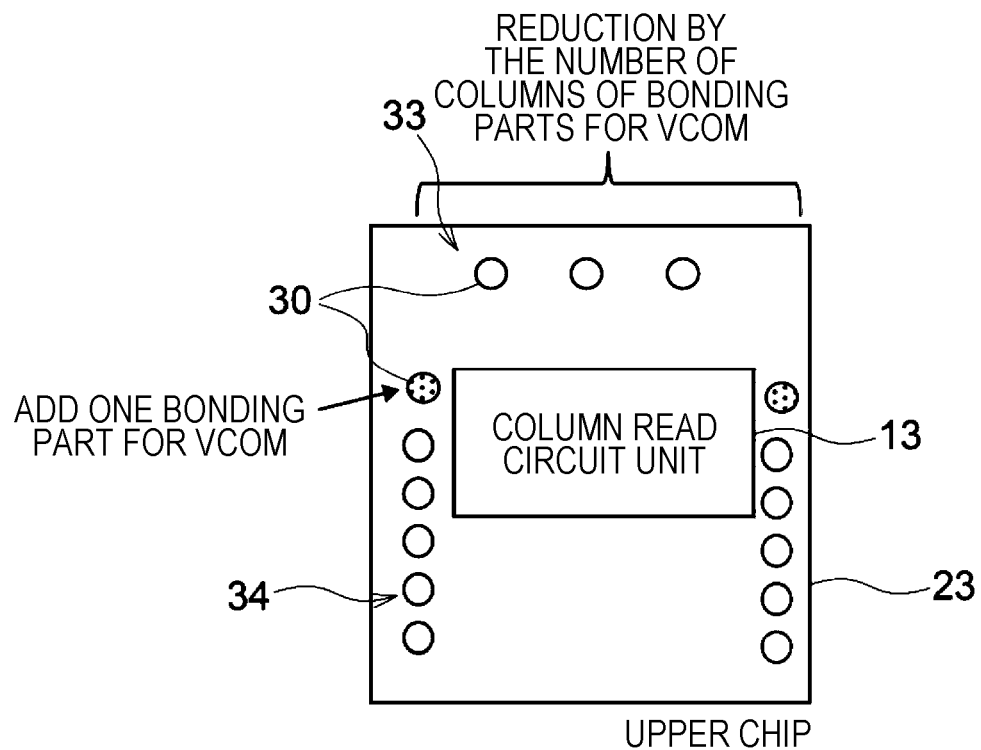
FIG. 28A is a diagram schematically illustrating a layout of bonding parts in the upper chip.
Figure 28B:
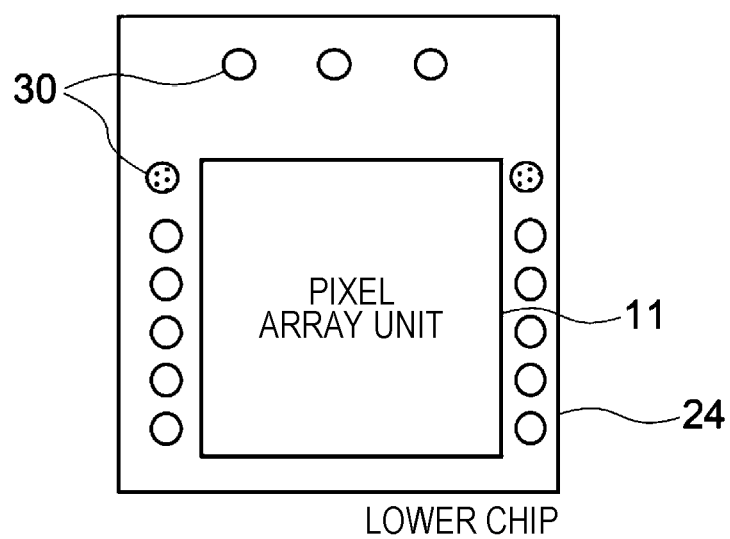
FIG. 28B is a diagram schematically illustrating a layout of bonding parts in the lower chip.

FIG. 28A is a diagram schematically illustrating a layout of the bonding parts 30 in the upper chip 23, and FIG. 28B is a diagram schematically illustrating a layout of the bonding parts 30 in the lower chip 24. As illustrated in FIGS. 28A and 28B, the bonding part 30 for the VCOM need not be provided in the column direction X, so that it is possible to significantly reduce the number of bonding parts 30 in the column direction X. Furthermore, since the bonding part 30 is provided at both end sides in the row direction Y, the number of bonding parts 30 in the row direction Y is larger than in FIGS. 26A and 26B, but the reduction in the number of bonding parts 30 in the column direction X is much larger, so that the dead space does not increase so much. Rather, providing the bonding part 30 at both end sides in the column direction X increases the effect of enhancing noise immunity and reducing a voltage fluctuation of the signal wiring.

(Twelfth Circuit Configuration Example)

A phenomenon called streaking may occur in an image captured by the solid-state imaging device 1. The streaking is a phenomenon in which, for example, in a case where an image of a bright point light source is captured in the dark, a white straight line appears to the left and right of the point light source in the captured image.

Figure 29:
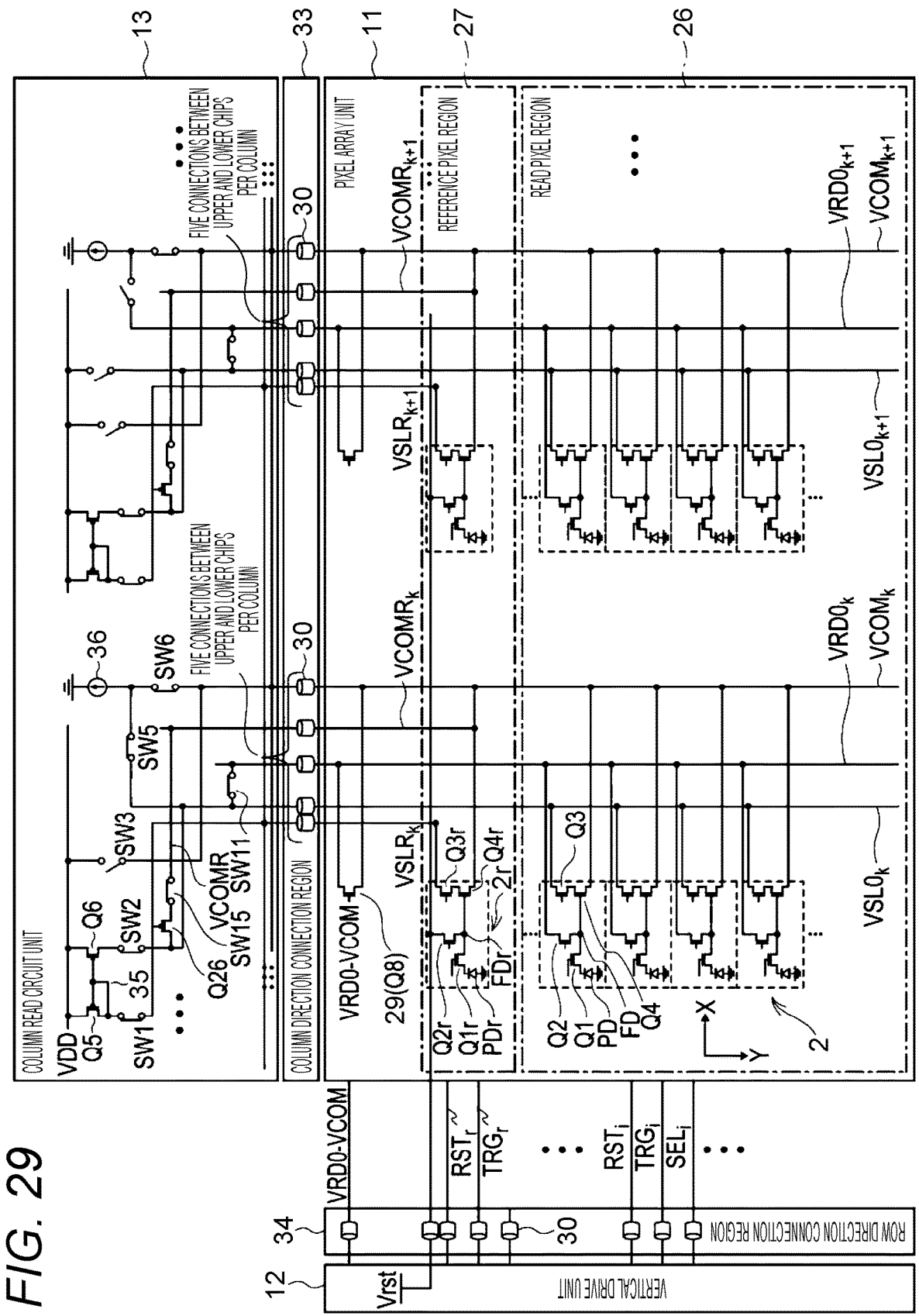
FIG. 29 is a circuit diagram illustrating an example of a countermeasure against streaking.

FIG. 29 is a circuit diagram illustrating an example of a countermeasure against streaking. In the circuit in FIG. 29, the bonding part 30 for the VCOMR line is provided in the upper chip 23 and the lower chip 24. In the upper chip 23, the VCOMR line is connected to the VCOM line. In the lower chip 24, the VCOMR line is connected to one end of the switch SW2 via a switch SW15 and a transistor Q26. In a case of the differential amplification mode, the switch SW15 is turned on. Therefore, only when the transistor Q26 is turned on, the VSLR line and the VCOM line are short-circuited via the VCOMR line. It is therefore possible to suppress streaking by periodically short-circuiting the VSLR line and the VCOM line.

In the circuit in FIG. 29, it is necessary to provide, for each pixel column, the bonding part 30 for connecting the VCOMR line in the upper chip 23 to the lower chip 24, so that it is necessary to newly provide the bonding part 30 for each pixel column in the column direction connection region 33 as compared with a case where the countermeasure against streaking is not taken.

Figure 30A:
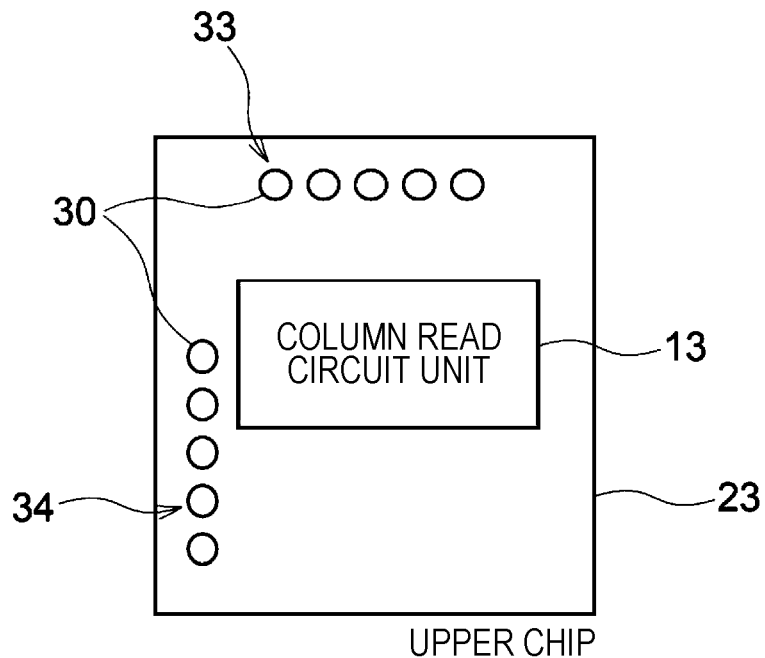
FIG. 30A is a diagram schematically illustrating a layout of bonding parts in the upper chip.
Figure 30B:
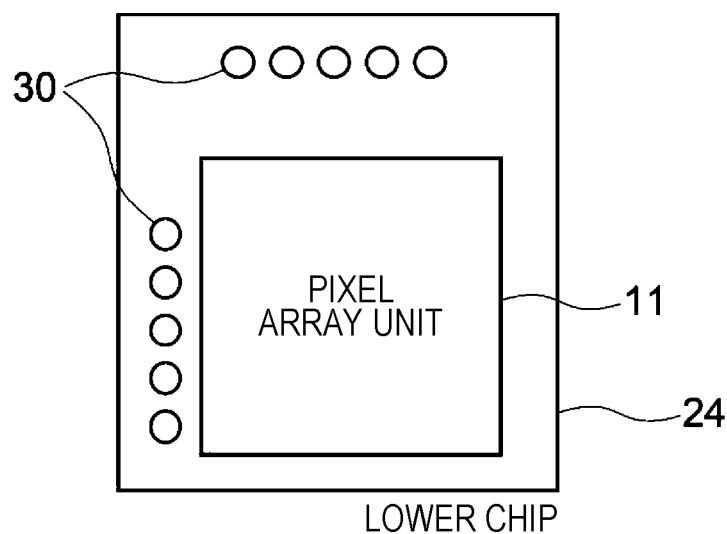
FIG. 30B is a diagram schematically illustrating a layout of bonding parts in the lower chip.

FIG. 30A is a diagram schematically illustrating a layout of the bonding parts 30 in the upper chip 23, and FIG. 30B is a diagram schematically illustrating a layout of the bonding parts 30 in the lower chip 24. In a case of the circuit in FIG. 29, the bonding part 30 for the VCOMR line is newly provided in the column direction connection region 33.

Figure 31:
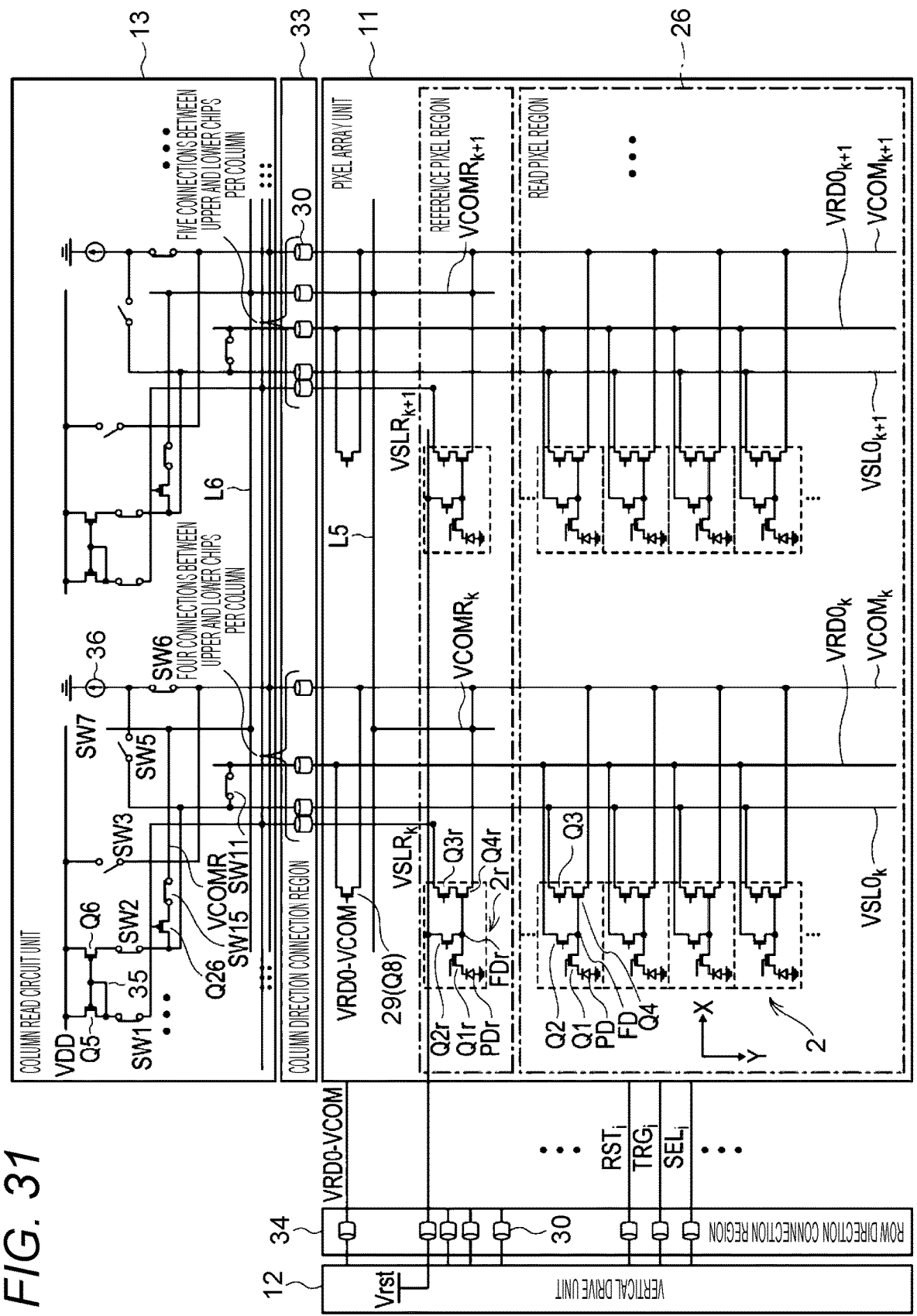
FIG. 31 is a circuit diagram illustrating a twelfth circuit configuration example of the pixel array unit and the column read circuit unit.

FIG. 31 is a circuit diagram illustrating a twelfth circuit configuration example of the pixel array unit 11 and the column read circuit unit 13. In the circuit in FIG. 31, the VCOMR line provided for each pixel column in the upper chip 23 is short-circuited by a signal wiring L5 extending in the column direction X. Similarly, the VCOMR line provided for each differential transistor pair 35 in the lower chip 24 is short-circuited by a signal wiring L6 extending in the column direction X. The bonding part 30 for connecting the VCOMR lines of the upper chip 23 and the lower chip 24 is provided at a plurality of positions in the column direction X. The bonding part 30 is provided for every plurality of VCOMR lines arranged in the column direction X, so that it is possible to reduce the number of bonding parts 30 for the VCOMR line in the column direction connection region 33.

Figure 32A:
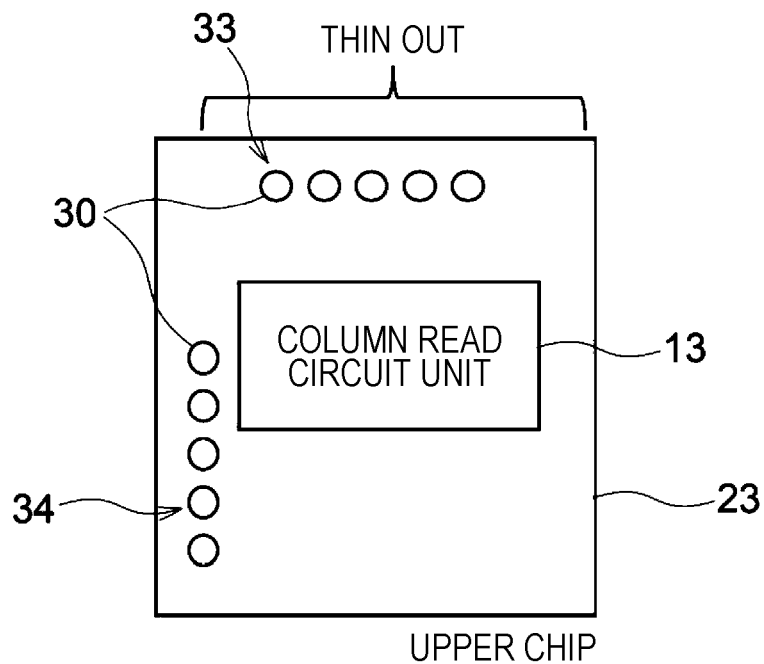
FIG. 32A is a diagram schematically illustrating a layout of bonding parts in the upper chip.
Figure 32B:
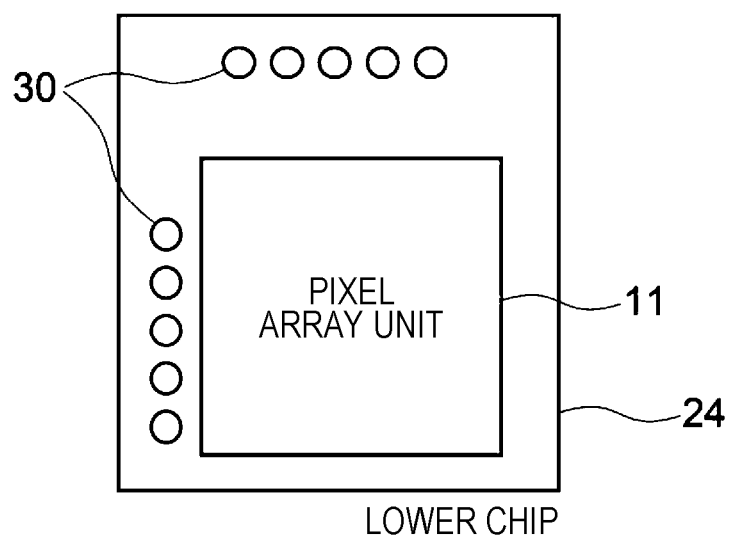
FIG. 32B is a diagram schematically illustrating a layout of bonding parts in the lower chip.

FIG. 32A is a diagram schematically illustrating a layout of the bonding parts 30 in the upper chip 23, and FIG. 32B is a diagram schematically illustrating a layout of the bonding parts 30 in the lower chip 24. Thinning out the bonding parts 30 for the VCOMR line allows a reduction in the number of bonding parts 30 provided in the column direction connection region 33 as compared with FIGS. 30A and 30B.

(Thirteenth Circuit Configuration Example)

Figure 33:
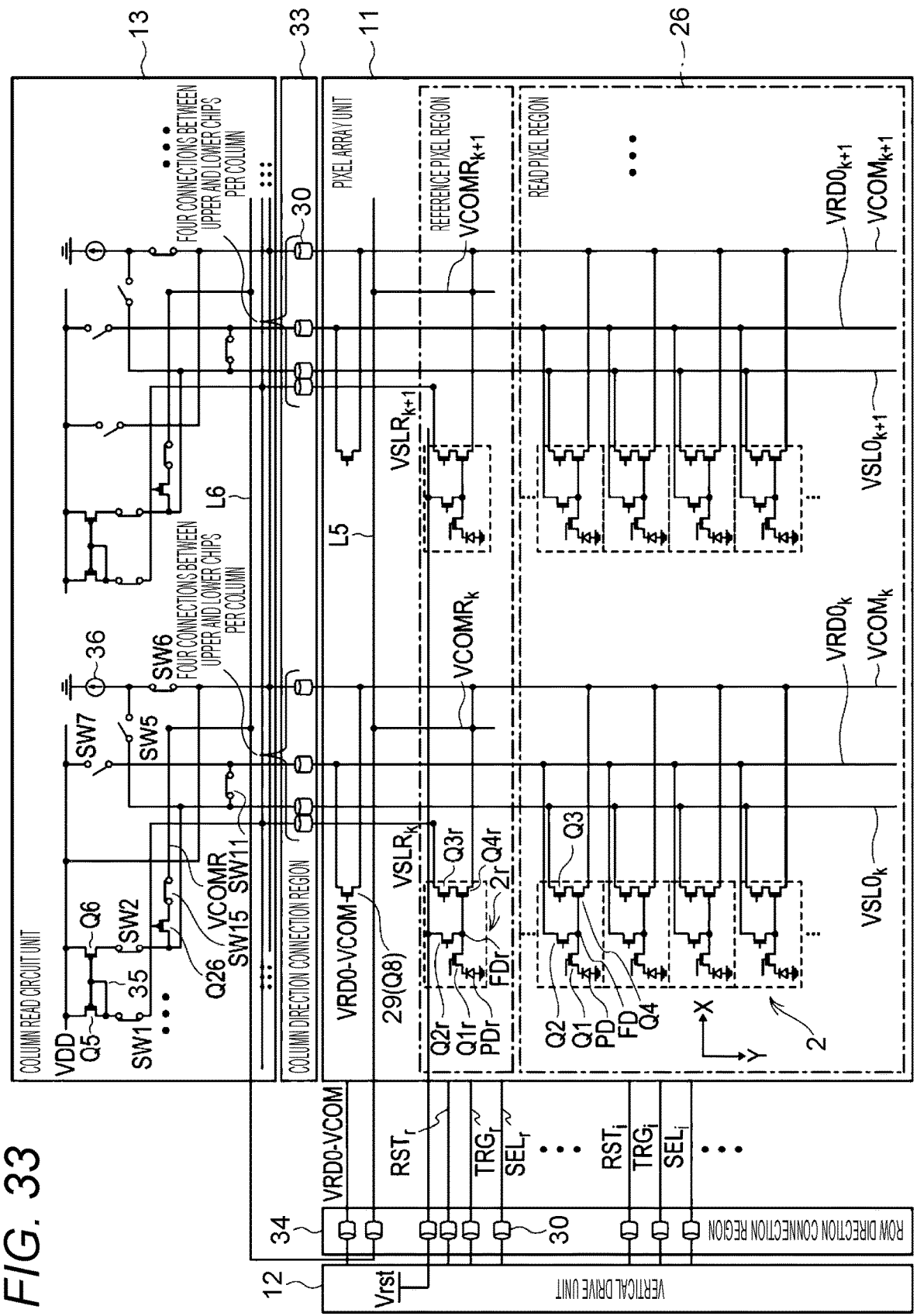
FIG. 33 is a circuit diagram illustrating a thirteenth circuit configuration example of the pixel array unit and the column read circuit unit.
Figure 34A:
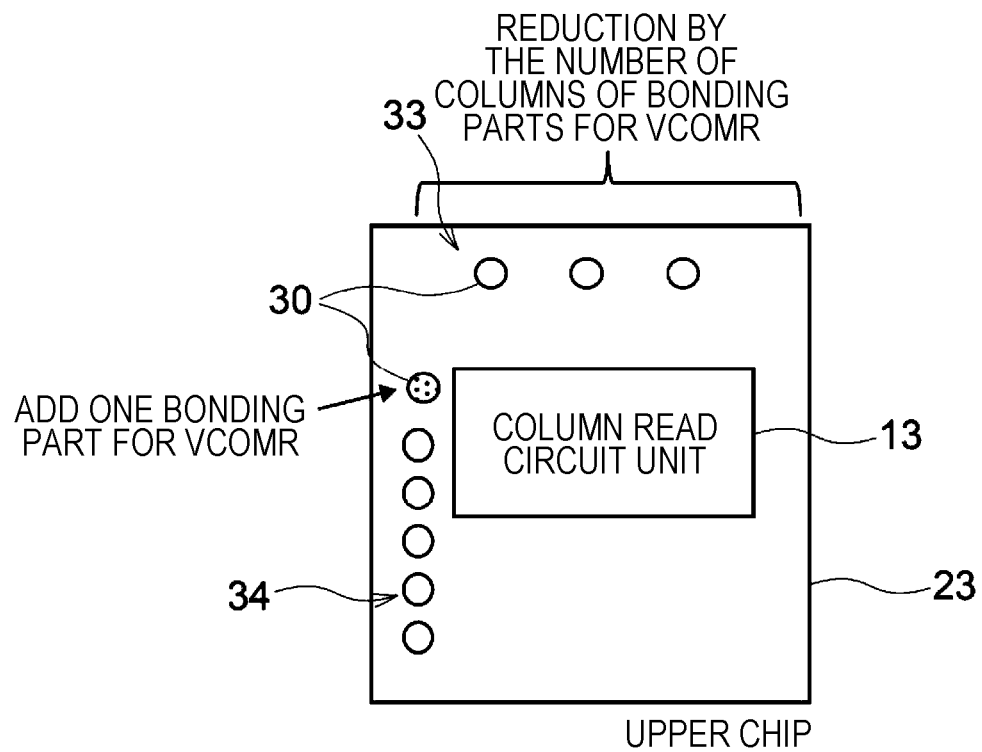
FIG. 34A is a diagram schematically illustrating a layout of bonding parts in the upper chip.
Figure 34B:
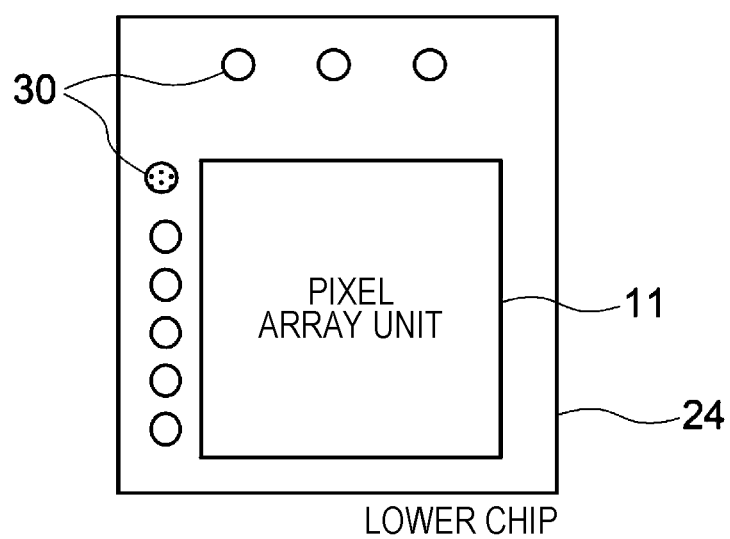
FIG. 34B is a diagram schematically illustrating a layout of bonding parts in the lower chip.

FIG. 33 is a circuit diagram illustrating a thirteenth circuit configuration example of the pixel array unit 11 and the column read circuit unit 13. Furthermore, FIG. 34A is a diagram schematically illustrating a layout of the bonding parts 30 in the upper chip 23, and FIG. 34B is a diagram schematically illustrating a layout of the bonding parts 30 in the lower chip 24.

In the circuit in FIG. 33, the VCOMR line provided for each pixel column in the upper chip 23 is short-circuited by the signal wiring L5 extending in the column direction X, and the signal wiring L5 is connected to the bonding part 30 in the row direction connection region 34. Furthermore, the VCOMR lines in the lower chip 24 are short-circuited by the signal wiring L6 extending in the column direction X, and the signal wiring L6 is connected to the bonding part 30. Bonding the bonding parts 30 together in the top-to-bottom direction allows the VCOMR line of the upper chip 23 and the VCOMR line of the lower chip 24 to connect to each other.

The circuit in FIG. 33 eliminates the need of providing the bonding part 30 for the VCOMR line in the column direction X, so that it is possible to significantly reduce the number of bonding parts 30 in the column direction X. Furthermore, only one bonding part 30 for the VCOMR line is additionally provided in the row direction Y, but a problem such as a reduction in dead space does not occur.

(Fourteenth Circuit Configuration Example)

Figure 35:
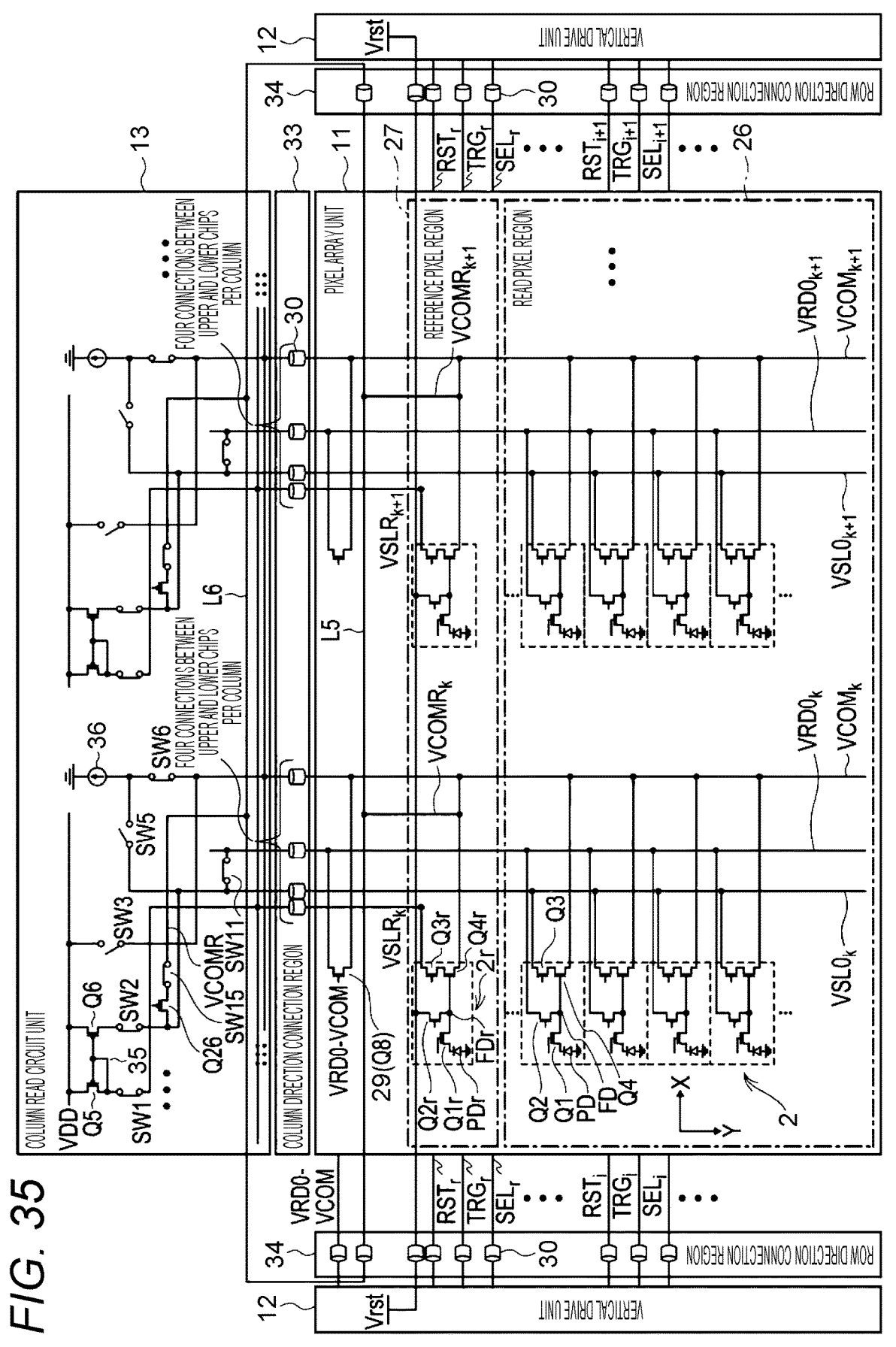
Figure 36A:
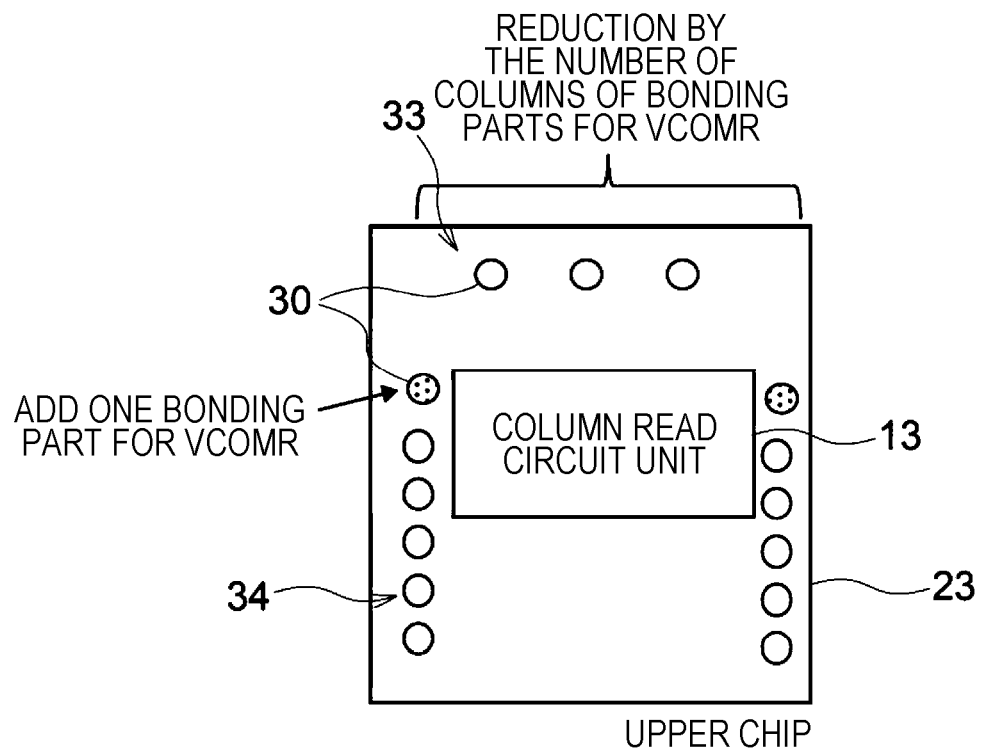
FIG. 36A is a diagram schematically illustrating a layout of bonding parts in the upper chip.
Figure 36B:
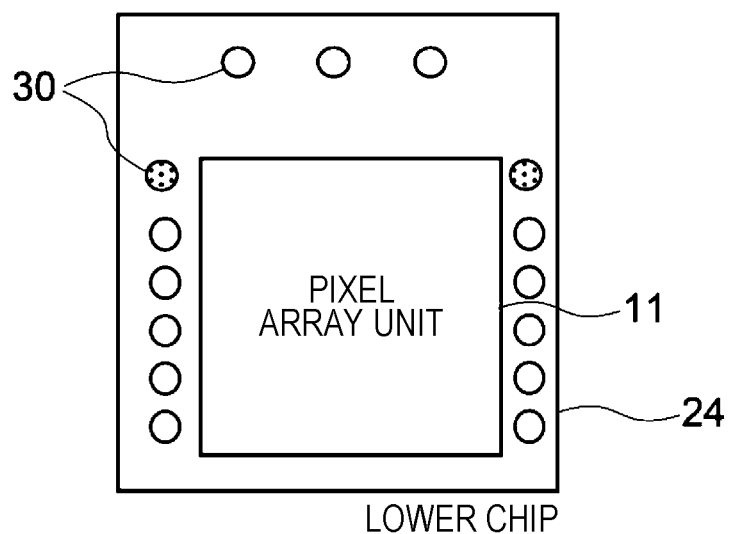
FIG. 36B is a diagram schematically illustrating a layout of bonding parts in the lower chip.

FIG. 35 is a circuit diagram illustrating a fourteenth circuit configuration example of the pixel array unit 11 and the column read circuit unit 13. Furthermore, FIG. 36A is a diagram schematically illustrating a layout of the bonding parts 30 in the upper chip 23, and FIG. 36B is a diagram schematically illustrating a layout of the bonding parts 30 in the lower chip 24.

The circuit in FIG. 35 includes the row direction connection regions 34 provided at both end sides in the column direction X of the pixel array unit 11 in the upper chip 23. The VCOMR line provided for each pixel column is short-circuited by the signal wiring L5 extending in the column direction X. This signal wiring is connected to the bonding parts 30 in the row direction connection regions 34 provided at both end sides in the column direction X.

Furthermore, the VCOMR wirings in the lower chip 24 are also short-circuited by the signal wiring L6 extending in the column direction X to connect to the bonding parts 30 provided at both end sides. The VCOMR line of the upper chip 23 and the VCOMR line of the lower chip 24 are connected at the two bonding parts 30 provided at both end sides in the column direction X.

As described above, the upper chip 23 and the lower chip 24 are bonded together via the bonding parts 30. Examples of a specific bonding form of the bonding parts 30 include Cu—Cu bonding, a via, a bump, and the like.

(Fifteenth Circuit Configuration Example)

In the first to fourteenth circuit configuration examples described above, the VRD line is arranged in the pixel array unit 11, but the VRD line is not necessarily required.

Figure 37:
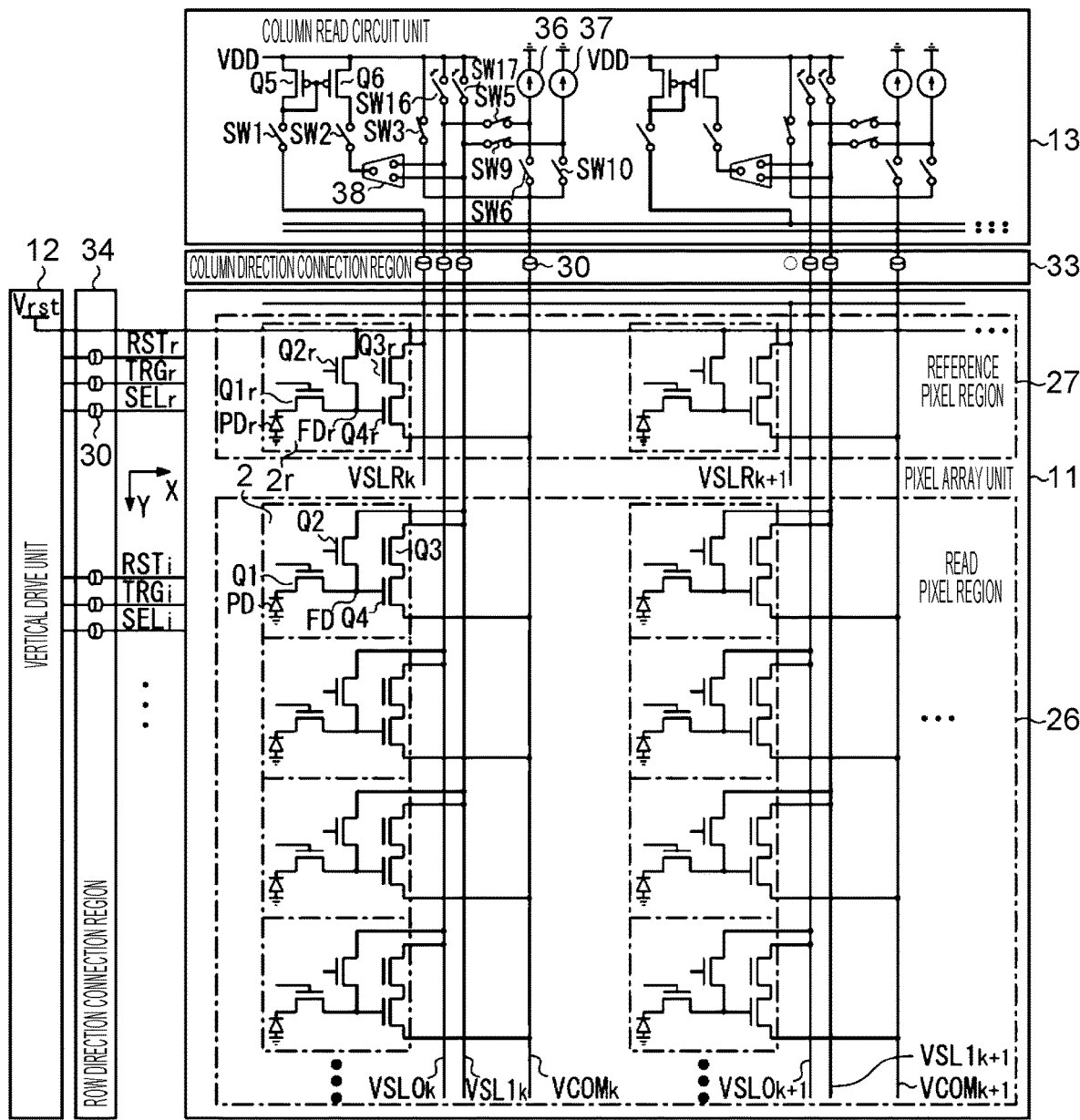
FIG. 37 is a circuit diagram of a source follower mode of a fifteenth circuit configuration example.
Figure 38:
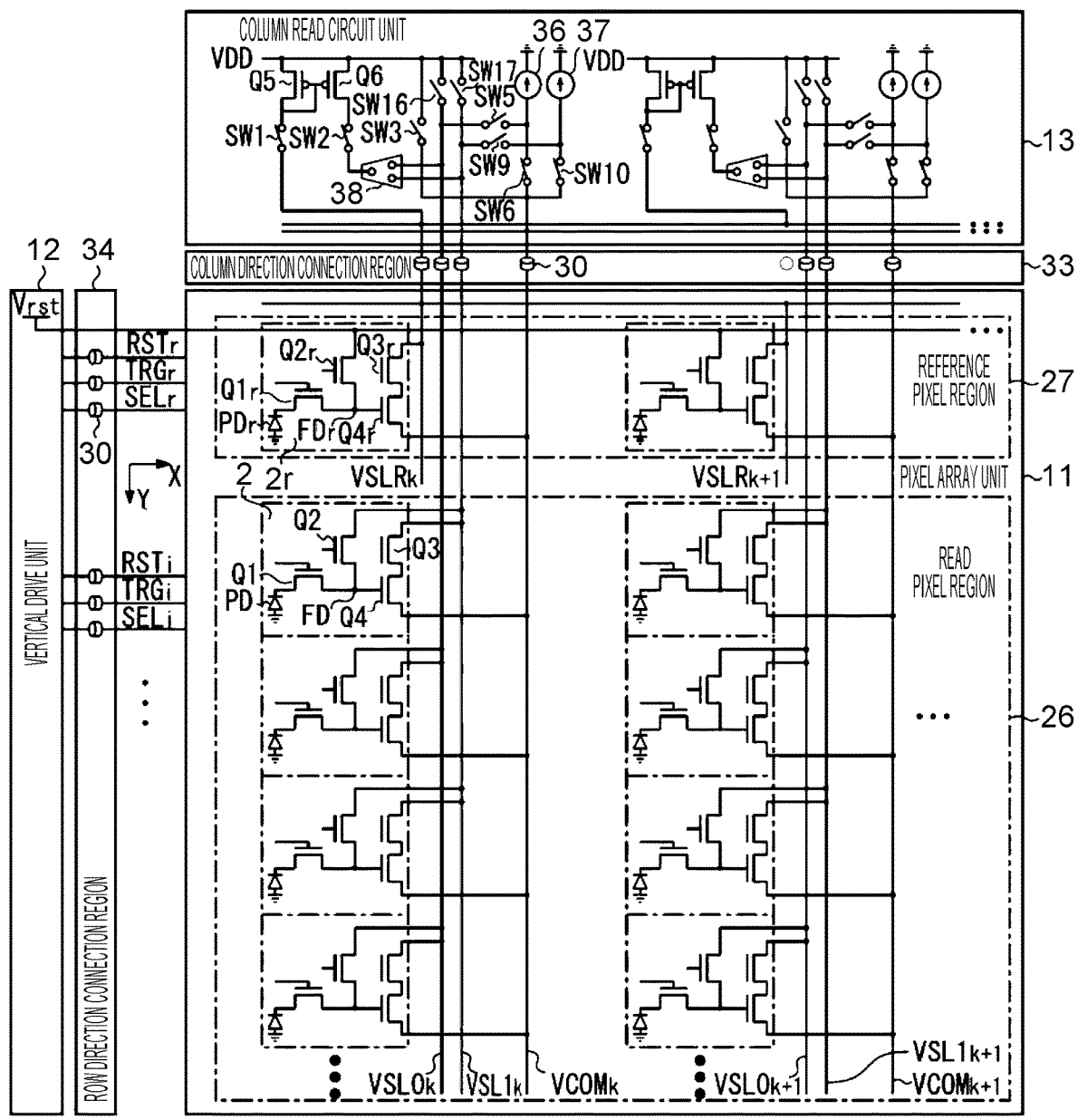
FIG. 38 is a circuit diagram of a differential amplification mode of the fifteenth circuit configuration example.

FIGS. 37 and 38 are circuit diagrams illustrating a fifteenth circuit configuration example of the pixel array unit 11 and the column read circuit unit 13. FIG. 37 illustrates switch switching states in a case where the source follower mode is selected, and FIG. 38 illustrates switch switching states in a case where the differential amplification mode is selected. Hereinafter, differences from the fifth circuit configuration example in FIG. 13 will be mainly described.

The pixel array unit 11 in FIGS. 37 and 38 includes two VSL lines (VSL0 and VSL1) in a manner similar to the pixel array unit 11 in FIG. 13, and pixels arranged in the row direction Y are alternately connected to one of the two VSL lines. Note that the number of VSL lines is determined as desired.

The pixel array unit 11 in FIGS. 37 and 38 does not include the VRD line that is provided in the pixel array unit 11 in FIG. 13. Therefore, the total number of vertical wirings extending in the row direction Y in the pixel array unit 11 in FIGS. 37 and 38 is smaller than the total number of vertical wirings in the pixel array unit 11 in FIG. 13. Furthermore, since the VRD line is not provided, the transistors Q21 to Q24 in the pixel array unit 11 in FIG. 13 need not be provided. It is therefore possible to make the circuit configuration in the pixel array unit 11 simple.

In the pixel array unit 11 in FIGS. 37 and 38, the drain of the reset transistor Q2 in the pixel 2 is connected to the VSL1 line.

In the column read circuit unit 13 in FIGS. 37 and 38, a VSL selector 38 is provided instead of the transistor Q25 and the switch SW7 in the column read circuit 13 in FIG. 13. The VSL selector 38 selects either the VSL0 line or the VSL1 line from the pixel array unit 11. When the switch SW2 is turned on, a selected output node of the VSL selector 38 is connected to the source of the transistor Q6.

Furthermore, switches SW16 and SW17 are connected to paths extending to the VSL0 line and the VSL1 line, respectively. The switch SW16 switches whether or not to set the VSL0 line at the power supply voltage VDD. The switch SW17 switches whether or not to set the VSL1 line at the power supply voltage VDD. In a case where the source follower mode is selected, the switches SW16 and SW17 are turned on when the FD is reset to set the VSL0 line and the VSL1 line at the power supply voltage VDD.

The circuit operation of the fifteenth circuit configuration example is similar to the circuit operation in FIG. 13. In a case where the source follower mode is selected, the switch SW3 is turned on as illustrated in FIG. 37, so that the VCOM line is set at the power supply voltage. Furthermore, as described above, the VSL0 line and the VSL1 line are set at the power supply voltage VDD when the FD is reset.

In a case where the differential amplification mode is selected, the switches SW6 and SW10 are turned on as illustrated in FIG. 38, so that the VCOM line is connected to the current sources 36 and 37. Furthermore, the switch SW2 is turned on, so that one of the VSL0 line or the VSL1 line is connected to the source of the transistor Q6 via the VSL selector 38 and the switch SW2. The VSL selector 38 selects the VSL1 line in a case where imaged data of pixels 2 in the odd-numbered rows is read, and selects the VSL0 line in a case where imaged data of pixels 2 in the even-numbered rows is read.

In the pixel array unit 11 and the column read circuit unit 13 illustrated in FIGS. 37 and 38, similarly to the sixth circuit configuration example in FIG. 16 and the like, it is possible to thin out at least one of the plurality of VSLR lines or the plurality of VCOM lines arranged in the column direction X. FIGS. 37 and 38 illustrate an example where the VSLR lines are thinned out.

As described above, in the fifteenth circuit configuration example illustrated in FIGS. 37 and 38, there is no VRD line as compared with the fifth circuit configuration example in FIG. 13, so that it is possible to reduce the number of vertical wiring extending in the row direction Y. Furthermore, the transistors Q21 to Q24 for reducing the number of vertical wirings in the pixel array unit 11 need not be provided, so that it is possible to make the circuit configuration of the pixel array unit 11 simple.

(Sixteenth Circuit Configuration Example)

A sixteenth circuit configuration example corresponds to a configuration obtained by increasing the number of reset transistors in the pixel 2 as compared with the fifteenth circuit configuration example.

Figure 39:
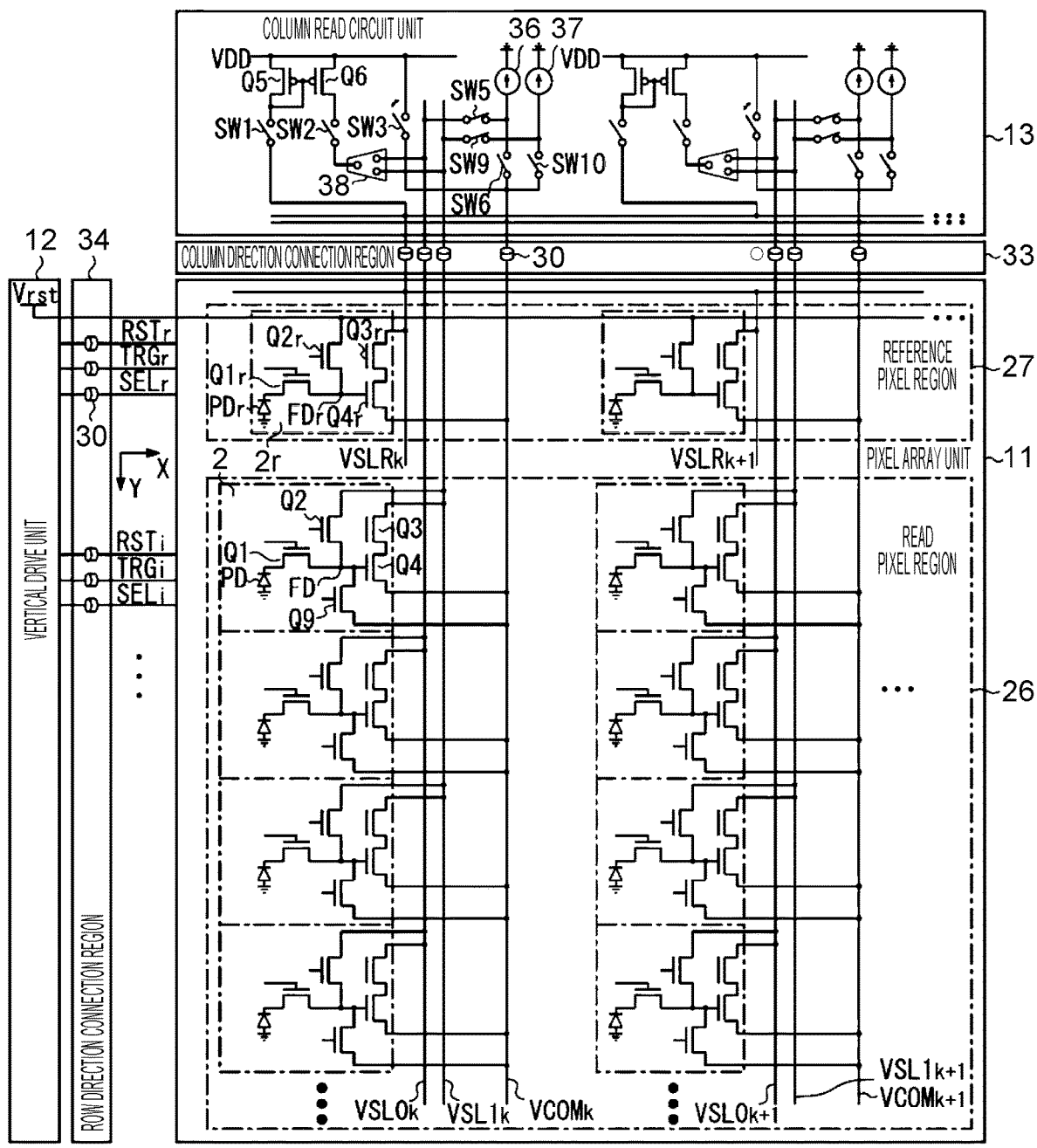
FIG. 39 is a circuit diagram of a source follower mode of a sixteenth circuit configuration example.
Figure 40:
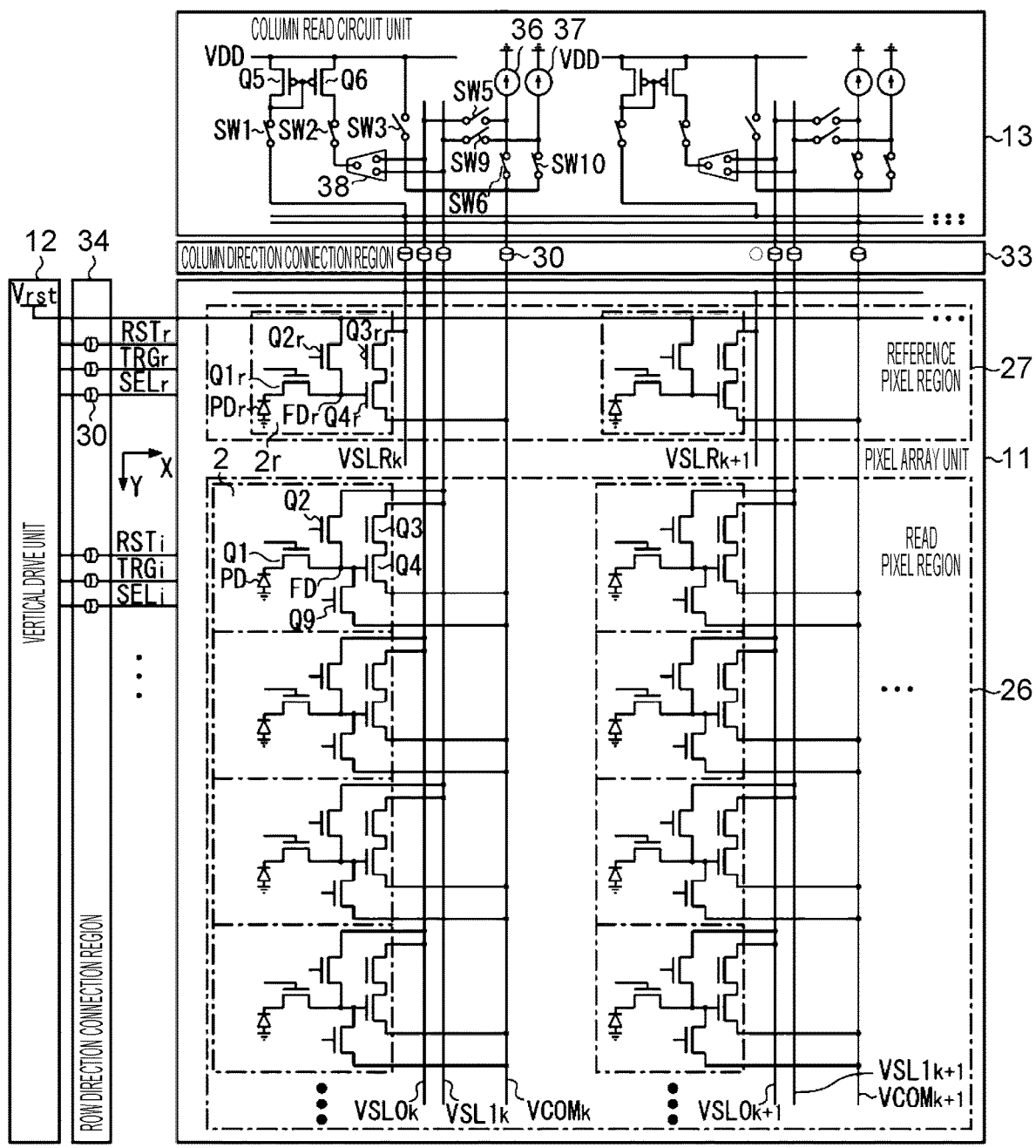
FIG. 40 is a circuit diagram of a differential amplification mode of the sixteenth circuit configuration example.

FIGS. 39 and 40 are circuit diagrams illustrating the sixteenth circuit configuration example of the pixel array unit 11 and the column read circuit unit 13. FIG. 39 illustrates switch switching states in a case where the source follower mode is selected, and FIG. 40 illustrates switch switching states in a case where the differential amplification mode is selected. Hereinafter, differences from FIGS. 37 and 38 will be mainly described.

The sixteenth circuit configuration example in FIGS. 39 and 40 is the same as the fifteenth circuit configuration example in FIGS. 37 and 38 in that the number of vertical wirings extending in the row direction Y can be reduced because the VRD line can be omitted.

The pixel array unit 11 in FIGS. 39 and 40 includes a new reset transistor Q9 in the pixel 2. The reset transistor Q9 is disposed between the FD and the VCOM line.

In the column read circuit unit 13 in FIG. 37, the switches SW16 and SW17 are turned on to reset the FD when the source follower mode is selected; however, in FIG. 39, the FD can be short-circuited to the VCOM line by the newly provided reset transistor Q9 in the pixel 2, so that it is possible to quickly set the FD at the power supply voltage VDD by turning on the reset transistor Q9 when the source follower mode is selected. This eliminates the need of the switches SW16 and SW17 in FIG. 37.

Furthermore, in the sixteenth circuit configuration example in FIGS. 39 and 40, similarly to the fifteenth circuit configuration example in FIGS. 37 and 38, it is possible to thin out at least either the plurality of VSLR lines or the plurality of VCOM lines arranged in the column direction X.

As described above, in the sixteenth circuit configuration example in FIGS. 39 and 40, it is possible to reduce the number of vertical wirings extending in the row direction Y as compared with the fifth circuit configuration example in FIG. 13. Furthermore, the new reset transistor Q9 is provided in the pixel 2 so as to allow the FD and the VCOM line to be short-circuited, so that it is possible to reduce a P-phase settling time.

(Bonding Form of Upper Chip 23 and Lower Chip 24)

Figure 41:
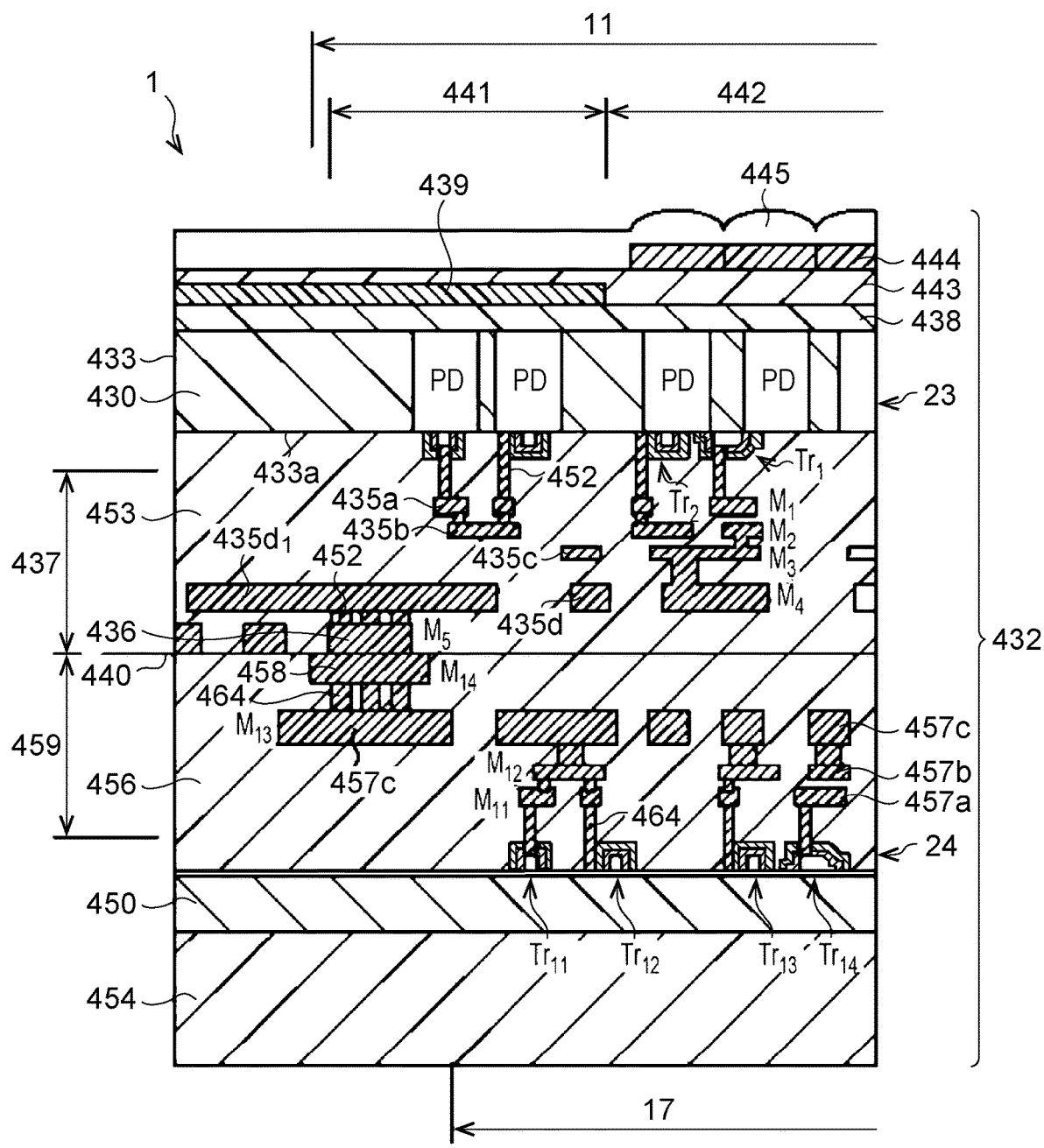
FIG. 41 is a cross-sectional view of a solid-state imaging device 1 in which the upper chip having the pixel array unit formed therein and the lower chip having a signal processing unit formed therein are bonded together.

FIG. 41 is a cross-sectional view of the solid-state imaging device 1 in which the upper chip 23 having the pixel array unit 11 formed therein and the lower chip 24 having the signal processing unit 17 formed therein are bonded together. In the upper chip 23, a semiconductor well region 430 is formed in a first semiconductor substrate 433 including thinned silicon, and the pixel array unit 11 in which a plurality of pixels 2 including a PD serving as a photoelectric conversion unit and a plurality of pixel transistors Tr1 and Tr2 is two-dimensionally arranged in a row is formed in the semiconductor well region 430. The PD is formed in an effective pixel array 442 and an optical black region 441 constituting the pixel array unit 11. On a front surface 433a side of the first semiconductor substrate 433, a multilayer wiring layer 437 in which connecting wirings 435 (435a to 435d) and 436 of a plurality of, in this example, five layers, of metals M1 to M5 are arranged is formed with an interlayer insulating film 453 interposed therebetween. As the connecting wirings 435 and 436, a copper (Cu) wiring formed by dual damascene is used. On a back surface side of the first semiconductor substrate 433, a light shielding film 439 is formed to cover the optical black region 441 with an insulating film 438 interposed therebetween, and a color filter 444 and a lens array 445 are further formed on the effective pixel array 442 with a planarizing film 443 interposed therebetween. The lens array 445 can also be formed on the optical black region 441.

In the multilayer wiring layer 437 of the upper chip 23, a pixel transistor and the wirings 435 corresponding to each other, and the wirings 435 of upper and lower layers adjacent to each other are connected via a conductive via 452. Moreover, the connecting wiring 436 of the metal M5 of the fifth layer is formed facing a bonding surface 440 with the lower chip 24. The connecting wiring 436 is connected to a required wiring 435dl of the metal M4 of the fourth layer via the conductive via 452.

In the lower chip 24, a semiconductor well region 450 is formed in a second semiconductor substrate 454 including silicon, and the signal processing unit 17 serving as a peripheral circuit is formed in the semiconductor well region 450. The signal processing unit 17 includes a plurality of MOS transistors Tr11 to Tr14 including CMOS transistors. On a front surface side of the second semiconductor substrate 454 illustrated in FIG. 31, a multilayer wiring layer 459 in which wirings 457 (457a to 457c) and 458 of a plurality of, in this example, four layers, of metals M11 to M14 are arranged is formed with an interlayer insulating film 456 interposed therebetween. As the wirings 457 and 458, a copper (Cu) wiring formed by dual damascene is used.

In the multilayer wiring layer 459 of the lower chip 24, the MOS transistors Tr11 to Tr14 and the wirings 457, and the wirings 457 of upper and lower layers adjacent to each other are connected via a conductive via 464. Moreover, the connecting wiring 458 of the metal M14 of the fourth layer is formed facing the bonding surface 440 with the upper chip 23. The connecting wiring 458 is connected to a required wiring 457c of the metal M13 of the third layer via the conductive via 464.

The upper chip 23 and the lower chip 24 are electrically connected by directly bonding the connecting wirings 436 and 458 facing the bonding surface 440 together such that their respective multilayer wiring layers 437 and 459 face each other. The direct bonding between the connecting wirings 436 and 458 with the Cu wiring is made by thermal diffusion bonding. Furthermore, alternatively, a method in which an insulating thin film (not illustrated) is formed on the surfaces of the multilayer wiring layers 437 and 459, and bonding is made by plasma bonding or the like may be employed. The direct bonding between the connecting wirings 436 and 458 with the Cu wiring is Cu—Cu bonding.

Figure 42:
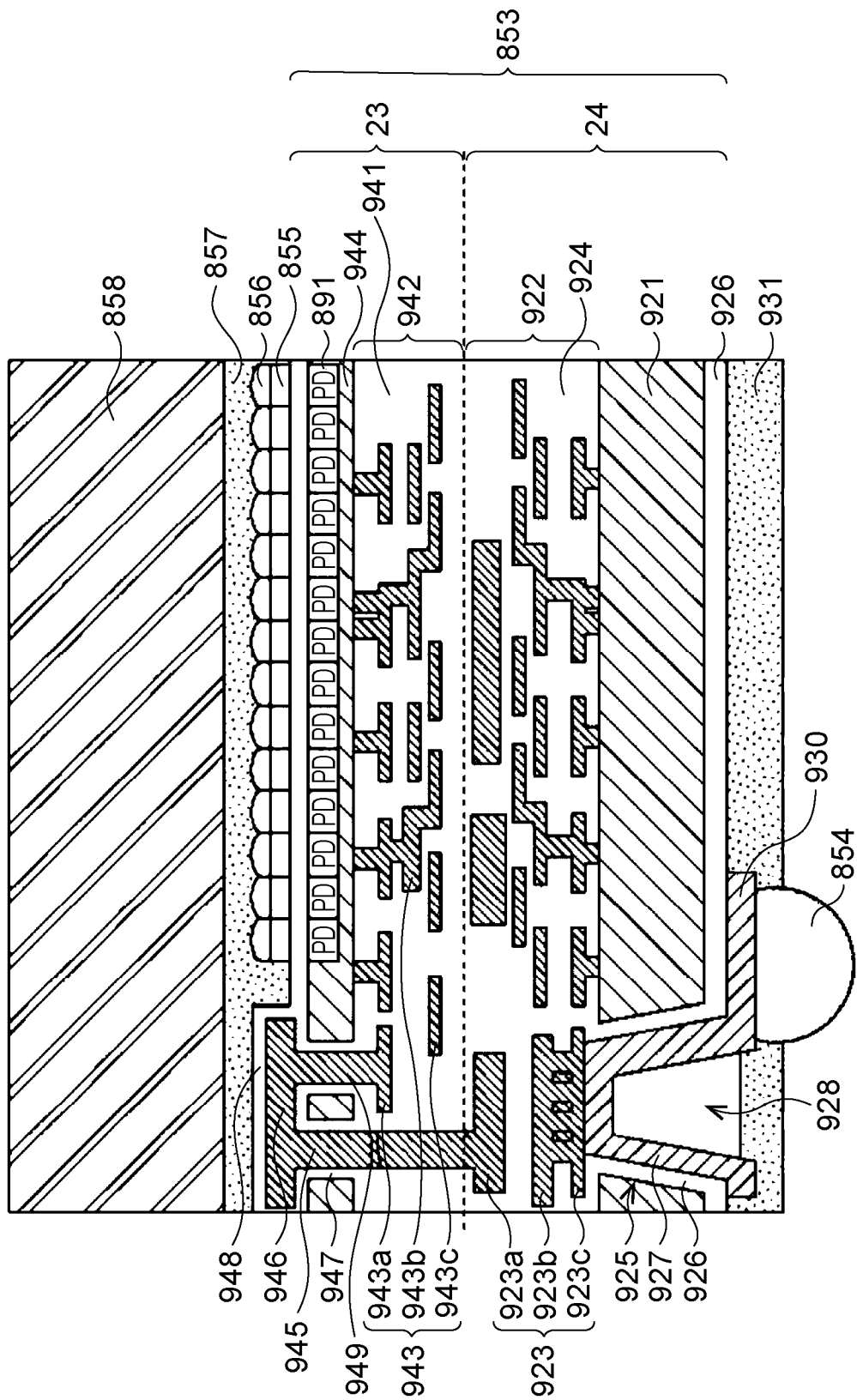
FIG. 42 is a cross-sectional view of a modification of the bonding form of the upper chip and the lower chip.

FIG. 42 is a cross-sectional view of a modification of the bonding form of the upper chip 23 and the lower chip 24. In the modification in FIG. 42, in a stacked structure 853, a wiring layer 943 of the upper chip 23 and a wiring layer 923 of the lower chip 24 are connected by two through electrodes of a silicon through electrode 949 and a chip through electrode 945, and the wiring layer 923 of the lower chip 24 and a solder ball (back electrode) 854 are connected by a through via (silicon through electrode) 928 and a redistribution 930. With this configuration, a plane area of an imaging element 801 can be made as small as possible.

Moreover, forming a space between the stacked structure 853 and a glass protective substrate 858 into a cavity-less structure and bonding the stacked structure 853 and the glass protective substrate 858 together with a glass seal resin 857 also allows a reduction in height. Therefore, with the imaging element 801 illustrated in FIG. 42, it is possible to further downsize a semiconductor device (semiconductor package).

As described above, in the solid-state imaging device 1 according to the present embodiment, since the number of bonding parts 30 for various signal wirings through which transmission and reception are made between the upper chip 23 and the lower chip 24 is reduced, it is possible to reduce the dead space generated as a result of the pitch adjustment of the signal wirings, and it is therefore possible to increase the degree of integration of the solid-state imaging device 1 and downsize the solid-state imaging device 1.

More specifically, in the present embodiment, in the solid-state imaging device 1 capable of switching between the source follower mode and the differential amplification mode, the first switching circuit 28 that switches whether or not to short-circuit the VSL line and the VRD line and the second switching circuit 29 that switches whether or not to short-circuit the VRD line and the VCOM line are provided in the upper chip 23, which eliminates the need of arranging the VRD line on the lower chip 24 side and thus allows a reduction in the number of bonding parts 30.

Furthermore, in the present embodiment, short-circuiting at least one of the VSLR line, the VCOM line, or the VCOMR line provided for each pixel column with a signal wiring extending in the column direction X allows a reduction in the number of bonding parts 30 of the upper chip 23 and the bonding parts 30 of the lower chip 24.

<<Application Example>>

The technology according to the present disclosure can be applied to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a ship, a robot, a construction machine, an agricultural machine (tractor), and the like.

Figure 43:
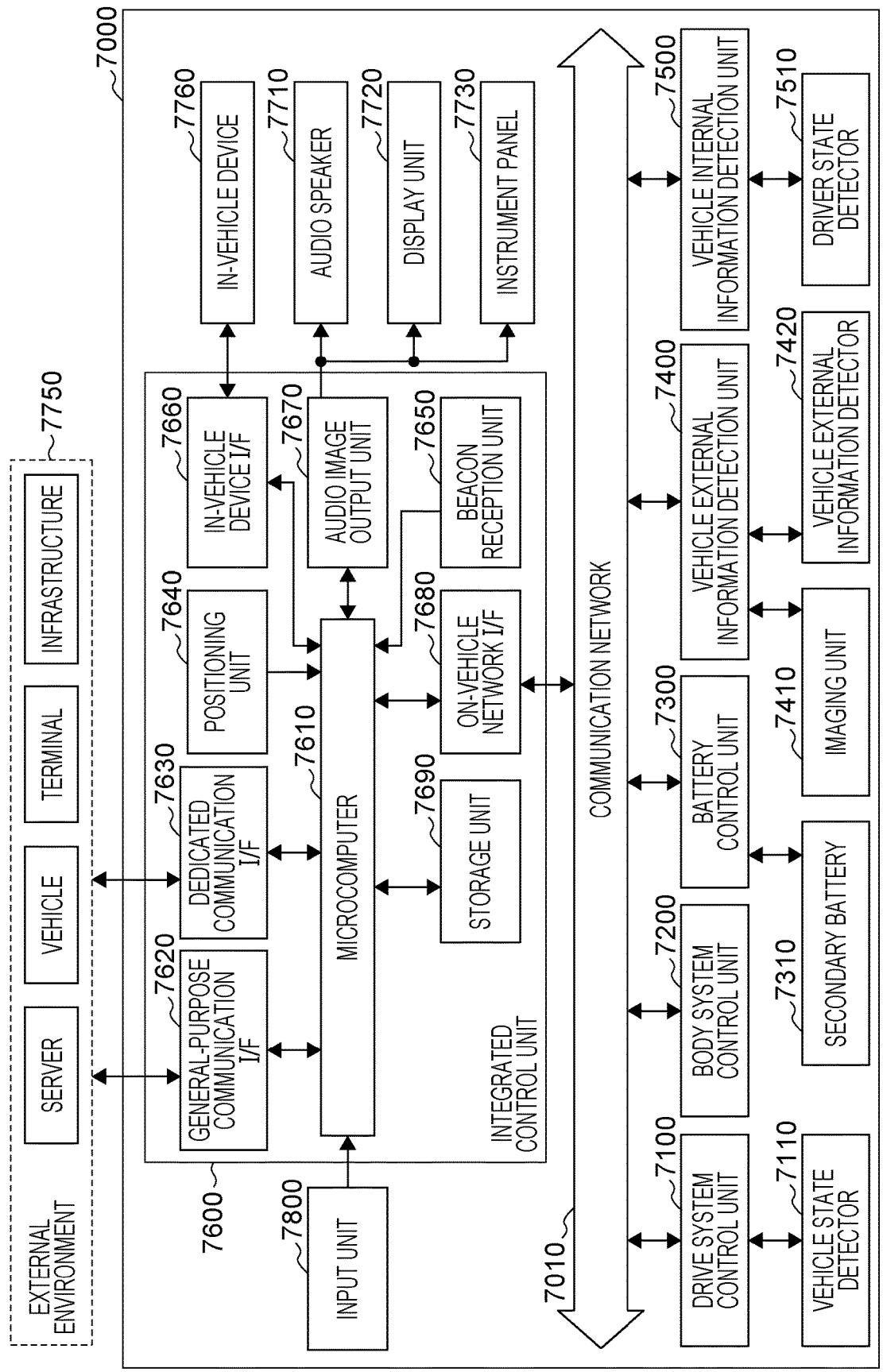
FIG. 43 is a block diagram illustrating an example of a schematic configuration of a vehicle control system.

FIG. 43 is a block diagram illustrating a schematic configuration example of a vehicle control system 7000 as an example of a mobile body control system to which the technology according to the present disclosure can be applied. The vehicle control system 7000 includes a plurality of electronic control units connected to each other via a communication network 7010. In the example illustrated in FIG. 43, the vehicle control system 7000 includes a drive system control unit 7100, a body system control unit 7200, a battery control unit 7300, a vehicle external information detection unit 7400, a vehicle internal information detection unit 7500, and an integrated control unit 7600. The communication network 7010 connecting the plurality of control units may be, for example, an in-vehicle communication network compliant with any of standards such as controller area network (CAN), local interconnect network (LIN), local area network (LAN), and FlexRay (registered trademark).

Each control unit includes a microcomputer that performs arithmetic processing according to various programs, a storage unit that stores the programs executed by the microcomputer, parameters used for various arithmetic operations and the like, and a drive circuit that drives various devices to be controlled. Each control unit includes a network I/F for performing communication with the other control units via the communication network 7010, and includes a communication I/F for performing communication with devices, sensors, or the like inside and outside a vehicle by wired or wireless communication. In FIG. 43, as a functional configuration of the integrated control unit 7600, a microcomputer 7610, a general-purpose communication I/F 7620, a dedicated communication I/F 7630, a positioning unit 7640, a beacon reception unit 7650, an in-vehicle device I/F 7660, an audio image output unit 7670, an on-vehicle network I/F 7680, and a storage unit 7690 are illustrated. Similarly, the other control units include microcomputers, communication I/Fs, storage units, and the like.

The drive system control unit 7100 controls operation of devices related to the drive system of the vehicle according to various programs. For example, the drive system control unit 7100 functions as a control device of a driving force generating device for generating driving force of the vehicle such as an internal combustion engine, a driving motor or the like, a driving force transmitting mechanism for transmitting the driving force to wheels, a steering mechanism that adjusts a steering angle of the vehicle, a braking device that generates braking force of the vehicle and the like. The drive system control unit 7100 may have a function as a control device such as an antilock brake system (ABS) or an electronic stability control (ESC).

A vehicle state detector 7110 is connected to the drive system control unit 7100. The vehicle state detector 7110 includes, for example, a gyro sensor that detects an angular velocity of axial rotational movement of a vehicle body, an acceleration sensor that detects acceleration of the vehicle, or at least one of sensors for detecting an operation amount of an accelerator pedal, an operation amount of a brake pedal, a steering angle of a steering wheel, an engine speed, a wheel rotational speed or the like. The drive system control unit 7100 performs arithmetic processing using a signal input from the vehicle state detector 7110, and controls an internal combustion engine, a driving motor, an electric power steering device, a brake device, or the like.

The body system control unit 7200 controls operations of various devices mounted on the vehicle body according to various programs. For example, the body system control unit 7200 functions as a control device of a keyless entry system, a smart key system, a power window device, or various lights such as a headlamp, a tail lamp, a brake lamp, a blinker, a fog lamp, or the like. In this case, a radio wave transmitted from a portable device that substitutes for a key or signals of various switches may be input to the body system control unit 7200. The body system control unit 7200 receives an input of these radio waves or signals, and controls a door lock device, a power window device, a lamp, and the like of the vehicle.

The battery control unit 7300 controls a secondary battery 7310 that is a power supply source of the driving motor according to the various programs. For example, information such as battery temperature, a battery output voltage, or remaining battery capacity is input to the battery control unit 7300 from a battery device provided with the secondary battery 7310. The battery control unit 7300 performs arithmetic processing using these signals, and performs temperature regulation control of the secondary battery 7310 or a cooling device provided in the battery device, or the like.

The vehicle external information detection unit 7400 detects information regarding the outside of the vehicle equipped with the vehicle control system 7000. For example, the vehicle external information detection unit 7400 is connected to at least one of an imaging unit 7410 or a vehicle external information detector 7420. The imaging unit 7410 includes at least one of a time of flight (ToF) camera, a stereo camera, a monocular camera, an infrared camera, or other cameras. The vehicle external information detector 7420 includes, for example, at least one of an environmental sensor for detecting current weather or meteorological phenomenon, or an ambient information detection sensor for detecting other vehicles, obstacles, pedestrians, or the like around the vehicle on which the vehicle control system 7000 is mounted.

The environmental sensor may be, for example, at least one of a raindrop sensor that detects rainy weather, a fog sensor that detects fog, a sunshine sensor that detects a sunlight degree, or a snow sensor that detects snowfall. The ambient information detection sensor may be at least one of an ultrasonic sensor, a radar device, or light detection and ranging, laser imaging detection and ranging (LIDAR) device. The imaging unit 7410 and the vehicle external information detector 7420 may be provided as independent sensors or devices, or may be provided as a device in which a plurality of sensors or devices is integrated.

Figure 44:
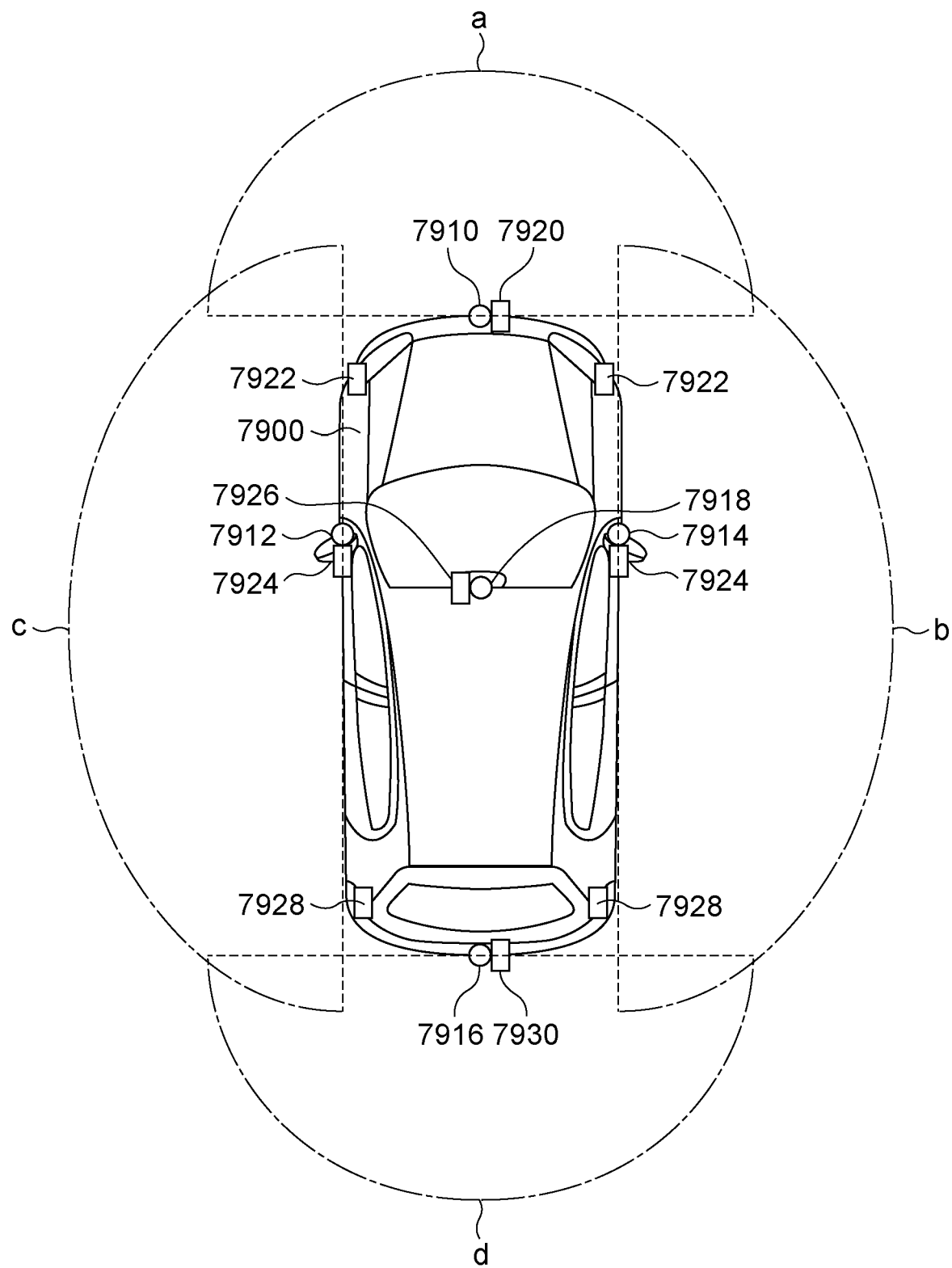
FIG. 44 is an explanatory diagram illustrating an example of installation positions of a vehicle external information detector and an imaging unit.

Here, FIG. 44 illustrates an example of installation positions of the imaging unit 7410 and the vehicle external information detector 7420. Each of imaging units 7910, 7912, 7914, 7916, and 7918 is provided at least one position of a front nose, a side mirror, a rear bumper, a rear door, and an upper portion of a windshield in a vehicle interior of a vehicle 7900, for example. The imaging unit 7910 provided on the front nose and the imaging unit 7918 provided in the upper portion of the windshield in the vehicle interior principally obtain images in front of the vehicle 7900. The imaging units 7912 and 7914 provided on the side mirrors principally obtain images of the sides of the vehicle 7900. The imaging unit 7916 provided on the rear bumper or the rear door principally obtains an image behind the vehicle 7900. The imaging unit 7918 provided on the upper portion of the windshield in the vehicle interior is principally used for detecting a preceding vehicle, a pedestrian, an obstacle, a traffic signal, a traffic sign, a lane, or the like.

Note that FIG. 44 illustrates an example of an imaging range of each of the imaging units 7910, 7912, 7914, and 7916. An imaging range a indicates the imaging range of the imaging unit 7910 provided on the front nose, imaging ranges b and c indicate the imaging ranges of the imaging units 7912 and 7914 provided on the side mirrors, and an imaging range d indicates the imaging range of the imaging unit 7916 provided on the rear bumper or the rear door. A bird's-eye image of the vehicle 7900 as viewed from above is obtained by superimposing image data captured by the imaging units 7910, 7912, 7914, and 7916, for example.

Vehicle external information detectors 7920, 7922, 7924, 7926, 7928, and 7930 provided at the front, rear, sides, corners, and the upper portion of the windshield in the vehicle interior of the vehicle 7900 may be, for example, ultrasonic sensors or radar devices. The vehicle external information detectors 7920, 7926, and 7930 provided on the front nose, the rear bumper, the rear door, and the upper portion of the windshield in the vehicle interior of the vehicle 7900 may be, for example, the LIDAR devices. These vehicle external information detectors 7920 to 7930 are principally used for detecting a preceding vehicle, a pedestrian, an obstacle, or the like.

Returning to FIG. 43, the description will be continued. The vehicle external information detection unit 7400 causes the imaging unit 7410 to capture an image outside the vehicle, and receives the captured image data. Furthermore, the vehicle external information detection unit 7400 receives detection information from the vehicle external information detector 7420 connected thereto. In a case where the vehicle external information detector 7420 is the ultrasonic sensor, the radar device, or the LIDAR device, the vehicle external information detection unit 7400 transmits ultrasonic waves, electromagnetic waves, or the like, and receives information of received reflected wave. The vehicle external information detection unit 7400 may perform detection processing of objects such as a person, a vehicle, an obstacle, a sign, or a character on a road surface or distance detection processing on the basis of the received image. The vehicle external information detection unit 7400 may perform environment recognition processing of recognizing rainfall, fog, road surface conditions or the like on the basis of the received information. The vehicle external information detection unit 7400 may calculate a distance to an object outside the vehicle on the basis of the received information.

Furthermore, the vehicle external information detection unit 7400 may perform image recognition processing or distance detection processing of recognizing a person, a vehicle, an obstacle, a sign, or a character on a road surface, or the like on the basis of the received image data. The vehicle external information detection unit 7400 may perform processing such as distortion correction or alignment on the received image data, and combine the image data captured by different imaging units 7410 to generate a bird's-eye image or a panoramic image. The vehicle external information detection unit 7400 may perform viewpoint conversion processing using the image data captured by the different imaging units 7410.

The vehicle internal information detection unit 7500 detects information regarding the vehicle interior. The vehicle internal information detection unit 7500 is connected to, for example, a driver state detector 7510 for detecting a state of a driver. The driver state detector 7510 may include a camera that images the driver, a biometric sensor that detects biometric information of the driver, a microphone that collects sound in the vehicle interior or the like. The biometric sensor is provided, for example, on a seat surface, a steering wheel, or the like, and detects biometric information of a passenger sitting on the seat or the driver holding the steering wheel. The vehicle internal information detection unit 7500 may calculate a driver's fatigue level or concentration level or may determine whether the driver is not dozing on the basis of detection information input from the driver state detector 7510. The vehicle internal information detection unit 7500 may perform processing such as noise canceling processing or the like on a collected audio signal.

The integrated control unit 7600 controls the overall operation in the vehicle control system 7000 according to various programs. An input unit 7800 is connected to the integrated control unit 7600. The input unit 7800 is implemented by a device that may be operated by the passenger to input, such as a touch panel, a button, a microphone, a switch, or a lever, for example. To the integrated control unit 7600, data obtained by performing voice recognition on the voice input by the microphone may be input. The input unit 7800 may be, for example, a remote control device using infrared rays or other radio waves, or may be an external connection device such as a mobile phone or a personal digital assistant (PDA) that supports the operation of the vehicle control system 7000. The input unit 7800 may be, for example, a camera, and in that case, the passenger may input information by gesture. Alternatively, data obtained by detecting movement of a wearable device worn by the passenger may be input. Moreover, the input unit 7800 may include, for example, an input control circuit and the like that generates an input signal on the basis of the information input by the passenger and the like using the input unit 7800 described above and outputs to the integrated control unit 7600. The passenger or the like operates the input unit 7800 to input various data to the vehicle control system 7000 or indicates processing operation.

The storage unit 7690 may include a read only memory (ROM) that stores various programs to be executed by the microcomputer, and a random access memory (RAM) that stores various parameters, operation results, sensor values, and the like. Furthermore, the storage unit 7690 may be implemented by a magnetic storage device such as a hard disc drive (HDD), a semiconductor storage device, an optical storage device, a magneto-optical storage device, or the like.

The general-purpose communication I/F 7620 is a general-purpose communication I/F that mediates communication with various devices present in an external environment 7750. The general-purpose communication I/F 7620 may implement a cellular communication protocol such as global system of mobile communications (GSM (registered trademark)), WiMAX (registered trademark), long term evolution (LTE (registered trademark)), or LTE-advanced (LTE-A), or other wireless communication protocols such as wireless LAN (also referred to as Wi-Fi (registered trademark)), Bluetooth (registered trademark), or the like. The general-purpose communication I/F 7620 may be connected to a device (for example, an application server or a control server) present on an external network (for example, the Internet, a cloud network, or an operator-specific network) via, for example, a base station or an access point. Furthermore, the general-purpose communication I/F 7620 may be connected to a terminal (for example, a terminal of a driver, a pedestrian, or a store, or a machine type communication (MTC) terminal) present in the vicinity of the vehicle using, for example, a peer to peer (P2P) technology.

The dedicated communication I/F 7630 is a communication I/F that supports a communication protocol designed for use in vehicles. The dedicated communication I/F 7630 may implement standard protocols such as wireless access in vehicle environment (WAVE) that is a combination of lower-layer IEEE802.11p and upper-layer IEEE1609, dedicated short range communications (DSRC), or cellular communication protocol, for example. The dedicated communication I/F 7630 typically performs V2X communication that is a concept including one or more of vehicle-to-vehicle communication, vehicle-to-infrastructure communication, vehicle-to-home communication, and vehicle-to-pedestrian communication.

The positioning unit 7640 receives a global navigation satellite system (GNSS) signal from a GNSS satellite (for example, a global positioning system (GPS) signal from a GPS satellite) to execute positioning, and generates positional information including the latitude, longitude, and altitude of the vehicle, for example. Note that, the positioning unit 7640 may specify a current position by exchanging signals with a wireless access point, or may obtain position information from a terminal such as a mobile phone, PHS, or smartphone having a positioning function.

The beacon reception unit 7650 receives, for example, radio waves or electromagnetic waves transmitted from a wireless station or the like installed on a road, and obtains information such as a current location, traffic congestion, traffic close, a required time, and the like. Note that the function of the beacon reception unit 7650 may be included in the dedicated communication I/F 7630 described above.

The in-vehicle device I/F 7660 is a communication interface that mediates connection between the microcomputer 7610 and various in-vehicle devices 7760 present in the vehicle. The in-vehicle device I/F 7660 may establish a wireless connection using a wireless communication protocol such as wireless LAN, Bluetooth (registered trademark), near field communication (NFC), or wireless USB (WUSB). Furthermore, the in-vehicle device I/F 7660 may establish a wired connection such as universal serial bus (USB), high-definition multimedia interface (HDMI (registered trademark)), or mobile high-definition link (MHL) via a connection terminal (and a cable if necessary) not illustrated. The in-vehicle device 7760 may include, for example, at least one of a mobile device or a wearable device that the passenger has, or an information device carried in or attached to the vehicle. Furthermore, the in-vehicle device 7760 may include a navigation device that searches for a route to an arbitrary destination. The in-vehicle device I/F 7660 exchanges control signals or data signals with such in-vehicle devices 7760.

The on-vehicle network I/F 7680 is an interface that mediates communication between the microcomputer 7610 and the communication network 7010. The on-vehicle network I/F 7680 transmits and receives signals and the like according to a predetermined protocol supported by the communication network 7010.

The microcomputer 7610 of the integrated control unit 7600 controls the vehicle control system 7000 according to the various programs on the basis of the information obtained by means of at least one of the general-purpose communication I/F 7620, the dedicated communication I/F 7630, the positioning unit 7640, the beacon reception unit 7650, the in-vehicle device I/F 7660, or the on-vehicle network I/F 7680. For example, the microcomputer 7610 may calculate a control target value of the driving force generating device, the steering mechanism, or the braking device on the basis of the obtained information inside and outside the vehicle and output a control command to the drive system control unit 7100. For example, the microcomputer 7610 may perform cooperative control for realizing functions of advanced driver assistance system (ADAS) including collision avoidance or impact attenuation of the vehicle, following travel based on the distance between the vehicles, vehicle speed maintaining travel, vehicle collision warning, vehicle lane departure warning, or the like. Furthermore, the microcomputer 7610 may perform cooperative control for realizing automated driving and the like to autonomously travel independent from the operation of the driver by controlling the driving force generating device, the steering mechanism, the braking device, or the like on the basis of the obtained information around the vehicle.

The microcomputer 7610 may generate three-dimensional distance information between the vehicle and an object such as a peripheral structure or a person on the basis of the information obtained by means of at least one of the general-purpose communication I/F 7620, the dedicated communication I/F 7630, the positioning unit 7640, the beacon reception unit 7650, the in-vehicle device I/F 7660, or the on-vehicle network I/F 7680 and create local map information including peripheral information of the vehicle current position. Furthermore, the microcomputer 7610 may generate a warning signal by predicting a danger such as vehicle collision, approach of a pedestrian and the like or entry to a closed road on the basis of the obtained information. The warning signal may be, for example, a signal for generating a warning sound or lighting a warning lamp.

The audio image output unit 7670 transmits at least one of audio or image output signal to an output device capable of visually or audibly notifying the passenger of the vehicle or the outside the vehicle of the information. In the example in FIG. 43, as the output device, an audio speaker 7710, a display unit 7720, and an instrument panel 7730 are illustrated. The display unit 7720 may include, for example, at least one of an on-board display or a head-up display. The display unit 7720 may have an augmented reality (AR) display function. In addition to these devices, the output device may be other devices such as a headphone, a wearable device such as an eyeglass-type display worn by the passenger, a projector, or light. In a case where the output device is a display device, the display device visually displays results obtained by various types of processing performed by the microcomputer 7610 or information received from other control units in various formats such as text, image, table, and graph. Furthermore, in a case where the output device is an audio output device, the audio output device converts an audio signal including reproduced audio data, acoustic data or the like into an analog signal and outputs the same aurally.

Note that at least two control units connected to each other via the communication network 7010 in the example illustrated in FIG. 43 may be integrated into one control unit. Alternatively, each individual control unit may include a plurality of control units. Moreover, the vehicle control system 7000 may be provided with another control unit not illustrated. Furthermore, in the above description, a part of or all of the functions of any of the control units may be assigned to other control units. That is, as long as information is transmitted and received via the communication network 7010, predetermined arithmetic processing may be performed by any control unit. Similarly, a sensor or a device connected to any control unit may be connected to another control unit, and a plurality of control units may transmit/receive detection information to/from each other via the communication network 7010.

Note that the present technology can have the following configurations.

(1)

A solid-state imaging device including a first substrate including a pixel array unit in which a plurality of pixels is arranged, each of the plurality of pixels including a photoelectric conversion unit, in which the first substrate includes:

a first wiring through which an imaging pixel signal is transmitted, the imaging pixel signal being read from two or more of the pixels arranged in a first direction in the pixel array unit;

a second wiring through which a reset voltage for initializing the first wiring is supplied; and a first switching circuit configured to switch whether or not to short-circuit the first wiring and the second wiring.

(2)

The solid-state imaging device according to (1), in which the plurality of pixels in the pixel array unit is arranged in the first direction and a second direction, and the first substrate includes:
- a plurality of the first wirings each extending in the first direction and arranged at intervals in the second direction;
- a plurality of the second wirings corresponding to the plurality of first wirings; and
- a plurality of the first switching circuits configured to switch whether or not to short-circuit the plurality of first wirings and the plurality of second wirings corresponding to the plurality of first wirings.

(3)

The solid-state imaging device according to (2), in which the first substrate includes:
- a plurality of third wirings provided corresponding to the plurality of first wirings and the plurality of second wirings, the plurality of third wirings being set at a reference voltage; and
- a plurality of second switching circuits configured to switch whether or not to short-circuit the plurality of second wirings and the plurality of third wirings corresponding to the plurality of second wirings.

(4)

The solid-state imaging device according to (3), in which one of the first wirings is provided for each pixel column including the two or more pixels arranged in the first direction, and
- the one of the first switching circuits and one of the second switching circuits are provided for the one first wiring.

(5)

The solid-state imaging device according to (3), in which
- a plurality of the first wirings is provided for each pixel column including the two or more pixels arranged in the first direction, and
- a plurality of the first switching circuits and a plurality of the second switching circuits are provided for the plurality of first wirings.

(6)

The solid-state imaging device according to (5), in which the plurality of first switching circuits and the plurality of second switching circuits are arranged outside an arrangement region of the plurality of pixels on the first substrate.

(7)

The solid-state imaging device according to any one of (3) to (6), in which
- the plurality of first switching circuits includes a plurality of first transistors configured to switch whether or not short-circuit the plurality of first wirings and the plurality of second wirings corresponding to the plurality of first wirings, and
- the plurality of second switching circuits includes a plurality of second transistors configured to switch whether or not to short-circuit the plurality of second wirings and the plurality of third wirings corresponding to the plurality of second wirings.

(8)

The solid-state imaging device according to any one of (3) to (6), in which
each of the plurality of first switching circuits includes:
- a first photoelectric conversion unit;
- a first floating diffusion;
- a third transistor configured to select a corresponding one of the pixels;
- a fourth transistor configured to amplify a voltage level of the first floating diffusion; and
- a fifth transistor configured to switch whether or not to short-circuit a corresponding one of the first wirings and a corresponding one of the second wirings, and
each of the plurality of second switching circuits includes:
- a second photoelectric conversion unit;
- a second floating diffusion;
- a sixth transistor configured to select a corresponding one of the pixels;
- a seventh transistor configured to amplify a voltage level of the second floating diffusion; and
- an eighth transistor configured to switch whether or not to short-circuit a corresponding one of the second wirings and a corresponding one of the third wirings.

(9)

The solid-state imaging device according to any one of (2) to (8), further including a drive unit configured to generate a drive signal to drive each corresponding pixel row, the pixel row including two or more of the pixels arranged in the second direction, in which
- the drive unit outputs a first switching control signal for switching control of the plurality of first switching circuits and a second switching control signal for switching control of the plurality of second switching circuits.

(10)

The solid-state imaging device according to any one of (2) to (9), in which
- the pixel array unit includes a reference pixel configured to output a reference pixel signal,
- the plurality of pixels includes a plurality of source follower circuits each configured to generate the imaging pixel signal according to a pixel signal obtained by photoelectric conversion by a corresponding one of the photoelectric conversion units, and
- a first imaging mode of supplying the imaging pixel signal generated by the corresponding plurality of source follower circuits to the plurality of first wirings and a second imaging mode of supplying the imaging pixel signal generated by comparison between the pixel signal and the reference pixel signal by a differential amplifier to the plurality of first wirings are alternatively selected.

(11)

The solid-state imaging device according to (10), in which
- the plurality of first switching circuits, the plurality of second switching circuits, and the plurality of third switching circuits perform different switching operations between the first imaging mode and the second imaging mode.

(12)

The solid-state imaging device according to (11), in which
in a case where the first imaging mode is selected,
- the plurality of first switching circuits interrupts connection between the plurality of first wirings and the plurality of second wirings corresponding to the plurality of first wirings, and
- the plurality of second switching circuits short-circuits the plurality of first wirings and the plurality of third wirings corresponding to the plurality of first wirings, and
in a case where the second imaging mode is selected, the plurality of first switching circuits short-circuits the plurality of first wirings and the plurality of second wirings corresponding to the plurality of first wirings, and the plurality of second switching circuits interrupts connection between the plurality of first wirings and the plurality of third wirings corresponding to the plurality of first wirings.

(13)

A solid-state imaging device including:

a first substrate including a pixel array unit in which a plurality of pixels is arranged, each of the plurality of pixels including a photoelectric conversion unit; and a second substrate stacked on the first substrate, the second substrate being configured to perform signal processing on an imaging pixel signal output from the pixel array unit, in which the first substrate includes:

a plurality of first wirings that does not interfere with a circuit operation even when each of the plurality of first wirings is short-circuited; and a first bonding part provided so as to be smaller in number than the plurality of first wirings, the first bonding part being electrically connected to the plurality of first wirings, and the second substrate includes:

a plurality of second wirings that does not interfere with a circuit operation even when each of the plurality of second wirings is short-circuited; and a second bonding part provided as many as the first bonding part and bonded to a corresponding first bonding part, the second bonding part being electrically connected to the plurality of second wirings.

(14)

The solid-state imaging device according to (13), in which the plurality of pixels is arranged in a first direction and a second direction on the first substrate, the solid-state imaging device further including:

a drive unit configured to generate a drive signal to drive each corresponding pixel row, the pixel row including two or more of the pixels arranged in the second direction, the drive unit including an output wiring electrically connected to the first bonding part and the second bonding part.

(15)

The solid-state imaging device according to (14), in which the drive unit is disposed in the second substrate, and the first substrate includes:

a first connection region disposed in the first direction and including the first bonding part and a third bonding part, the third bonding part being connected to the drive unit; and a second connection region disposed in the second direction and including a fourth bonding part to which a signal transmitted and received between the first substrate and the second substrate is connected.

(16)

The solid-state imaging device according to (15), in which the drive unit includes a first drive unit and a second drive unit arranged at both sides in the second direction, and the first drive unit and the second drive unit each include an output wiring electrically connected to the first bonding part and the third bonding part.

(17)

The solid-state imaging device according to (15), in which the second connection region includes two connection regions arranged at both end sides on the first substrate in the second direction, and the two connection regions include the first bonding part and the third bonding part.

(18)

The solid-state imaging device according to any one of (13) to (17), in which the pixel array unit includes a reference pixel configured to output a reference pixel signal, the plurality of pixels includes a plurality of source follower circuits each configured to generate the imaging pixel signal according to a pixel signal obtained by photoelectric conversion by a corresponding one of the photoelectric conversion units, a first imaging mode of supplying the imaging pixel signal generated by the corresponding plurality of source follower circuits to the plurality of first wirings and a second imaging mode of supplying the imaging pixel signal based on a result of comparison between the pixel signal and the reference pixel signal by a differential amplifier to the plurality of first wirings are alternatively selected, and the plurality of first wirings is a plurality of wirings set at a reference voltage, a plurality of wirings connected to the differential amplifier when the second imaging mode is selected and disconnected from the differential amplifier when the first imaging mode is selected, or a plurality of wirings that makes the first substrate and the second substrate equal in reference voltage level to each other at a predetermined timing when the second imaging mode is selected.

(19)

An electrical instrument including:

a solid-state imaging device configured to output an imaging pixel signal obtained by photoelectric conversion by a plurality of pixels; and a signal processing device configured to perform signal processing on the basis of the imaging pixel signal, in which the solid-state imaging device includes a first substrate including a pixel array unit in which a plurality of pixels is arranged, each of the plurality of pixels including a photoelectric conversion unit, and the first substrate includes:

a first wiring through which the imaging pixel signal read from two or more of the pixels arranged in a first direction in the pixel array unit is transmitted;

a second wiring through which a reset voltage for initializing the first wiring is supplied; and a first switching circuit configured to switch whether or not to short-circuit the first wiring and the second wiring.

(20)

An electronic instrument including:

a solid-state imaging device configured to output an imaging pixel signal obtained by photoelectric conversion by a plurality of pixels; and a signal processing device configured to perform signal processing on the basis of the imaging pixel signal, in which the solid-state imaging device includes:

a first substrate including a pixel array unit in which a plurality of pixels is arranged, each of the plurality of pixels including a photoelectric conversion unit; and a second substrate stacked on the first substrate, the second substrate being configured to perform signal processing on the imaging pixel signal output from the pixel array unit, the first substrate includes:
a plurality of first wirings that does not interfere with a circuit operation even when each of the plurality of first wirings is short-circuited; and
a first bonding part provided so as to be smaller in number than the plurality of first wirings, the first bonding part being electrically connected to the plurality of first wirings, and the second substrate includes:
a plurality of second wirings that does not interfere with a circuit operation even when each of the plurality of second wirings is short-circuited; and
a second bonding part provided as many as the first bonding part and bonded to a corresponding first bonding part, the second bonding part being electrically connected to the plurality of second wirings.

Aspects of the present disclosure are not limited to the above-described individual embodiments, and include various modifications that may be conceived by those skilled in the art, and the effects of the present disclosure are not limited to the above-described content. That is, various additions, modifications, and partial deletions are possible without departing from the conceptual idea and spirit of the present disclosure derived from the matters defined in the claims and equivalents thereof.

REFERENCE SIGNS LIST

1 Solid-state imaging device
2 Pixel
11 Pixel array unit
12 Vertical drive unit
13 Column read circuit unit
14 Column signal processing unit
15 Horizontal drive unit
16 System control unit
17 Signal processing unit
18 Data storage unit
21 Analog front end circuit
22 AD converter
23 Upper chip
24 Lower chip
Connection region
26 Read pixel region
27 Reference pixel region
28 First switching circuit
29 Second switching circuit
Bonding part
31 Pixel drive line
32 Vertical pixel wiring
33 Column direction connection region
34 Row direction connection region
Differential transistor pair
36 Current source
37 Current source.

The invention claimed is:
1. A solid-state imaging device, comprising:
a first substrate that includes a pixel array unit, wherein
the pixel array unit includes a plurality of pixels,
the plurality of pixels includes a plurality of photoelectric conversion units,
each of the plurality of pixels corresponds to a respective photoelectric conversion unit of the plurality of photoelectric conversion units, and
the first substrate includes:
a plurality of first wirings, wherein
each of the plurality of first wirings is configured to transmit a first imaging pixel signal,
the first imaging pixel signal is read from a first set of at least two pixels,
the first set of at least two pixels is in a first direction in the pixel array unit, and
the plurality of pixels includes the first set of at least two pixels;
a plurality of second wirings that corresponds to the plurality of first wirings, wherein each of the plurality of second wirings is configured to transmit a reset voltage to initialize each of the plurality of the first wirings;
a first switching circuit configured to switch whether or not to short-circuit a first wiring of the plurality of first wirings and a second wiring of the plurality of second wirings;
a plurality of third wirings that corresponds to the plurality of first wirings and the plurality of second wirings, wherein the plurality of third wirings is set at a reference voltage; and
a plurality of second switching circuits configured to switch whether or not to short-circuit the plurality of second wirings and the plurality of third wirings that corresponds to the plurality of second wirings.

2. The solid-state imaging device according to claim 1, wherein
the plurality of pixels in the pixel array unit is in the first direction and in a second direction,
each of the plurality of the first wirings extends in the first direction,
each of the plurality of the first wirings is at intervals in the second direction,
the first substrate further includes a plurality of first switching circuits,
the plurality of first switching circuits includes the first switching circuit, and
the plurality of first switching circuits is configured to switch whether or not to short-circuit the plurality of first wirings and the plurality of second wirings that corresponds to the plurality of first wirings.

3. The solid-state imaging device according to claim 2, wherein
one of the plurality of first wirings is connected to each pixel column of the pixel array unit,
the each pixel column includes the first set of at least two pixels in the first direction, and
one of the plurality of first switching circuits and one of the plurality of second switching circuits are connected to one of the plurality of first wirings.

4. The solid-state imaging device according to claim 2, wherein
the plurality of first wirings is connected to each pixel column of the pixel array unit,
the each pixel column includes the first set of at least two pixels,
the first set of at least two pixels is in the first direction, and
the plurality of first switching circuits and the plurality of second switching circuits are connected to the plurality of first wirings.

5. The solid-state imaging device according to claim 4, wherein
each of the plurality of first switching circuits and the plurality of second switching circuits is outside an arrangement region of the plurality of pixels, and
the plurality of pixels is on the first substrate.

6. The solid-state imaging device according to claim 2, wherein
the plurality of first switching circuits includes a plurality of first transistors,
each of the plurality of first transistors is configured to switch whether or not to short-circuit the plurality of first wirings and the plurality of second wirings that corresponds to the plurality of first wirings,
the plurality of second switching circuits includes a plurality of second transistors, and
each of the plurality of second transistors is configured to switch whether or not to short-circuit the plurality of second wirings and the plurality of third wirings that corresponds to the plurality of second wirings.

7. The solid-state imaging device according to claim 2, wherein
each of the plurality of first switching circuits includes:
a first photoelectric conversion unit of the plurality of photoelectric conversion units;
a first floating diffusion;
a third transistor configured to select one of the plurality of pixels;
a fourth transistor configured to amplify a voltage level of the first floating diffusion; and
a fifth transistor configured to switch whether or not to short-circuit one of the plurality of first wirings and one of the plurality of second wirings, and
each of the plurality of second switching circuits includes:
a second photoelectric conversion unit of the plurality of photoelectric conversion units;
a second floating diffusion;
a sixth transistor configured to select one of the plurality of pixels;
a seventh transistor configured to amplify a voltage level of the second floating diffusion; and
an eighth transistor configured to switch whether or not to short-circuit one of the plurality of second wirings and one of the plurality of the third wirings.

8. The solid-state imaging device according to claim 2, further comprising circuitry configured to:
generate a drive signal to drive a pixel row of the pixel array unit, wherein
the pixel row includes a second set of at least two pixels of the plurality of pixels,
the second set of at least two pixels is in the second direction, and
the second set of at least two pixels is different from the first set of at least two pixels;
output a first switching control signal to switch control of the plurality of first switching circuits; and
output a second switching control signal to switch control of the plurality of second switching circuits.

9. The solid-state imaging device according to claim 2, further comprising a differential amplifier, wherein
the pixel array unit includes a reference pixel,
the reference pixel is configured to output a reference pixel signal,
each of the plurality of photoelectric conversion units is configured to generate a pixel signal based on a photoelectric conversion,
the plurality of pixels includes a plurality of source follower circuits,
each of the plurality of pixels is configured to generate the first imaging pixel signal based on the pixel signal,
the plurality of source follower circuits is configured to generate a second imaging pixel signal different from the first imaging pixel signal,
at least one of the plurality of pixels is configured to transmit, in a first imaging mode of the solid-state imaging device, the second imaging pixel signal to the plurality of first wirings,
the differential amplifier is configured to compare the pixel signal and the reference pixel signal to generate a third imaging pixel signal different from the second imaging pixel signal,
at least one of the plurality of pixels is further configured to transmit, in a second imaging mode of the solid-state imaging device, the third imaging pixel signal to the plurality of first wirings, and
the first imaging mode and the second imaging mode are alternatively selected.

10. The solid-state imaging device according to claim 9, wherein
each of the plurality of first switching circuits, the plurality of second switching circuits, and a plurality of third switching circuits is configured to perform a first switching operation and a second switching operation,
the first switching operation is performed in the first imaging mode,
the second switching operation is performed in the second imaging mode, and
the second switching operation is different from the first switching operation.

11. The solid-state imaging device according to claim 10, wherein
the plurality of first switching circuits is further configured to interrupt, in the first imaging mode, a connection between the plurality of first wirings and the plurality of second wirings that corresponds to the plurality of first wirings,
the plurality of second switching circuits is configured to short-circuit, in the first imaging mode, the plurality of first wirings and the plurality of third wirings that corresponds to the plurality of first wirings,
the plurality of first switching circuits is further configured to short-circuit, in the second imaging mode, the plurality of first wirings and the plurality of second wirings that corresponds to the plurality of first wirings, and
the plurality of second switching circuits is further configured to interrupt, in the second imaging mode, a connection between the plurality of first wirings and the plurality of third wirings that corresponds to the plurality of first wirings.

12. A solid-state imaging device, comprising:
a first substrate that includes a pixel array unit, wherein
the pixel array unit includes a plurality of pixels,
the plurality of pixels includes a plurality of photoelectric conversion units,
each of the plurality of pixels corresponds to a respective photoelectric conversion unit of the plurality of photoelectric conversion units, and
the pixel array unit is configured to output a first imaging pixel signal; and
a second substrate stacked on the first substrate, wherein
the second substrate is configured to perform a signal processing process on the first imaging pixel signal, the first substrate further includes:
a plurality of first wirings that does not interfere with a circuit operation at a time of short-circuit of each of the plurality of first wirings; and
a first bonding part that is less in number than the plurality of first wirings, wherein the first bonding part is electrically connected to the plurality of first wirings, and
the second substrate includes:
a plurality of second wirings that does not interfere with the circuit operation at a time of short-circuit of each of the plurality of second wirings; and
a second bonding part that is equal in number to the first bonding part, wherein
the second bonding part is bonded to the first bonding part, and
the second bonding part is electrically connected to the plurality of second wirings.

13. The solid-state imaging device according to claim 12, wherein
the plurality of pixels is in a first direction and in a second direction,
the plurality of pixels is on the first substrate,
the solid-state imaging device further comprises circuitry configured to generate a drive signal to drive a pixel row of the pixel array unit,
the pixel row includes a set of at least two pixels of the plurality of pixels,
the set of at least two pixels is in the second direction, and
the circuitry includes a first output wiring that is electrically connected to the first bonding part and the second bonding part.

14. The solid-state imaging device according to claim 13, wherein
the circuitry is in the second substrate, and
the first substrate further includes:
a first connection region in the first direction, wherein
the first connection region includes the first bonding part and a third bonding part, and
the third bonding part is connected to the circuitry; and
a second connection region in the second direction, wherein
the second connection region includes a fourth bonding part,
the fourth bonding part is between the first substrate and the second substrate, and
the fourth bonding part is configured to:
transmit a signal; and
receive the signal.

15. The solid-state imaging device according to claim 14, wherein
the circuitry includes first circuitry and second circuitry,
each of the first circuitry and the second circuitry is in the second direction,
the first circuitry includes a second output wiring,
the second circuitry includes a third output wiring,
the first bonding part is electrically connected to the first circuitry through the second output wiring, and
the third bonding part is electrically connected to the second circuitry through the third output wiring.

16. The solid-state imaging device according to claim 14, wherein
the second connection region includes two connection regions,
the two connection regions are on the first substrate in the second direction, and
the two connection regions include the first bonding part and the third bonding part.

17. The solid-state imaging device according to claim 12, further comprising a differential amplifier, wherein
the pixel array unit includes a reference pixel,
the reference pixel is configured to output a reference pixel signal,
each of the plurality of photoelectric conversion units is configured to generate a pixel signal based on a photoelectric conversion,
the plurality of pixels includes a plurality of source follower circuits,
each of the plurality of pixels is configured to generate the first imaging pixel signal based on the pixel signal,
the plurality of source follower circuits is configured to generate a second imaging pixel signal different from the first imaging pixel signal,
at least one of the plurality of pixels is configured to transmit, in a first imaging mode of the solid-state imaging device, the second imaging pixel signal to the plurality of first wirings,
the differential amplifier is configured to compare the pixel signal and the reference pixel signal to generate a third imaging pixel signal different from the second imaging pixel signal,
at least one of the plurality of pixels is further configured to transmit, in a second imaging mode of the solid-state imaging device, the third imaging pixel signal to the plurality of first wirings,
the first imaging mode and the second imaging mode are alternatively selected,
the plurality of first wirings is one of
a plurality of wirings set at a first reference voltage, or
a plurality of wirings configured to equalize a reference voltage level in the first substrate and a reference voltage in the second substrate,
the equalization of the reference voltage is in the second imaging mode at a specific timing,
the plurality of first wirings is connected to the differential amplifier in the second imaging mode, and
the plurality of first wirings is disconnected from the differential amplifier in the first imaging mode.

18. An electrical instrument, comprising:
a solid-state imaging device configured to output an imaging pixel signal; and
a signal processing device configured to perform a signal processing process based on the imaging pixel signal, wherein
the solid-state imaging device includes a first substrate,
the first substrate includes a pixel array unit,
the pixel array unit includes a plurality of pixels,
each of the plurality of pixels includes a photoelectric conversion unit, and
the first substrate includes:
a plurality of first wirings, wherein
each of the plurality of first wirings is configured to transmit the imaging pixel signal,
the imaging pixel signal is read from a set of at least two pixels of the plurality of pixels,
the set of at least two pixels is in a first direction in the pixel array unit, and
the plurality of pixel includes the set of at least two pixels;
a plurality of second wirings, wherein each of the plurality of second wirings is configured to transmit a reset voltage to initialize each of the plurality of the first wirings;

a first switching circuit configured to switch whether or not to short-circuit a first wiring of the plurality of first wirings and a second wiring of the plurality of second wirings;

a plurality of third wirings that corresponds to the plurality of first wirings and the plurality of second wirings, wherein the plurality of third wirings is set at a reference voltage; and a plurality of second switching circuits configured to switch whether or not to short-circuit the plurality of second wirings and the plurality of third wirings that corresponds to the plurality of second wirings.

19. An electronic instrument, comprising:

a solid-state imaging device configured to output an imaging pixel signal; and a signal processing device configured to perform a first signal processing process based on the imaging pixel signal, wherein the solid-state imaging device includes:
- a first substrate that includes a pixel array unit, wherein
  - the pixel array unit includes a plurality of pixels,
  - each of the plurality of pixels includes a photoelectric conversion unit, and
  - the pixel array unit is configured to output the imaging pixel signal; and
- a second substrate stacked on the first substrate, wherein
  - the second substrate is configured to perform a second signal processing process on the imaging pixel signal,
- the first substrate further includes:
  - a plurality of first wirings that does not interfere with a circuit operation at a time of short-circuit of each of the plurality of first wirings; and
  - a first bonding part that is less in number than the plurality of first wirings, wherein the first bonding part is electrically connected to the plurality of first wirings, and
- the second substrate includes:
  - a plurality of second wirings that does not interfere with the circuit operation at a time of short-circuit of each of the plurality of second wirings; and
  - a second bonding part that is equal in number to the first bonding part, wherein
  - the second bonding part is bonded to the first bonding part, and
  - the second bonding part is electrically connected to the plurality of second wirings.

* * * * *